(12) United States Patent
Yoshimizu

(10) Patent No.: US 12,057,399 B2
(45) Date of Patent: Aug. 6, 2024

(54) SEMICONDUCTOR STORAGE DEVICE

(71) Applicant: KIOXIA CORPORATION, Tokyo (JP)

(72) Inventor: Yasuhito Yoshimizu, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 475 days.

(21) Appl. No.: 17/172,470

(22) Filed: Feb. 10, 2021

(65) Prior Publication Data

US 2021/0296239 A1    Sep. 23, 2021

(30) Foreign Application Priority Data

Mar. 17, 2020  (JP) ................................ 2020-047000

(51) Int. Cl.
| | |
|---|---|
| *H01L 27/115* | (2017.01) |
| *H01L 21/768* | (2006.01) |
| *H01L 23/00* | (2006.01) |
| *H01L 23/522* | (2006.01) |
| *H01L 23/528* | (2006.01) |
| *H01L 23/535* | (2006.01) |
| *H01L 25/065* | (2023.01) |
| *H01L 25/18* | (2023.01) |
| *H10B 43/27* | (2023.01) |

(52) U.S. Cl.
CPC ...... *H01L 23/535* (2013.01); *H01L 21/76805* (2013.01); *H01L 21/76895* (2013.01); *H01L 23/5226* (2013.01); *H01L 24/08* (2013.01); *H01L 25/0657* (2013.01); *H01L 25/18* (2013.01); *H10B 43/27* (2023.02); *H01L 2224/08145* (2013.01); *H01L 2924/1431* (2013.01); *H01L 2924/14511* (2013.01)

(58) Field of Classification Search
CPC ........ H10B 43/27; H10B 41/27; H10B 41/50; H10B 43/10; H10B 43/50; H10B 41/10; H10B 43/30; H01L 23/535; H01L 23/5226

See application file for complete search history.

(56) References Cited

U.S. PATENT DOCUMENTS

| | | | |
|---|---|---|---|
| 8,704,205 B2 * | 4/2014 | Chen ...................... | H10B 41/27 257/4 |
| 9,236,392 B1 * | 1/2016 | Izumi ..................... | H10B 43/40 |
| 9,960,181 B1 * | 5/2018 | Cui ........................ | H10B 41/50 |
| 10,249,640 B2 * | 4/2019 | Yu ........................ | H01L 23/5283 |
| 10,347,650 B1 | 7/2019 | Sakuma et al. | |
| 10,896,918 B1 * | 1/2021 | Oh ..................... | H01L 21/76877 |

(Continued)

*Primary Examiner* — Mary A Wilczewski
*Assistant Examiner* — Tsz K Chiu
(74) *Attorney, Agent, or Firm* — Kim & Stewart LLP

(57) ABSTRACT

A semiconductor storage device includes a semiconductor substrate and a conductive layer separated from the semiconductor substrate in a first direction. The conductive layer extends in a second direction parallel to the semiconductor substrate. A semiconductor layer extends in the first direction through the conductive layer. A first contact extends in the first direction and is connected to a surface of the conductive layer facing away from the semiconductor substrate. A first insulating layer extends in the first direction, and a second insulating layer extends along the first insulating layer in the first direction. Each of the first and second insulating layers entirely overlaps with the first contact when viewed in the first direction.

14 Claims, 52 Drawing Sheets

(56) References Cited

U.S. PATENT DOCUMENTS

| | | | |
|---|---|---|---|
| 10,985,176 B2* | 4/2021 | Iwai | H10B 41/41 |
| 11,043,455 B2* | 6/2021 | Kai | H01L 21/76877 |
| 11,282,827 B2* | 3/2022 | Yun | H01L 25/18 |
| 11,495,612 B2* | 11/2022 | Tanaka | H10B 41/10 |
| 11,621,277 B2* | 4/2023 | Titus | H10B 43/27 257/324 |
| 11,791,327 B2* | 10/2023 | Kim | H01L 25/50 257/314 |
| 2010/0019310 A1 | 1/2010 | Sakamoto | |
| 2010/0155810 A1* | 6/2010 | Kim | H10B 41/27 257/316 |
| 2010/0207195 A1 | 8/2010 | Fukuzumi et al. | |
| 2015/0060976 A1 | 3/2015 | Iguchi | |
| 2015/0179567 A1* | 6/2015 | Govindaraju | H01L 23/53223 257/758 |
| 2016/0027730 A1* | 1/2016 | Lee | H01L 21/76816 257/774 |
| 2016/0079185 A1* | 3/2016 | Kato | H10B 43/27 257/314 |
| 2016/0093524 A1* | 3/2016 | Izumi | H10B 43/27 438/637 |
| 2016/0126135 A1* | 5/2016 | Zhang | H01L 23/53266 438/655 |
| 2016/0307912 A1* | 10/2016 | Izumi | H01L 21/76897 |
| 2016/0322374 A1* | 11/2016 | Sano | H01L 21/31051 |
| 2016/0336338 A1* | 11/2016 | Song | H10B 43/27 |
| 2016/0343612 A1* | 11/2016 | Wang | H01L 21/76856 |
| 2019/0074249 A1 | 3/2019 | Sasaki | |
| 2019/0081062 A1* | 3/2019 | Wada | H10B 43/40 |
| 2019/0088672 A1 | 3/2019 | Tomimatsu | |
| 2019/0229125 A1* | 7/2019 | Zhou | H10B 41/27 |
| 2019/0267333 A1* | 8/2019 | Hong | H10B 43/27 |
| 2020/0051989 A1 | 2/2020 | Shimizu et al. | |
| 2020/0126622 A1* | 4/2020 | Utsumi | H10B 43/40 |
| 2020/0168546 A1 | 5/2020 | Mizukami et al. | |
| 2021/0057443 A1* | 2/2021 | Yamamoto | H10B 43/40 |
| 2021/0288064 A1* | 9/2021 | Nishimura | H10B 41/27 |
| 2022/0068803 A1* | 3/2022 | Ichinose | H10B 43/10 |

* cited by examiner

SEMICONDUCTOR STORAGE DEVICE

CROSS-REFERENCE TO RELATED APPLICATION

This application is based upon and claims the benefit of priority from Japanese Patent Application No. 2020-047000, filed on Mar. 17, 2020, the entire contents of which are incorporated herein by reference.

FIELD

Embodiments described herein relate generally to a semiconductor storage device.

BACKGROUND

A semiconductor storage device formed of stacked conductive layers on a semiconductor substrate and a semiconductor memory pillar that extends through the stacked conductive layers to form a plurality of memory cells at the intersections of the conductive layers and the semiconductor memory pillar is known.

DETAILED DESCRIPTION

Figure 1:
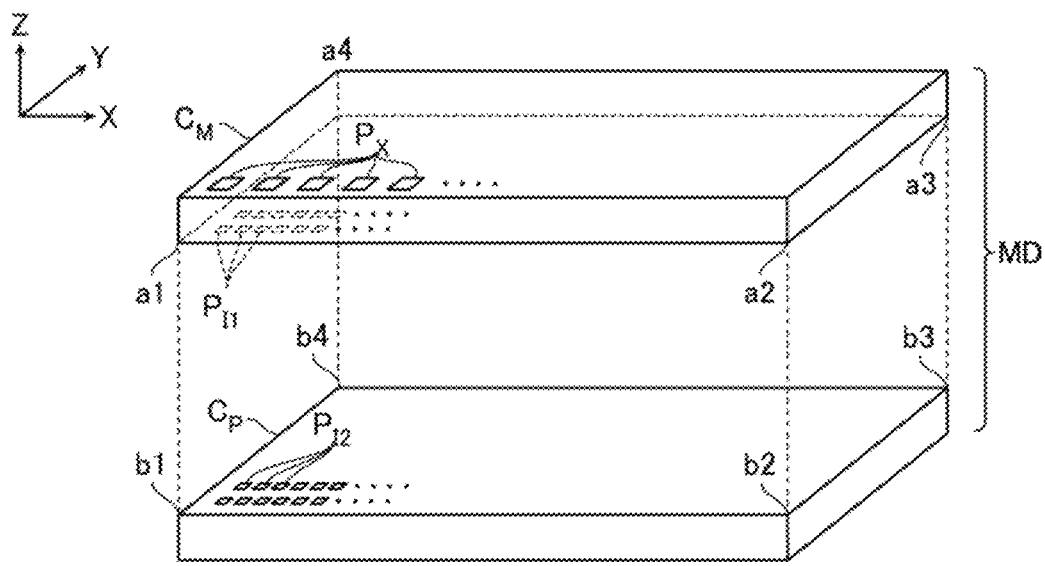
FIG. 1 illustrates a schematic exploded perspective view of a memory die.

Embodiments provide a semiconductor storage device capable of being suitably manufactured.

In general, according to an embodiment, a semiconductor storage device includes a semiconductor substrate with a first surface and a conductive layer separated from the first surface in a first direction intersecting the first surface of the semiconductor substrate. The conductive layer extends in a second direction parallel to the first surface. A semiconductor layer extending in the first direction through the conductive layer. A first contact extends in the first direction and is connected to a surface of the conductive layer facing away from the semiconductor substrate. A first insulating layer extends in the first direction, and a second insulating layer extends along the first insulating layer in the first direction. Each of the first and second insulating layers entirely overlaps with the first contact when viewed in the first direction.

According to another embodiment, a semiconductor storage device includes a semiconductor substrate, a plurality of first conductive layers arranged in a first direction intersecting a surface of the semiconductor substrate, a plurality of second conductive layers arranged in the first direction between the semiconductor substrate and the plurality of first conductive layers, a semiconductor layer extending in the first direction through the first and second conductive layers, and a contact extending in the first direction and connected to a surface of one of the first conductive layers facing away from the semiconductor substrate in the first direction. The contact includes a first portion extending through a part of the first conductive layers, a second portion extending through the second conductive layers, and a third portion between the first portion and the second portion. A width of the third portion in a cross section along the first direction is greater than a width of the first portion in the cross section.

A semiconductor storage device according to an example embodiment will be described with reference to the drawings. The following described embodiment is merely one example, and is not intended to limit the present disclosure. The following drawings are schematic, and some configurations and the like may be omitted for the sake of convenience in description. The same reference numerals may be given to parts common to a plurality of embodiments, and the description of such repeated aspects may be omitted.

In the present disclosure, when a first configuration is said to be "electrically connected" to a second configuration, the first configuration may be directly connected to the second configuration, or the first configuration may be connected to the second configuration via a wiring, an interconnection, a semiconductor member, a transistor, or the like. For example, when three transistors are connected in series, the first transistor is "electrically connected" to the third transistor even though the second transistor is in an OFF state.

In the present disclosure, a case where it is said that a circuit or the like "electrically connects" two interconnections or the like can mean that this circuit or the like includes a transistor or the like, the transistor or the like is provided on a current path between the two interconnections, and this transistor or the like enters an ON state.

In the present disclosure, one direction parallel to an upper surface of a substrate is referred to as an X direction, another direction which is parallel to the upper surface of the substrate and perpendicular to the X direction is referred to as a Y direction, and the direction orthogonal to the upper surface of the substrate is referred to as a Z direction.

In the present disclosure, one direction along a predetermined surface is referred to as a first direction, a direction along the predetermined surface and also intersecting the first direction is referred to as a second direction, and a direction intersecting the predetermined surface is referred to as a third direction. The first direction, the second direction, and the third direction need not necessarily correspond to any of the X direction, the Y direction, and the Z direction.

In the present disclosure, expressions such as "upper" and "lower" are relative expressions based in a general manner on a distance from the semiconductor substrate. For example, a direction increasingly separated from the semiconductor substrate along the Z direction is referred to as upward, and a direction approaching towards the semiconductor substrate along the Z direction is referred to as downward. When a lower surface and a lower end of a certain aspect is referenced, this intends to refer to a surface or an end portion of this aspect that is closest to or facing the semiconductor substrate, and when an upper surface pr an upper end are referenced, this intends to refer to a surface or an end portion of this aspect that is farthest away from or facing away from the semiconductor substrate. A surface intersecting the X direction or the Y direction can be referred to as a side surface, a lateral surface, or the like.

In the present disclosure, when a "width," "thickness," or other dimension in a predetermined direction is described for a configuration, a member, or the like this means that a width, a thickness, or other dimension that may be observed in a cross section or the like by scanning electron microscopy (SEM), transmission electron microscopy (TEM), or the like.

FIRST EMBODIMENT

Structure of Memory Die MD

FIG. 1 illustrates a schematic exploded perspective view of a configuration example of a semiconductor storage device according to a first embodiment. As shown in FIG. 1, a memory die MD includes a chip $C_M$ on a memory cell array side and a chip $C_P$ on a peripheral circuit side.

A plurality of external pad electrodes $P_X$ is provided on an upper surface of the chip $C_M$. A plurality of first bonding electrodes $P_{I1}$ is provided on a lower surface of the chip $C_M$. A plurality of second bonding electrodes $P_{I2}$ is provided on an upper surface of the chip $C_P$. The surface of the chip $C_M$ on which the first bonding electrodes $P_{I1}$ are provided is referred to as a front surface, and the surface on which the external pad electrodes $P_X$ are provided is referred to as a rear surface. In the chip $C_P$, the surface on which the second bonding electrodes $P_{I2}$ are provided is referred to as a front surface, and the surface of the chip $C_P$ opposite to the front surface is referred to as a rear surface. In the illustrated example of FIG. 1, the front surface of the chip $C_P$ is facing upwards, the rear surface of the chip $C_M$ is provided facing upwards.

The chip $C_M$ and the chip $C_P$ are provided such that the front surface of the chip $C_M$ and the front surface of the chip $C_P$ face each other. The plurality of first bonding electrodes $P_{I1}$ is provided so as to correspond to the plurality of second bonding electrodes $P_{I2}$. The plurality of first bonding electrodes $P_{I1}$ are provided at locations to which they can be respectively bonded to the plurality of second bonding electrodes $P_{I2}$. The first bonding electrodes $P_{I1}$ and the second bonding electrodes $P_{I2}$ are used for bonding the chip $C_M$ to the chip $C_P$, and function as electrodes for electrical connections between the chips.

In the example of FIG. 1, corners a1, a2, a3, and a4 of the chip $C_M$ correspond to corners b1, b2, b3, and b4 of the chip $C_P$, respectively.

Figure 2:
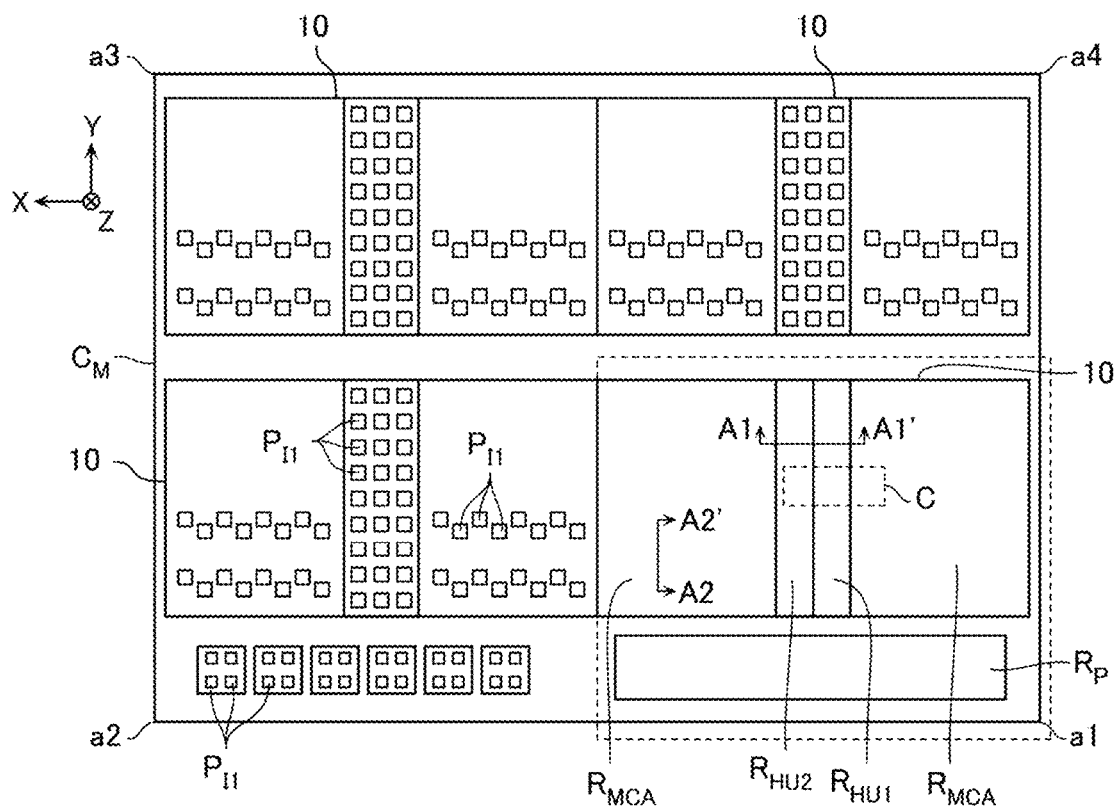
FIG. 2 illustrates a schematic bottom view of a memory chip.
Figure 3:
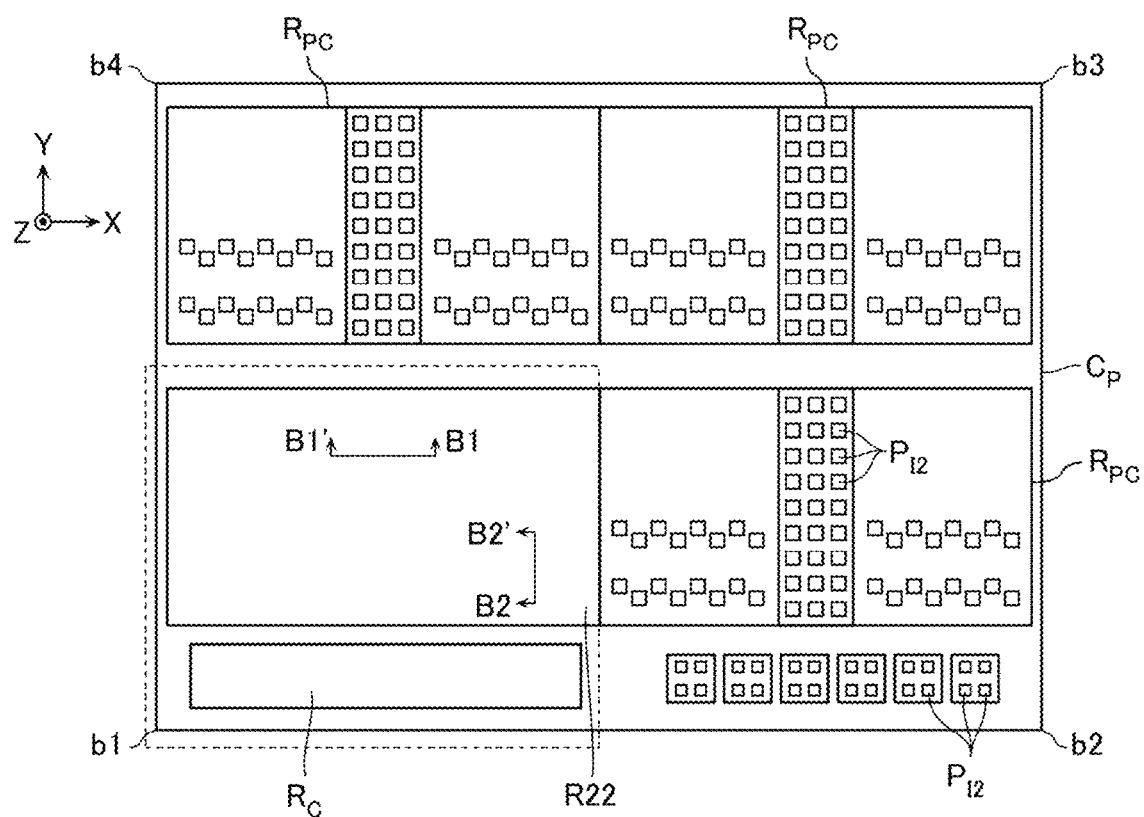
FIG. 3 illustrates a schematic plan view of a peripheral circuit chip.
Figure 4:
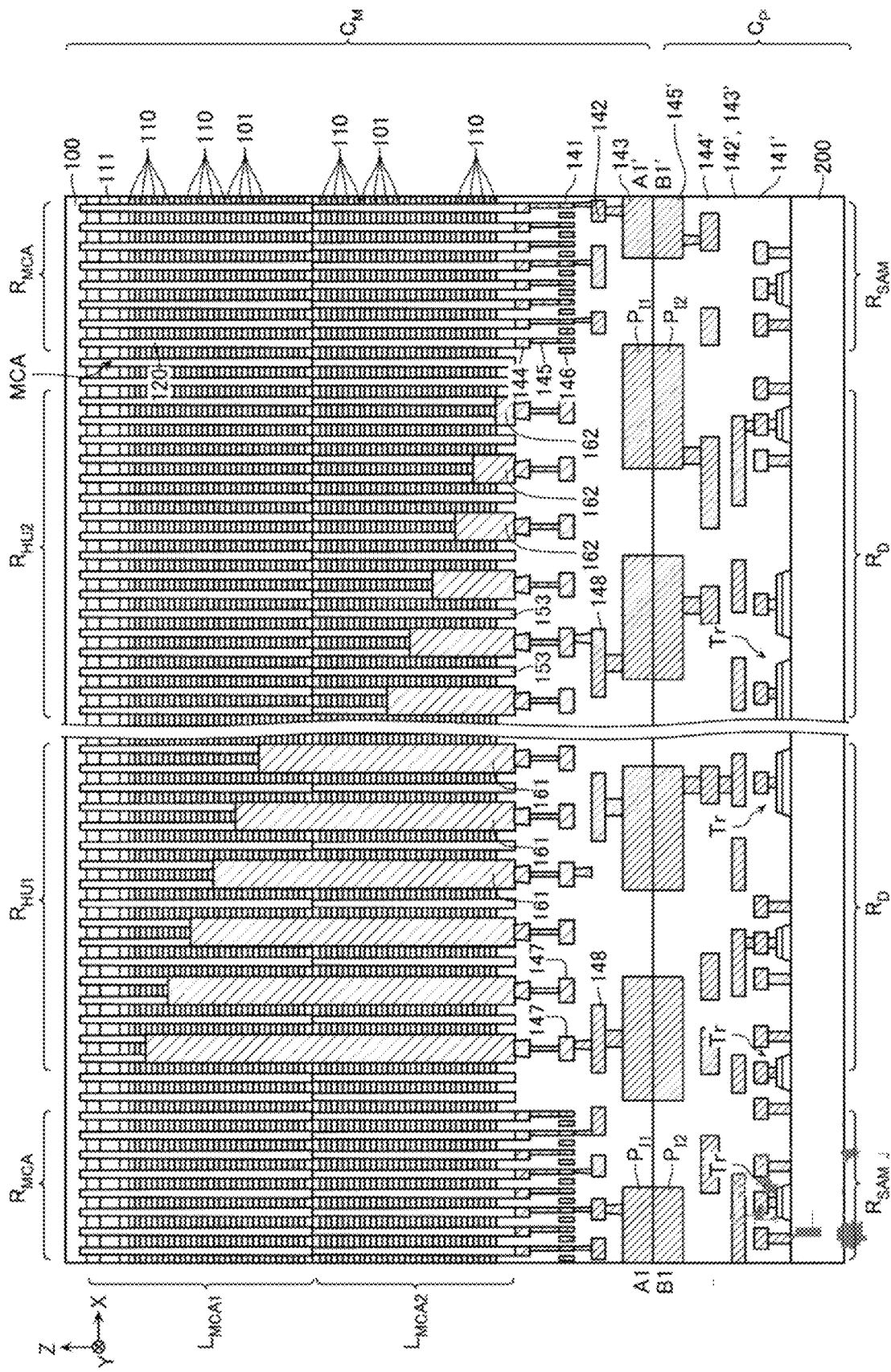
FIG. 4 illustrates a schematic cross-sectional view corresponding to line A1-A1' of FIG. 2 and line B1-B1' of FIG. 3.
Figure 5:
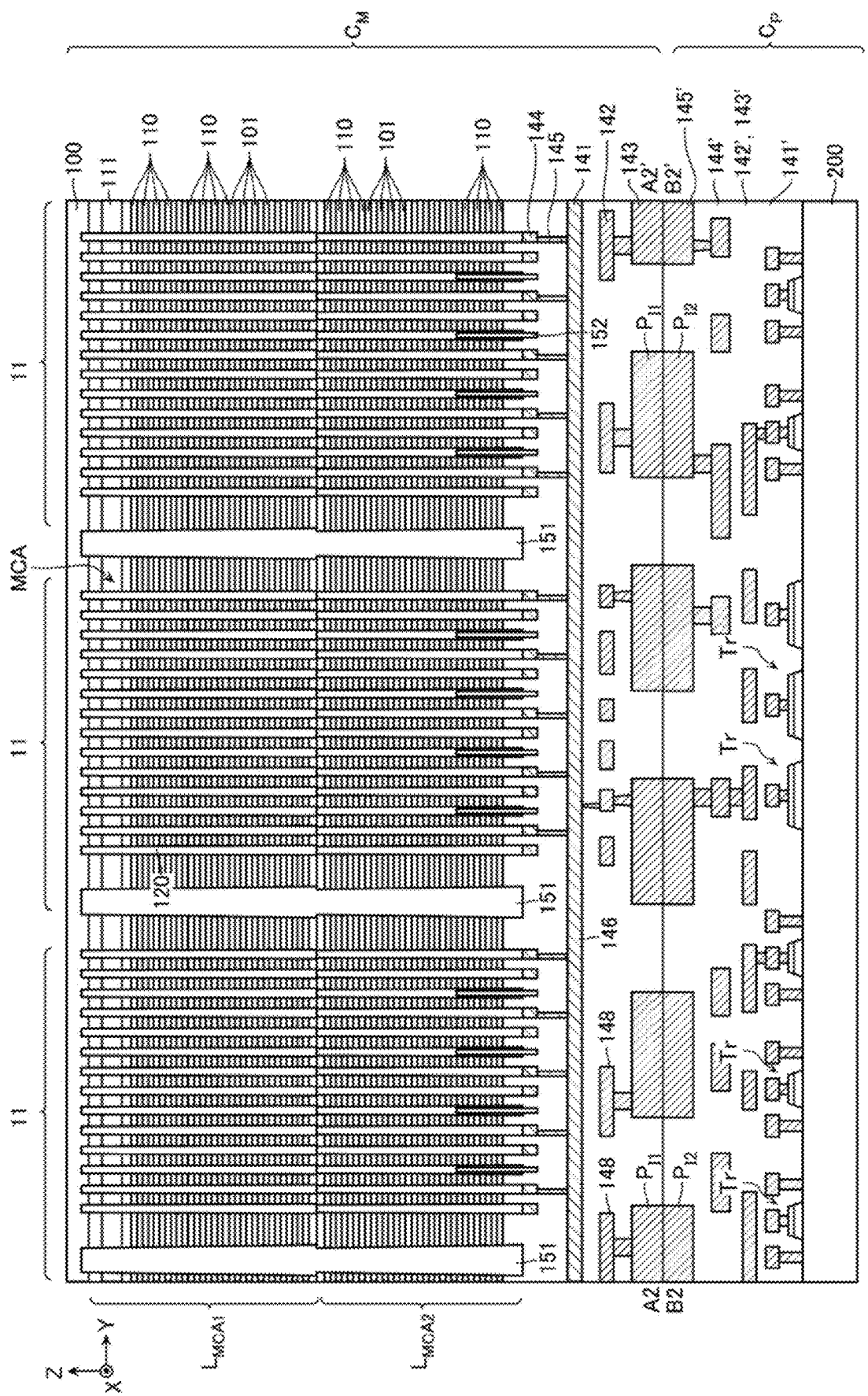
FIG. 5 illustrates a schematic cross-sectional view corresponding to line A2-A2' of FIG. 2 and line B2-B2' of FIG. 3.
Figure 6:
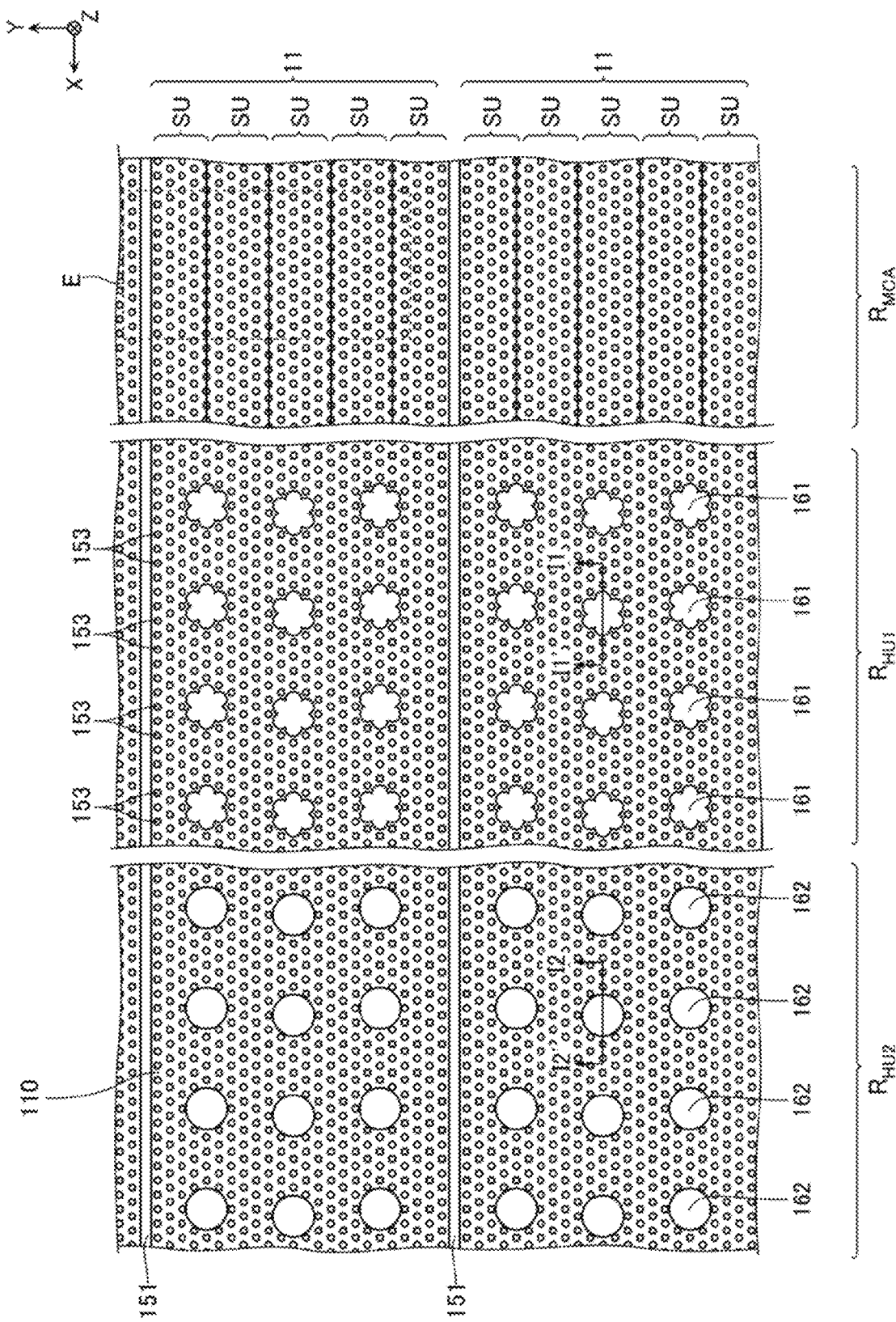
FIG. 6 illustrates a schematic enlarged view of a portion a region C of FIG. 2.
Figure 7:
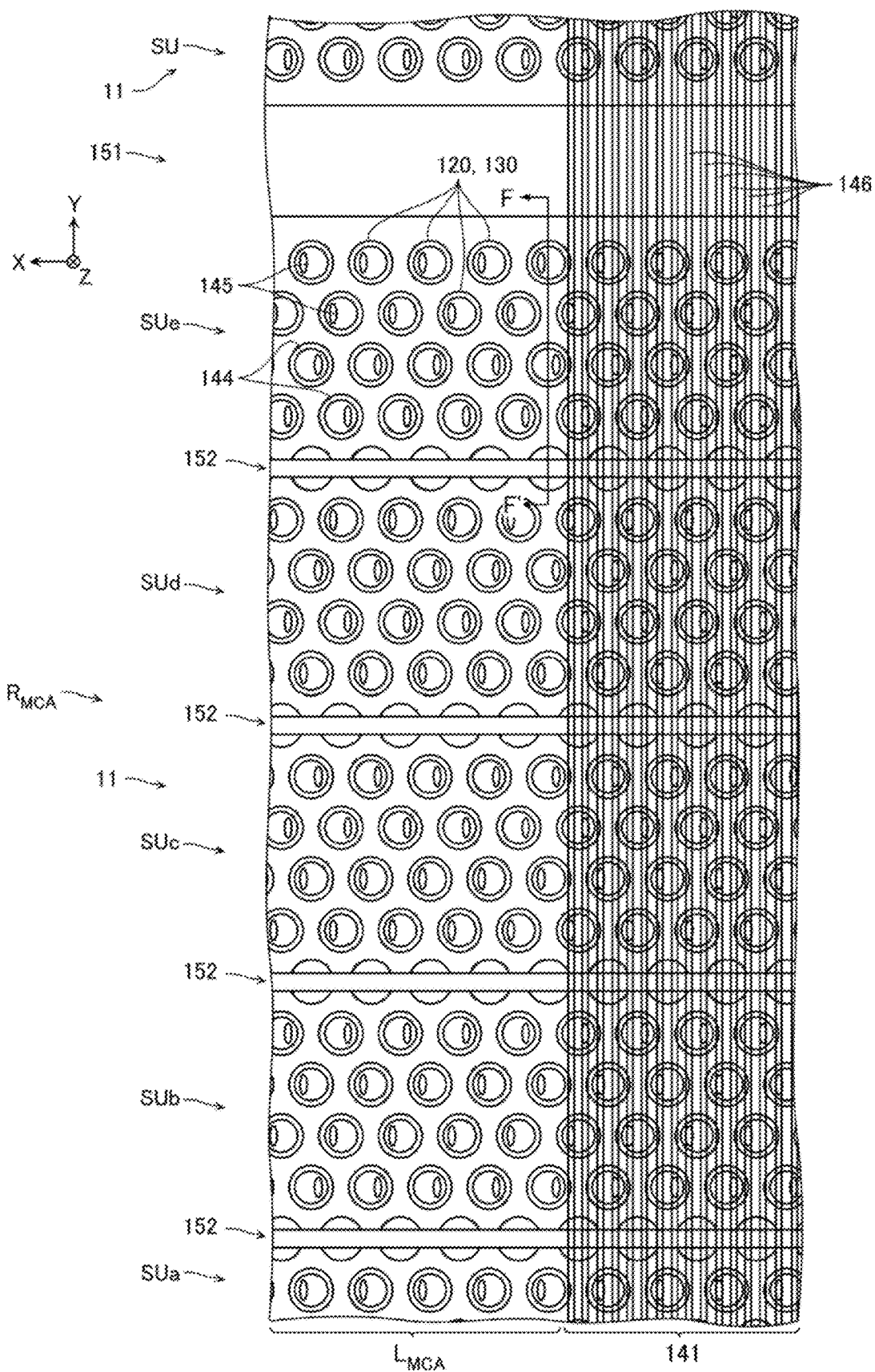
FIG. 7 illustrates a schematic enlarged view of a region E of FIG. 6.
Figure 8:
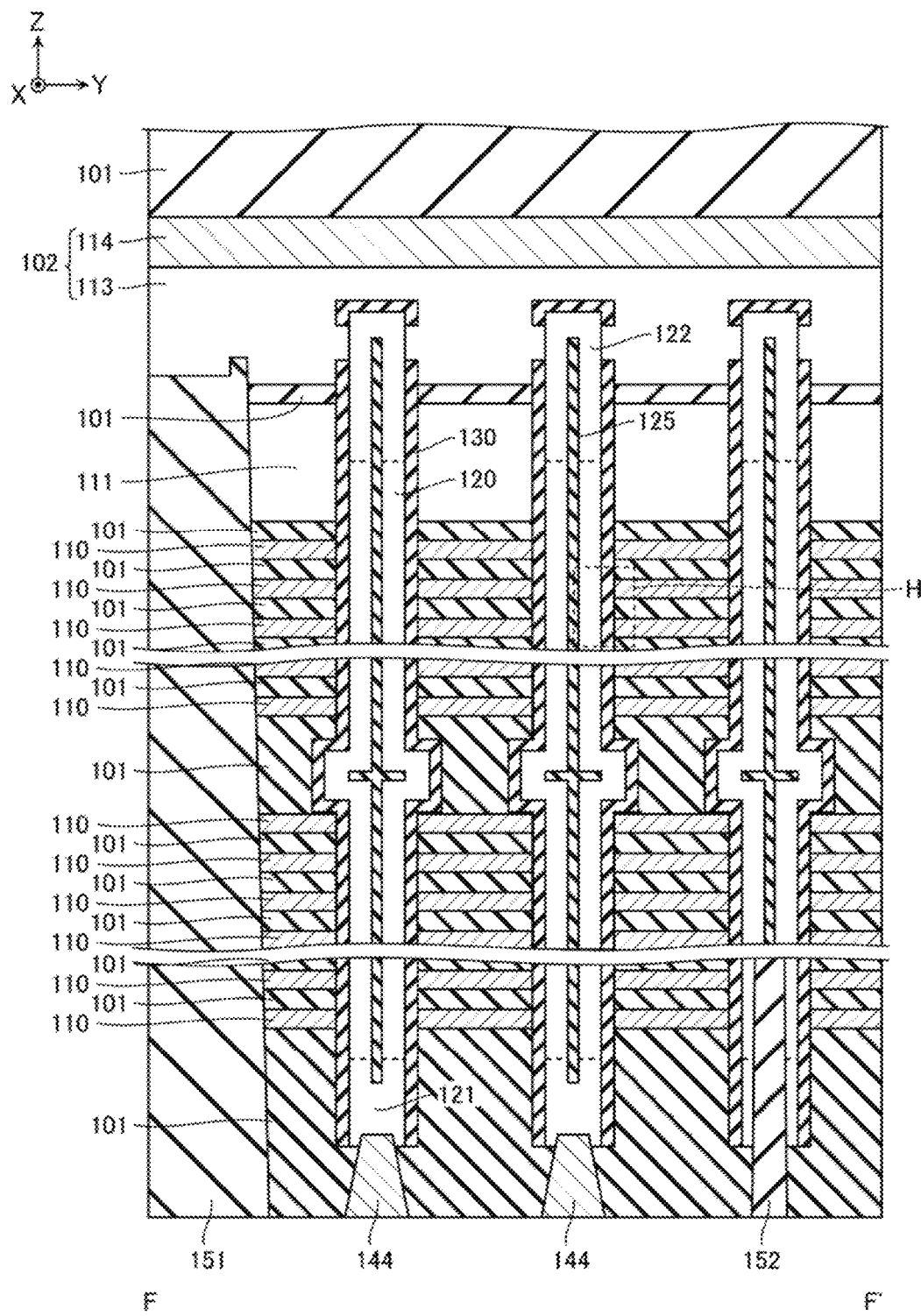
FIG. 8 illustrates a schematic cross-sectional view of a structure shown in FIG. 7 cut along a line F-F' and viewed along a direction of an arrow.
Figure 9:
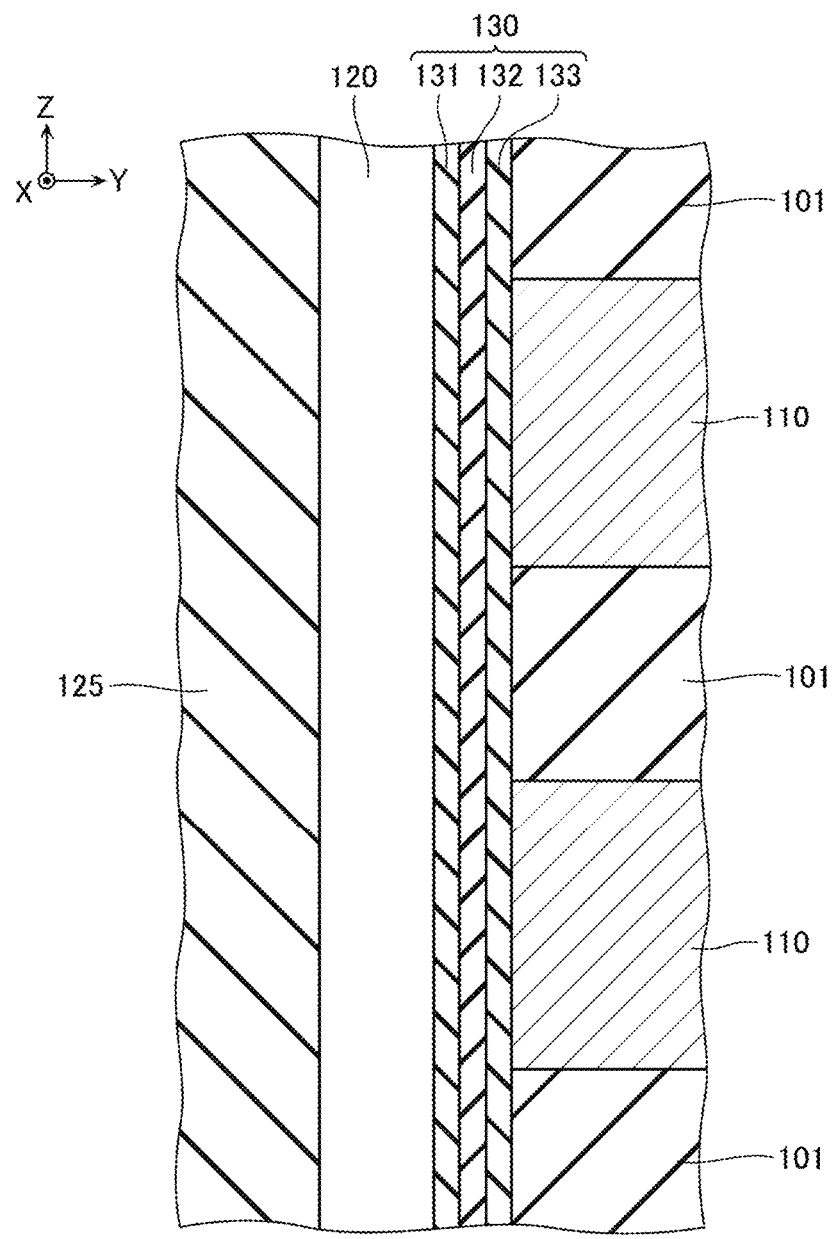
FIG. 9 illustrates a schematic enlarged view of a region H of FIG. 8.
Figure 10:
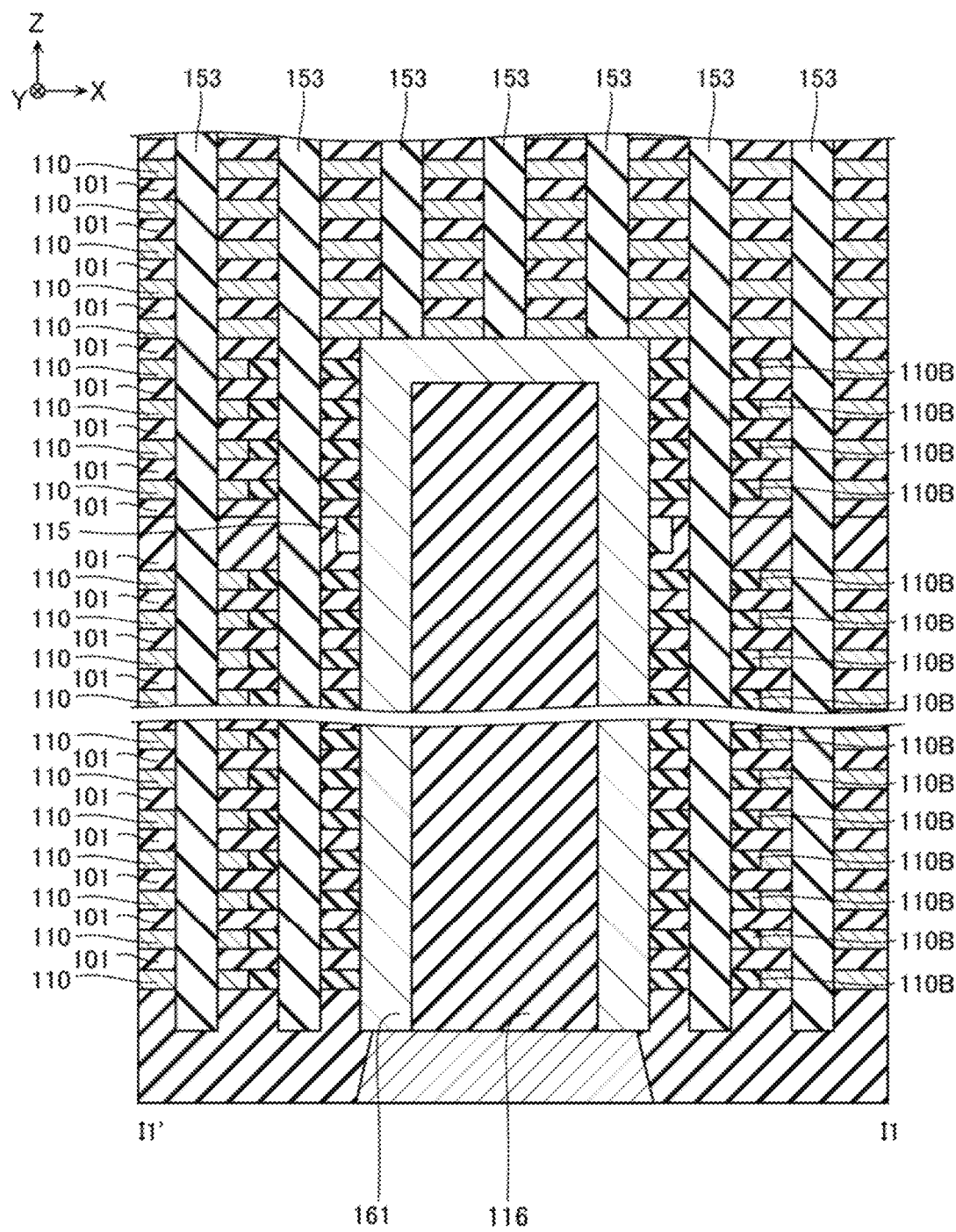
FIG. 10 illustrates a schematic cross-sectional view of a structure shown in FIG. 6 cut along a line I1-I1' and viewed along a direction of an arrow.
Figure 11:
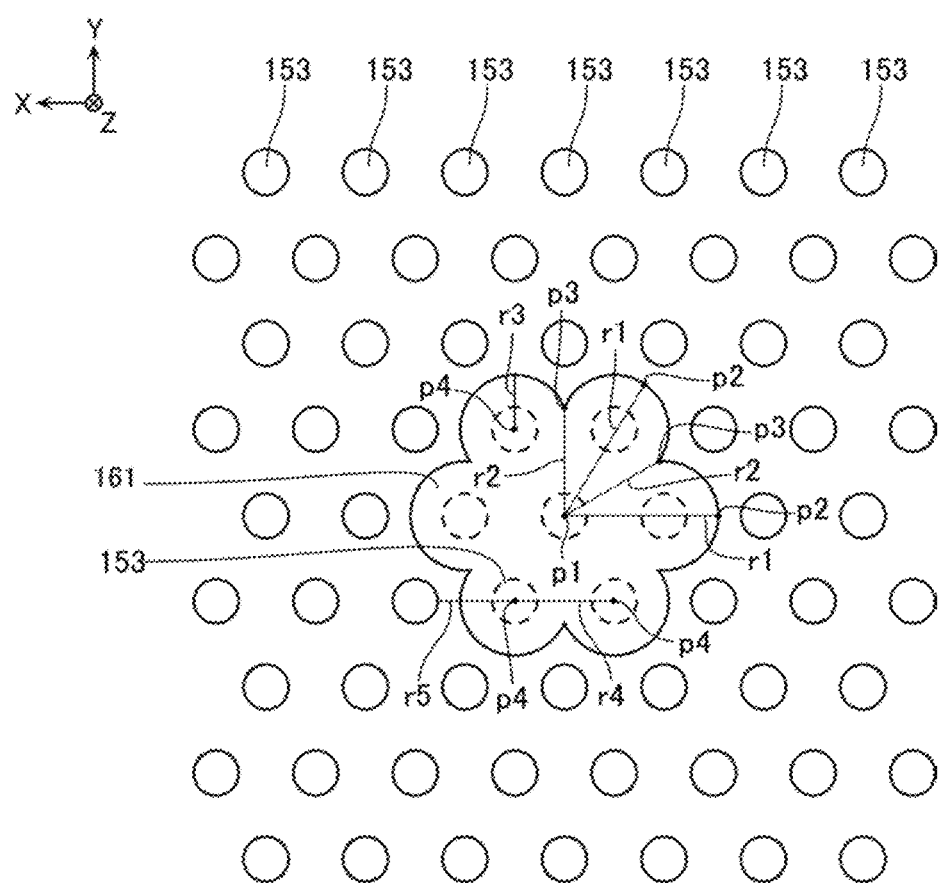
FIG. 11 illustrates a schematic enlarged view of FIG. 6.
Figure 12:
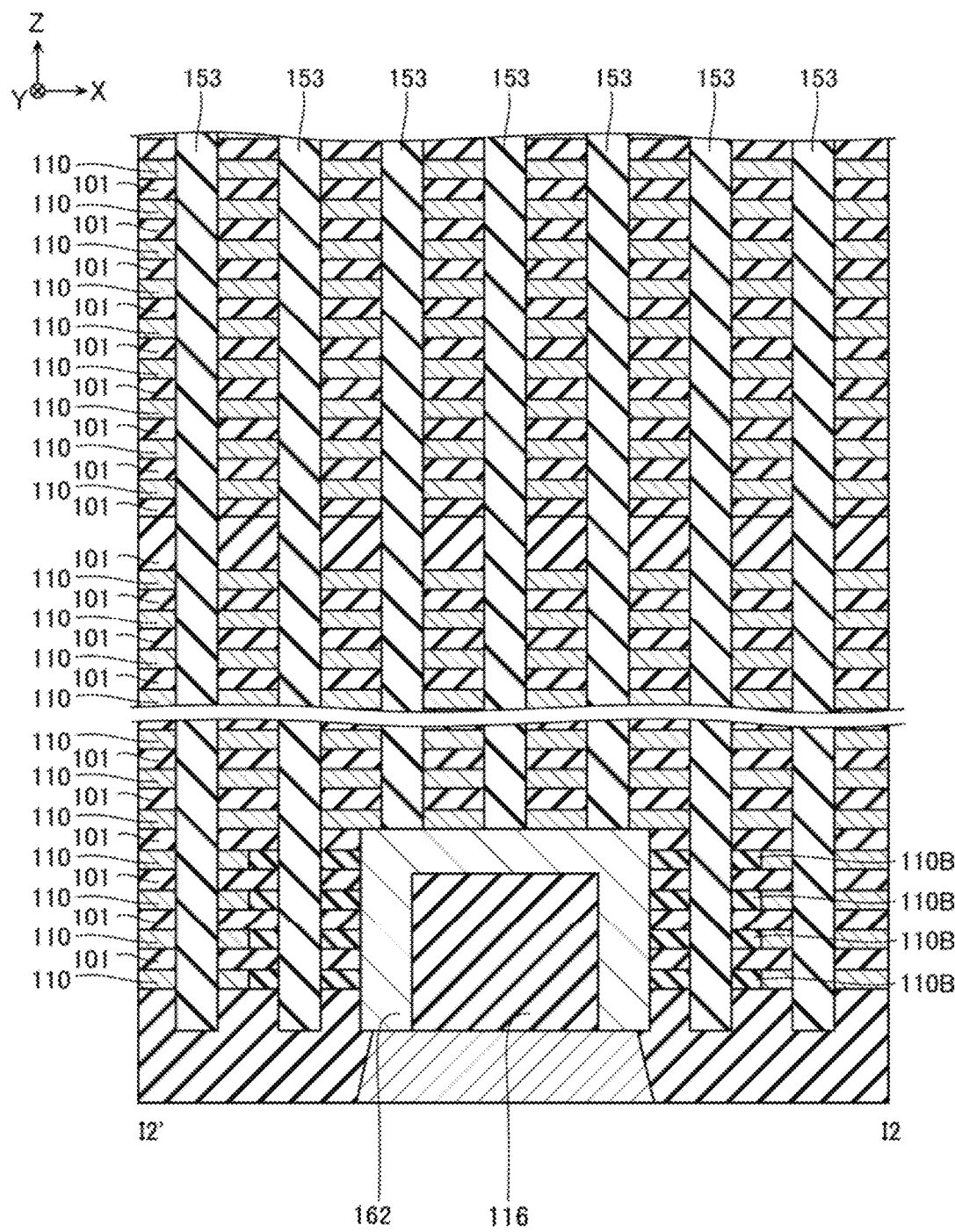
FIG. 12 illustrates a schematic cross-sectional view of the structure shown in FIG. 6 cut along a line I2-I2' and viewed along a direction of an arrow.
Figure 13:
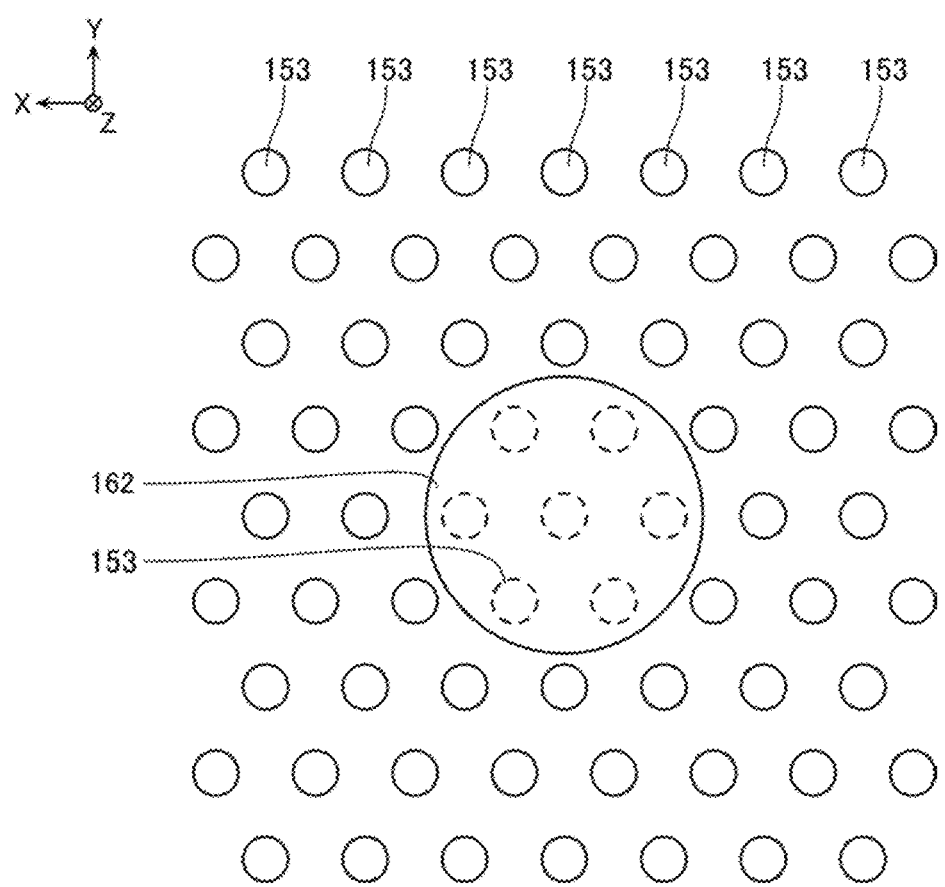
FIG. 13 illustrates a schematic enlarged view of FIG. 6.

FIG. 2 illustrates a schematic bottom view of a configuration example of the chip $C_M$. A portion surrounded by a dotted line on a lower right side of FIG. 2 indicates a structure in the interior of the chip $C_M$ is being depicted. FIG. 3 illustrates a schematic plan view of a configuration example of the chip $C_P$. A portion surrounded by a dotted line on a lower left side of FIG. 3 indicates a structure in the interior of the chip $C_P$ is being depicted. FIG. 4 illustrates a schematic cross-sectional view corresponding to a line A1-A1' of FIG. 2 and a line B1-B1' of FIG. 3. FIG. 5 illustrates a schematic cross-sectional view corresponding to a line A2-A2' of FIG. 2 and a line B2-B2' of FIG. 3. FIGS. 4 and 5 show a cross section when the structures shown in FIGS. 2 and 3 are cut along the lines and viewed in directions of arrows. FIG. 6 illustrates a schematic enlarged view of a portion indicated by C of FIG. 2. FIG. 7 illustrates a schematic enlarged view of a portion indicated by E of FIG. 6. FIG. 8 illustrates a schematic cross-sectional view of a structure shown in FIG. 7 cut along a line F-F' and viewed along a direction of an arrow. FIG. 9 illustrates a schematic enlarged view of a portion indicated by H of FIG. 8. FIG. 10 illustrates a schematic cross-sectional view of a structure shown in FIG. 6 cut along a line I1-I1' and viewed along a direction of an arrow. FIG. 11 illustrates a schematic enlarged view of a part of FIG. 6. FIG. 12 illustrates a schematic cross-sectional view of the structure shown in FIG. 6 cut along a line I2-I2' and viewed along a direction of an arrow. FIG. 13 illustrates a schematic enlarged view of a part of FIG. 6.

FIGS. 2 to 13 show schematic configurations. In FIGS. 2 to 13, some aspects are omitted from the depictions. For example, bit lines 146 provided in an interconnection layer 141 are shown in a right portion of FIG. 7, but the bit lines 146 are not shown in a left portion. However, as shown in FIG. 4, the bit lines 146 are provided over the entire region of a memory cell array region $R_{MCA}$.

Structure of Chip $C_M$

The chip $C_M$ includes four memory planes 10 arrayed in the X and Y directions, as shown in FIG. 2. Each memory plane 10 includes two memory cell array regions $R_{MCA}$ aligned with each other in the X direction, a first hook-up region $R_{HU1}$ and a second hook-up region $R_{HU2}$ aligned with each other in the X direction between the two memory cell array regions $R_{MCA}$. A memory cell array MCA is provided in the memory cell array region $R_{MCA}$. The chip $C_M$ includes a peripheral region $R_P$ provided closer to one end in the Y direction than the four memory planes 10.

As shown in FIGS. 4 and 5, the chip $C_M$ includes, for example, a base layer 100, a memory cell array layer $L_{MCA1}$ provided below the base layer 100, a memory cell array layer $L_{MCA2}$ provided below the memory cell array layer $L_{MCA1}$, and a plurality of interconnection layers 141, 142, and 143 provided below the memory cell array layer $L_{MCA2}$.

Structure of Base Layer 100 of Chip $C_M$

For example, the base layer 100 is provided on the rear surface of the chip $C_M$ as shown in FIG. 4. The base layer

100 includes, for example, an insulating layer 101 and a conductive layer 102 to be described later with reference to FIG. 8. The base layer 100 includes a passivation film (not shown) provided close to the rear surface of the chip $C_M$, and a rear surface interconnection layer (not shown) that functions as the external pad electrodes $P_X$ (FIG. 1).

Structure of Memory Cell Array Layers $L_{MCA1}$ and $L_{MCA2}$ of Chip $C_M$ in Memory Cell Array Regions For example, as shown in FIG. 6, a plurality of memory blocks 11 aligned in the Y direction are provided in the memory cell array layers $L_{MCA1}$ and $L_{MCA2}$. Each memory block 11 includes a plurality of string units SU aligned in the Y direction. An inter-block insulating layer 151 of a material such as silicon oxide ($SiO_2$) is provided between two memory blocks 11 adjacent to each other in the Y direction. For example, as shown in FIG. 7, an inter-string-unit insulating layer 152 of a material such as silicon oxide ($SiO_2$) is provided between two string units SU adjacent to each other in the Y direction.

As shown in FIG. 8, the memory block 11 includes, for example, a plurality of conductive layers 110 stacked in the Z direction, a plurality of semiconductor layers 120 extending in the Z direction, and a plurality of gate insulating film 130 provided between the plurality of conductive layers 110 and the plurality of semiconductor layers 120.

The conductive layer 110 is a plate-shaped conductive layer extending in the X direction. The conductive layer 110 may include a barrier conductive film such as titanium nitride (TiN) and a stacked film of a metal film such as tungsten (W). The conductive layer 110 may contain, for example, polycrystalline silicon or the like containing impurities such as phosphorus (P) and boron (B). Insulating layers 101 of a material such as silicon oxide ($SiO_2$) are provided between the stacked conductive layers 110 in the Z direction.

A conductive layer 111 is provided above the plurality of conductive layers 110. The conductive layer 111 may contain, for example, polycrystalline silicon or the like containing impurities such as phosphorus (P) and boron (B). An insulating layer 101 of a material such as silicon oxide ($SiO_2$) is provided between the conductive layer 111 and the conductive layer 110.

The conductive layer 102 is provided above the conductive layer 111. In the illustrated example, the conductive layer 102 includes a semiconductor layer 113 connected to an upper end of the semiconductor layer 120 and a conductive layer 114 connected to an upper surface of the semiconductor layer 113. The semiconductor layer 113 may contain, for example, polycrystalline silicon or the like containing impurities such as phosphorus (P) and boron (B). The conductive layer 114 may include, for example, metal such as tungsten (W), a conductive layer such as tungsten slicide, or another conductive layer. An insulating layer 101 is provided between the conductive layer 102 and the conductive layer 111.

For example, the semiconductor layers 120 are arrayed in a predetermined pattern in the X direction and the Y direction as shown in FIG. 7. The semiconductor layer 120 is, for example, a semiconductor material such as polycrystalline silicon (Si). As shown in FIG. 8, for example, the semiconductor layer 120 has a cylindrical shape, and an insulating layer 125 of a material such as silicon oxide is provided in a central (interior) portion thereof. An outer peripheral surface of each of the semiconductor layers 120 is surrounded by the conductive layer 110 and faces the conductive layer 110.

An impurity region 121 containing N-type impurities such as phosphorus (P) is provided at a lower end portion of the semiconductor layer 120. The impurity regions 121 are connected to the bit lines 146 via contacts 144 and contacts 145 (FIG. 5).

An impurity region 122 containing an N-type impurity such as phosphorus (P) or a P-type impurity such as boron (B) is provided at an upper end portion of the semiconductor layer 120. The impurity regions 122 are connected to the semiconductor layer 113 of the conductive layer 102. An outer peripheral surface of the impurity region 122 is surrounded by the conductive layer 111 and faces the conductive layer 111.

The gate insulating film 130 has a bottomed cylindrical shape that covers the outer peripheral surface of the semiconductor layer 120. As shown in FIG. 9, for example, the gate insulating film 130 includes a tunnel insulating film 131, a charge storage film 132, and a block insulating film 133 stacked between the semiconductor layer 120 and the conductive layer 110. The tunnel insulating film 131 and the block insulating film 133 are, for example, insulating films of a material such as silicon oxide ($SiO_2$). The charge storage film 132 is, for example, a film capable of storing charges such as a film of silicon nitride ($Si_3N_4$). The tunnel insulating film 131, the charge storage film 132, and the block insulating film 133 have a cylindrical shape, and extend in the Z direction along the outer peripheral surface of the semiconductor layer 120.

FIG. 9 shows an example in which the gate insulating film 130 includes the charge storage film 132 such as silicon nitride. However, the gate insulating film 130 may include, for example, a floating gate such as polycrystalline silicon containing N-type or P-type impurities.

Structure of Memory Cell Array Layers $L_{MCA1}$ and $L_{MCA2}$ of Chip $C_M$ in First Hook-Up Region $R_{HU1}$ As shown in FIG. 4, a part of the plurality of conductive layers 110 and the conductive layer 111, a plurality of support structures 153 extending in the Z direction by penetrating the plurality of conductive layers 110 and the conductive layer 111, and a plurality of contacts 161 connected to the plurality of conductive layers 110 and the conductive layer 111 are provided in the first hook-up region $R_{HU1}$. The plurality of conductive layers 110 and the conductive layer 111 in the memory cell array layer $L_{MCA1}$ are connected to elements of the chip $C_P$ via the plurality of contacts 161. The support structure 153 comprises, for example, silicon oxide ($SiO_2$).

The plurality of contacts 161 is connected to the plurality of conductive layers 110 in the memory cell array layer $L_{MCA1}$ by penetrating all the conductive layers 110 in the memory cell array layer $L_{MCA2}$ and penetrating a part of the conductive layers 110 in the memory cell array layer $L_{MCA1}$. The contact 161 includes, for example, a barrier conductive film such as titanium nitride (TiN) and a stacked film of a metal film such as tungsten (W). As shown in FIG. 10, for example, the contact 161 has a bottomed cylindrical shape, and an insulating layer 116 of a material such as silicon oxide ($SiO_2$) is provided at a central portion (interior) thereof. An upper surface of the contact 161 is in contact with a lower surface of the conductive layer 110 and lower ends of the plurality of support structures 153. A plurality of insulating layers 110B stacked in the Z direction and a plurality of insulating layers 101 provided between the plurality of insulating layers 110B are provided on an outer peripheral surface of the contact 161. Each of the insulating layers 110B is provided between the contact 161 and the conductive layer 110, and comprises silicon oxide ($SiO_2$) or the like. The contact 161 is insulated from the conductive layer 110 via the insulating layer 110B. In some examples, the insulating layer 110B may include gaps (voids or seams).

As shown in FIG. 11, a portion of the contact 161 in the memory cell array layer $L_{MCA2}$ has a flower-like shape when viewed from the Z direction. That is, assuming that a distance from a center p1 of the contact 161 to the outer peripheral surface of the contact 161 is r, the outer peripheral surface of the contact 161 has a plurality of points p2 at which the distance r is a maximum value r1 and a plurality of points p3 at which the distance r is a minimum value r2. The points p2 and the points p3 alternate with each other along the outer peripheral surface of the contact 161 to form what is referred to as a flower-like shape. The contact 161 is provided at a location overlapping with several support structures 153 when viewed from the Z direction. Assuming a circle having a radius r3 with a center of p4 of such a support structure 153 in an XY plane as a center, at least a part of the outer peripheral surface of the contact 161 overlaps with this circle. Each point p2 is provided on a circumference of such a circle. The radius r3 is larger than a size r4/2, which is half of a distance r4 between the centers p4 of two adjacent support structures 153 in the XY plane. The radius r3 is smaller than a distance r5 from the center p4 of one support structure 153 to the outer peripheral surface of an adjacent support structure 153 in the XY plane.

As shown in FIG. 10, an insulating layer 115 is provided at a portion of the outer peripheral surface of the contact 161 located at a boundary between the memory cell array layer $L_{MCA1}$ and the memory cell array layer $L_{MCA2}$. The insulating layer 115 contains, for example, a metal oxide such as aluminum oxide (AlO), hafnium oxide (HfO), or zirconium oxide (ZrO). In the example of the first embodiment, the plurality of insulating layers 115 is provided so as to correspond to the plurality of contacts 161. However, one insulating layer 115 that covers a lower surface of the memory cell array layer $L_{MCA1}$ may be provided over the entire first hook-up region $R_{HU1}$ instead of the plurality of insulating layers 115. The insulating layer 115 may be provided over a region other than the first hook-up region $R_{HU1}$.

Structure of Memory Cell Array Layers $L_{MCA1}$ and $L_{MCA2}$ of Chip $C_M$ in Second Hook-Up Region $R_{HU2}$ As shown in FIG. 4, a part of the plurality of conductive layers 110 and the conductive layer 111, a plurality of support structures 153 extending in the Z direction by penetrating the plurality of conductive layers 110 and the conductive layer 111, and a plurality of contacts 162 connected to the plurality of conductive layers 110 are provided in the second hook-up region $R_{HU2}$. The plurality of conductive layers 110 in the memory cell array layer $L_{MCA2}$ is connected to elements of the chip $C_P$ via the plurality of contacts 162.

The plurality of contacts 162 is connected to the plurality of conductive layers 110 in the memory cell array layer $L_{MCA2}$ by penetrating a part of the conductive layers 110 in the memory cell array layer $L_{MCA2}$. The contact 162 includes, for example, a barrier conductive film such as titanium nitride (TiN) and a stacked film of a metal film such as tungsten (W). As shown in FIG. 12, for example, the contact 162 has a cylindrical shape, and an insulating layer 116 is provided at a central portion thereof. An upper surface of the contact 162 is in contact with the lower surface of the conductive layer 110 and lower ends of the plurality of support structures 153. A plurality of insulating layers 110B stacked in the Z direction and a plurality of insulating layers 101 provided between the plurality of insulating layers 110B are provided on an outer peripheral surface of the contact 162. Each of the insulating layers 110B is provided between the contact 162 and the conductive layer 110, and comprises silicon oxide (SiO$_2$) or the like. The contact 162 is insulated from the conductive layer 110 via the insulating layer 110B. In some examples, the insulating layer 110B may include gaps (voids or seams).

As shown in FIG. 13, the contact 162 has a circular shape when viewed from the Z direction. The contact 162 is provided at a location overlapping with several support structures 153 when viewed from the Z direction.

Structure of Interconnection Layers 141, 142, and 143 of Chip $C_M$

For example, as shown in FIGS. 4 and 5, a plurality of interconnections in the interconnection layers 141, 142, and 143 is electrically connected to, for example, at least one of the memory cell array layers $L_{MCA1}$ and $L_{MCA2}$ and elements of the chip $C_P$.

The interconnection layer 141 includes a plurality of interconnections 147. The plurality of interconnections 147 may include, for example, a barrier conductive film such as titanium nitride (TiN) and a stacked film of a metal film such as copper (Cu). A part of the plurality of interconnections 147 functions as the bit line 146. As shown in FIG. 7, for example, the bit lines 146 are arrayed along the X direction and extend in the Y direction. Each bit line 146 is connected to one semiconductor layer 120 in each string unit SU.

The interconnection layer 142 includes, for example, a plurality of interconnections 148 as shown in FIGS. 4 and 5. The interconnections 148 may include, for example, a barrier conductive film such as titanium nitride (TiN) and a stacked film of a metal film such as copper (Cu).

The interconnection layer 143 includes a plurality of first bonding electrodes $P_{I1}$. The plurality of first bonding electrodes $P_{I1}$ may include, for example, a barrier conductive film such as titanium nitride (TiN) and a stacked film of a metal film such as copper (Cu).

Structure of Chip $C_P$

As shown in FIG. 3, for example, the chip $C_P$ includes four peripheral circuit regions $R_{PC}$ arrayed in the X and Y directions so as to correspond to the memory planes 10. The chip $C_P$ includes a circuit region $R_C$ provided in a region facing the peripheral region $R_P$.

As shown in FIGS. 4 and 5, the chip $C_P$ includes, for example, a semiconductor substrate 200, a plurality of transistors Tr provided on a front surface of the semiconductor substrate 200, and a plurality of interconnection layers 141' to 145' provided above the plurality of transistors Tr. The semiconductor substrate 200 is, for example, a semiconductor substrate made of P-type silicon (Si) containing P-type impurities such as boron (B). The interconnection layer 141' is an interconnection layer containing a conductive material such as tungsten (W). The interconnection layer 142' is an interconnection layer containing a conductive material such as copper (Cu). The interconnection layer 143' is an interconnection layer containing a conductive material such as copper (Cu). The interconnection layer 144' is an interconnection layer containing a conductive material such as copper (Cu) or aluminum (Al). The interconnection layer 145' is, for example, an interconnection layer containing a conductive material such as copper (Cu), and includes a plurality of second bonding electrodes $P_{I2}$.

Manufacturing Method

Figure 29:
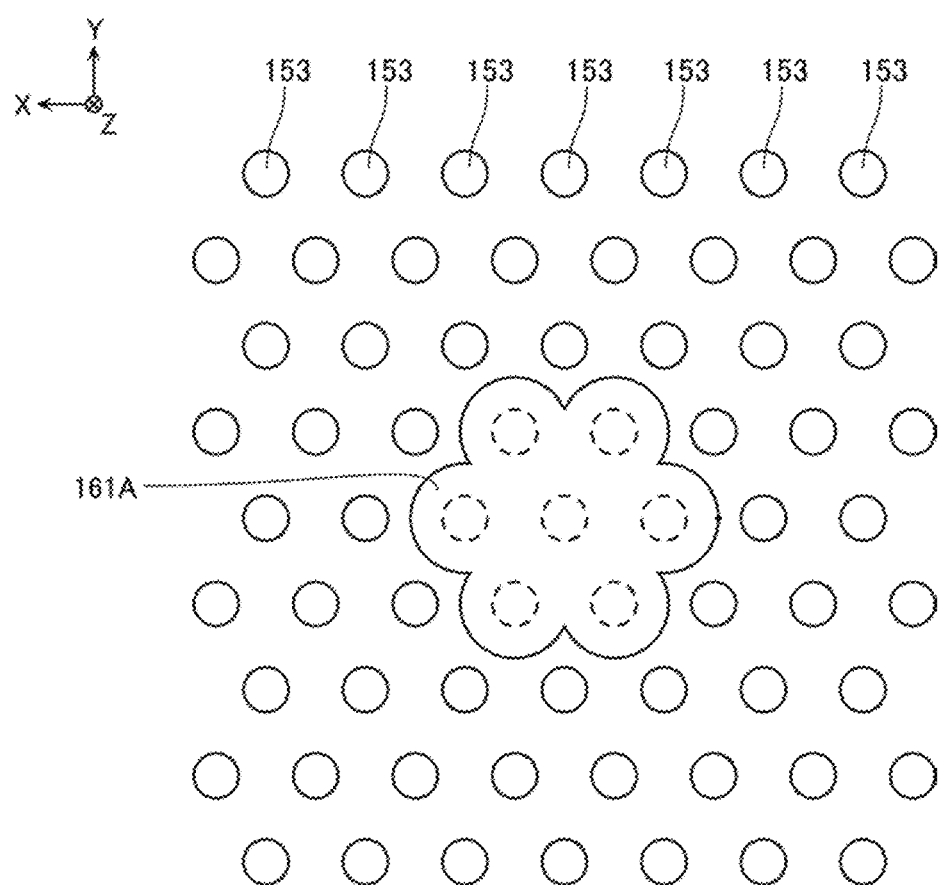
Figure 30:
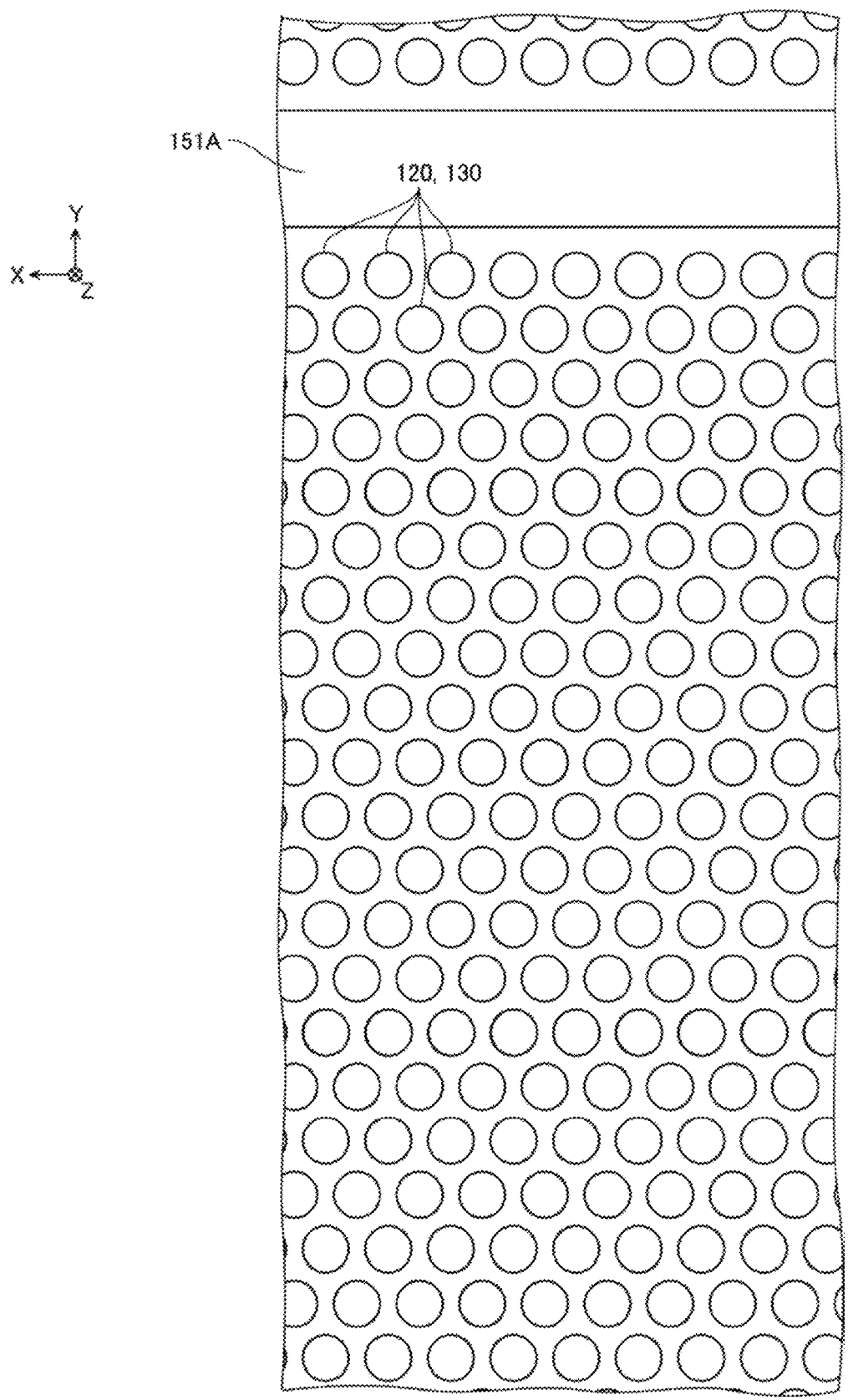

Next, a method of manufacturing the memory die MD will be described with reference to FIGS. 14 to 46. FIGS. 14, 15, 17 to 25, 27, 32 to 38, and 46 illustrate schematic cross-sectional views of structures to explain the manufacturing method, and show cross sections corresponding to FIG. 4. FIGS. 16 and 30 illustrate schematic bottom view of structures to explain the manufacturing method, and show the lower surfaces corresponding to FIG. 7. FIGS. 26, 28, 31, 44, and 45 illustrate schematic cross-sectional views of structures to explain the manufacturing method, and show cross sections corresponding to FIG. 5. FIG. 29 illustrate a schematic bottom view of a structure to explain the manufacturing method, and shows the lower surface corresponding to FIG. 11. FIGS. 39 to 43 illustrate schematic cross-sectional views of structures to explain the manufacturing method, and show cross sections corresponding to FIG. 10.

Figure 14:
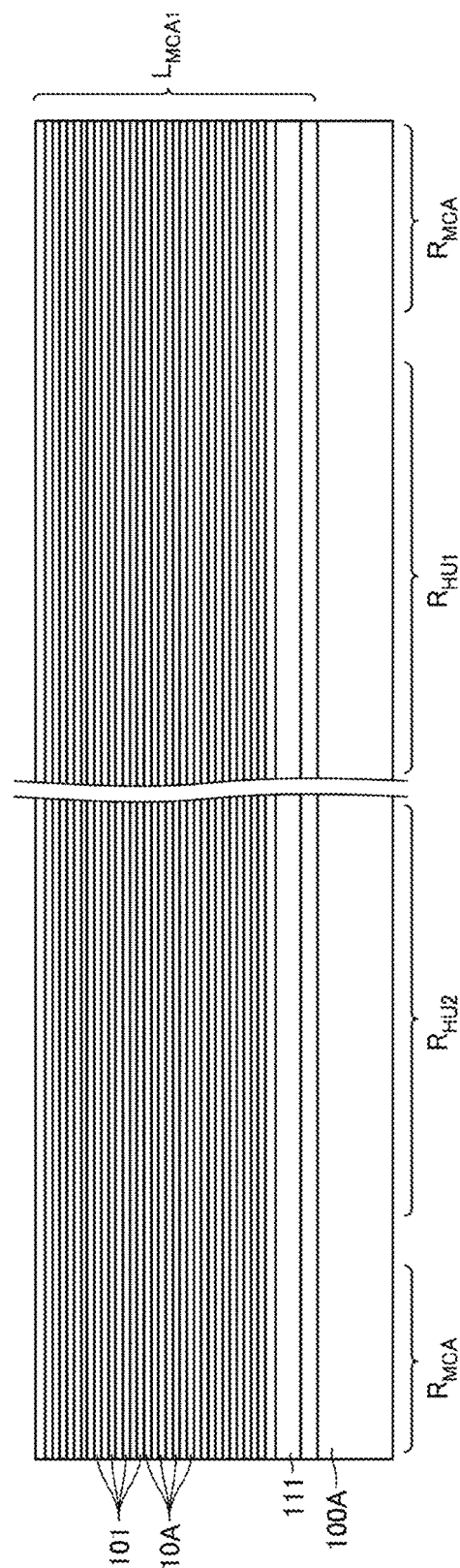
FIGS. 14-46 are schematic cross-sectional views of structures to illustrating aspects of a method of manufacturing a memory die according to a first embodiment.

In manufacturing the memory die MD according to the present embodiment, a semiconductor wafer 100A is formed as shown in FIG. 14, for example. An insulating layer 101 is formed on an upper surface of the semiconductor wafer 100A. A conductive layer 111 and an insulating layer 101 are formed on an upper surface of the insulating layer 101. A plurality of sacrificial layers 110A and insulating layers 101 are alternately formed. The sacrificial layer 110A contains, for example, silicon nitride (SiN) and the like. This process is performed by, for example, a method such as chemical vapor deposition (CVD).

Figure 15:
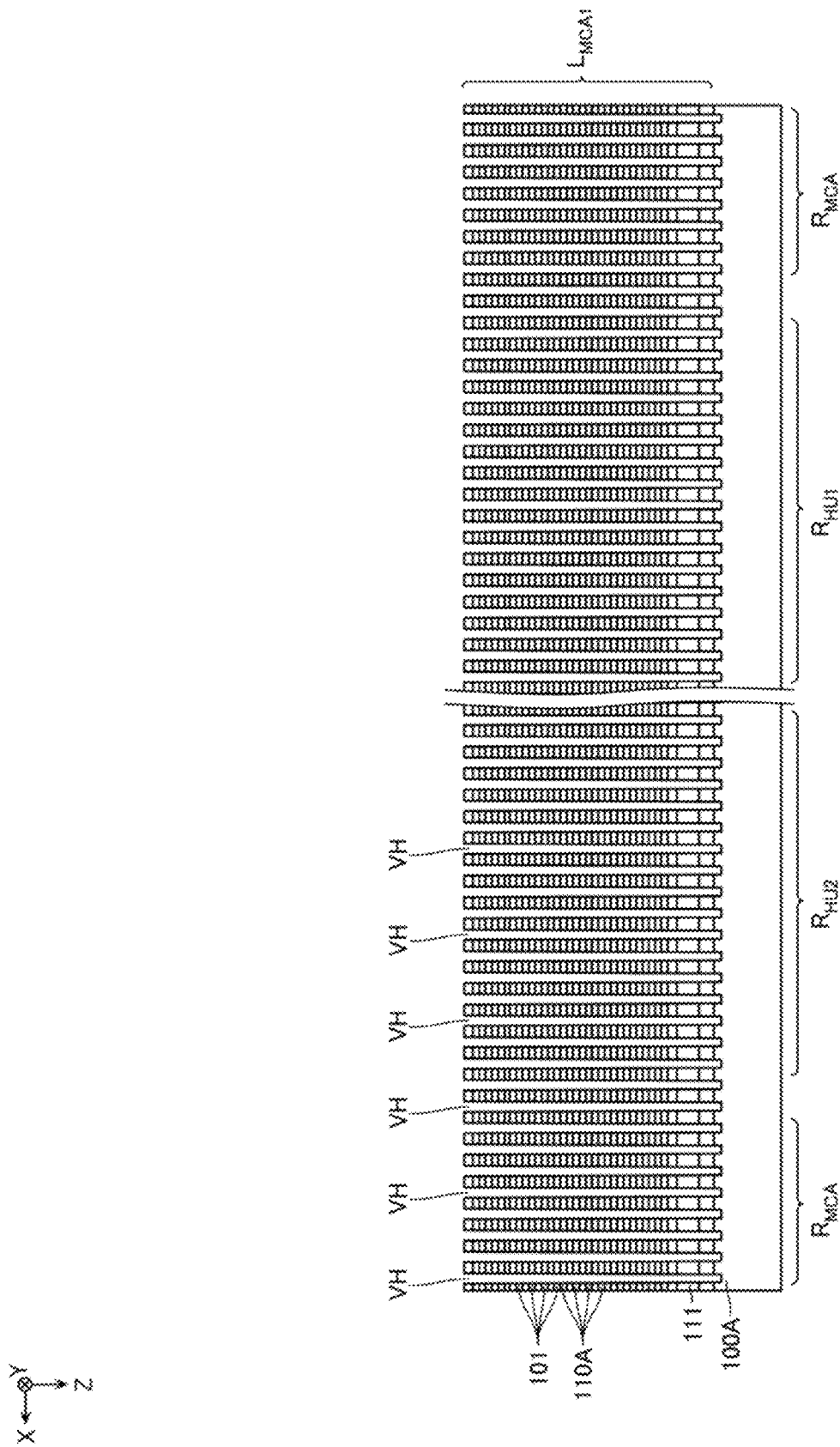
Figure 16:
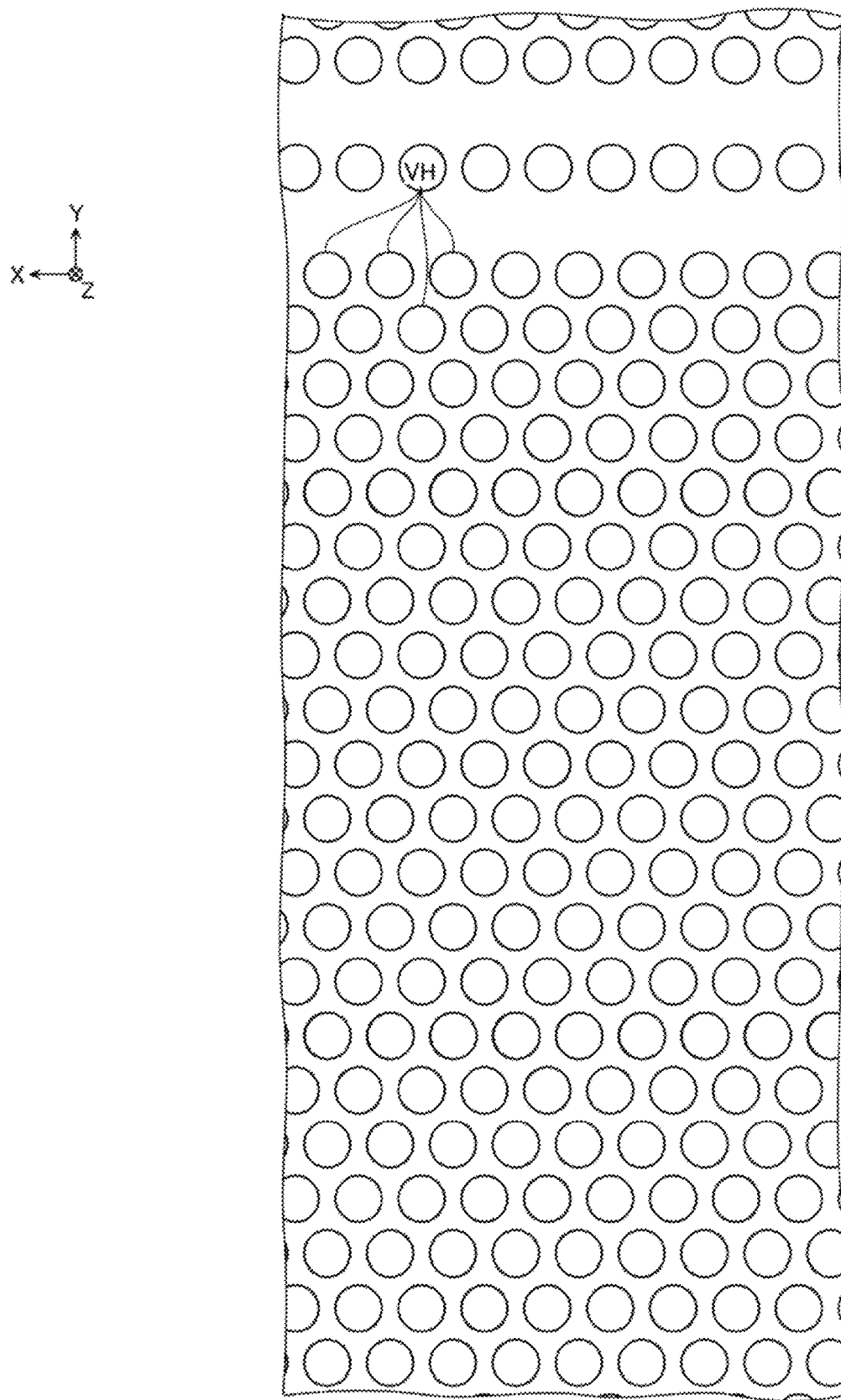

Subsequently, a plurality of via holes VH is formed as shown in FIG. 15. The via hole VH extends in the Z direction, and penetrates the insulating layer 101, the sacrificial layer 110A, the conductive layer 111, and a part of elements of the wafer 100A. This process is performed by, for example, a method such as RIE. As shown in FIG. 16, the via holes VH are provided in locations corresponding to the semiconductor layer 120 (FIG. 7), locations corresponding to the support structures 153 (FIG. 4), and locations corresponding to the inter-block insulating layers 151 (FIG. 7).

Figure 17:
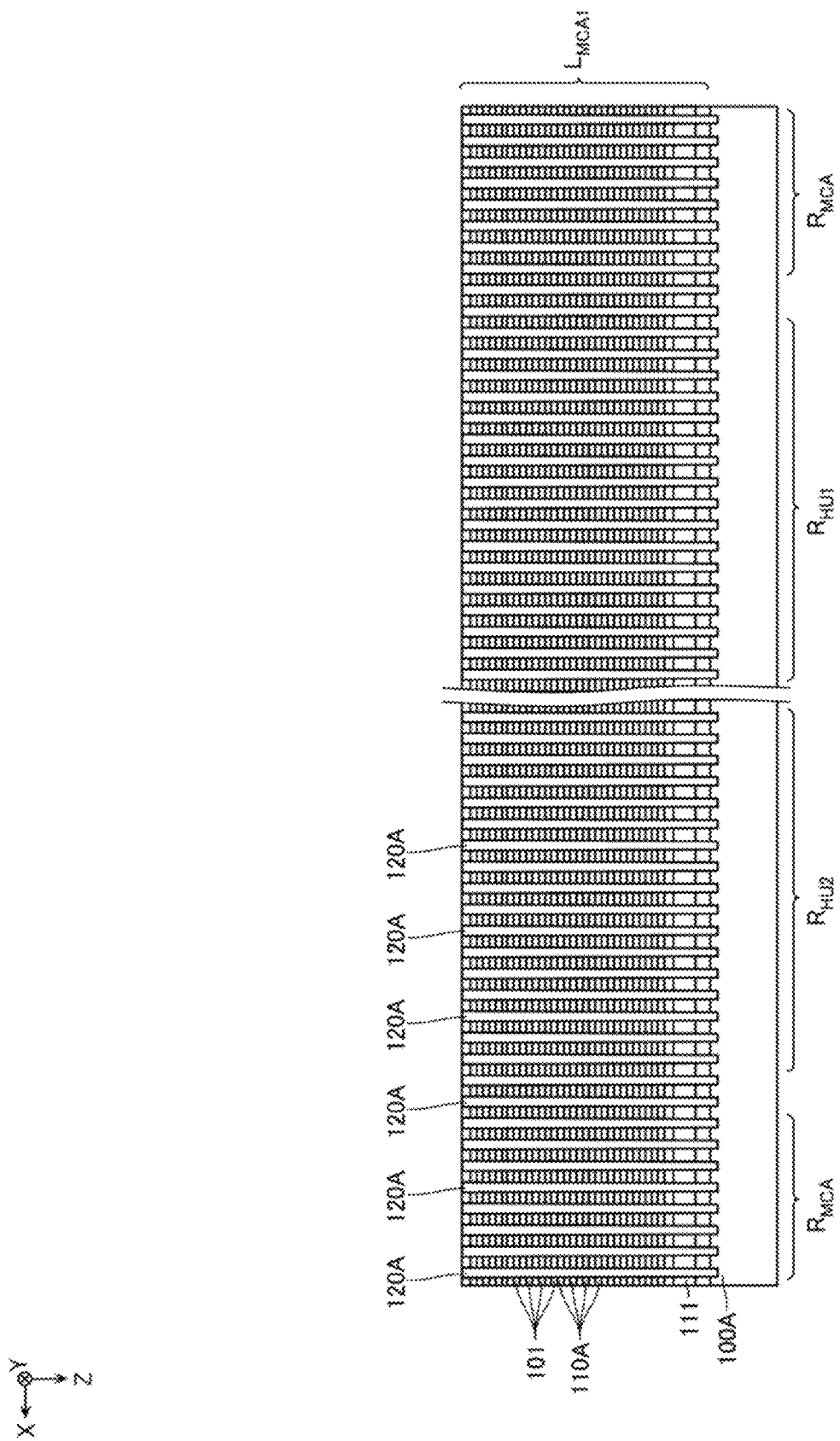

Subsequently, sacrificial films 120A are formed on inner peripheral surfaces of the via holes VH as shown in FIG. 17. The sacrificial film 120A contains a material contained in the sacrificial layer 110A and a material different from the material contained in the insulating layer 101. The sacrificial film 120A contains, for example, silicon (Si), metal, or the like. This process is performed by, for example, a method such as CVD. In this process, before the sacrificial films 120A are formed, an insulating film of a material such as silicon oxide ($SiO_2$) or silicon nitride (SiN) may be formed or an oxidation treatment, a nitriding treatment, or the like may be performed. In this process, silicon oxide ($SiO_2$) or the like may be formed on the inner peripheral surfaces of the plurality of via holes VH corresponding to the support structures 153 among the plurality of via holes VH instead of the sacrificial films 120A.

Figure 18:
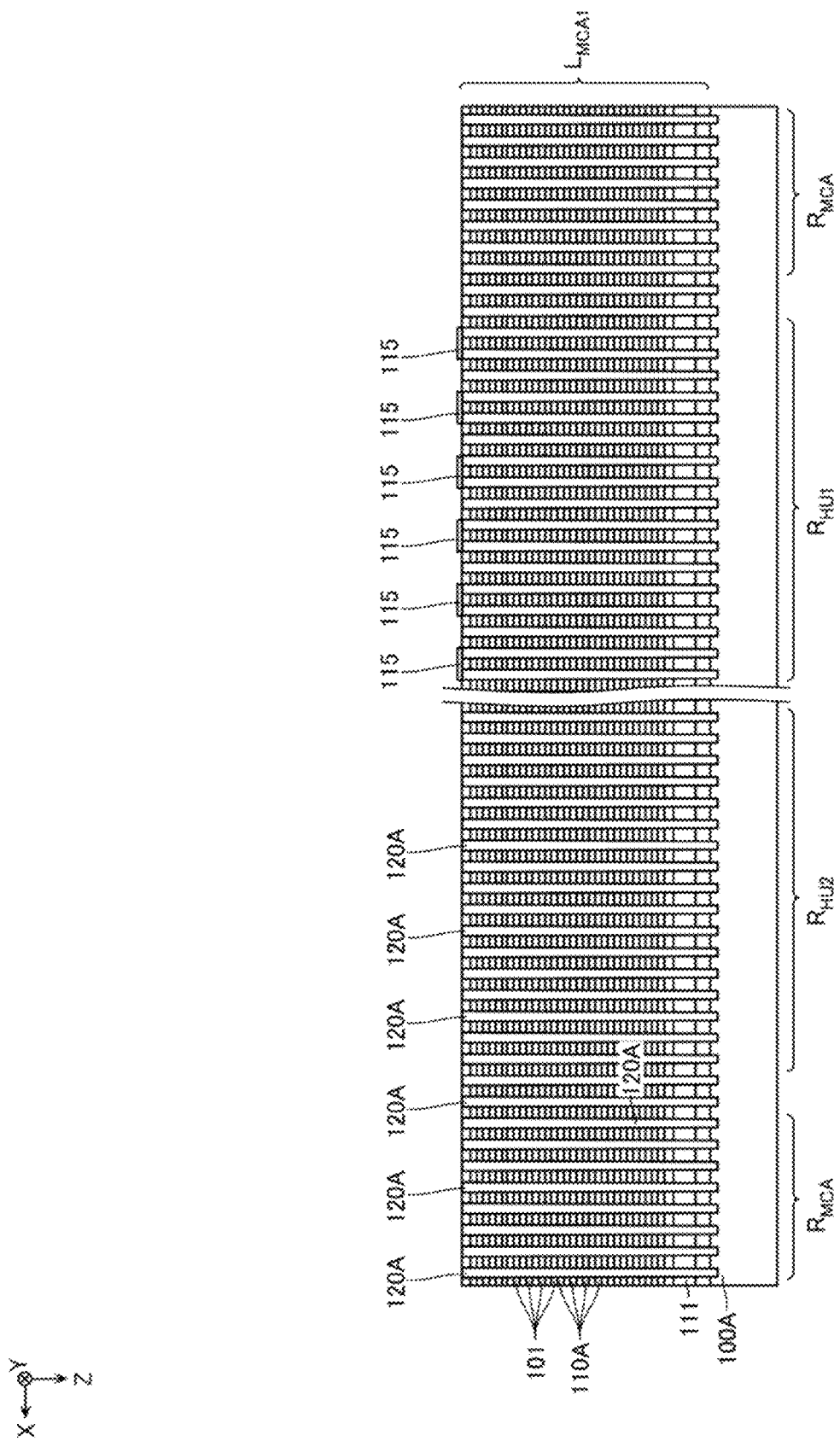

Subsequently, as shown in FIG. 18, insulating layers 115 are formed in locations of the upper surface of the structure described with reference to FIG. 17 which correspond to the contacts 161 (FIG. 4).

Figure 19:
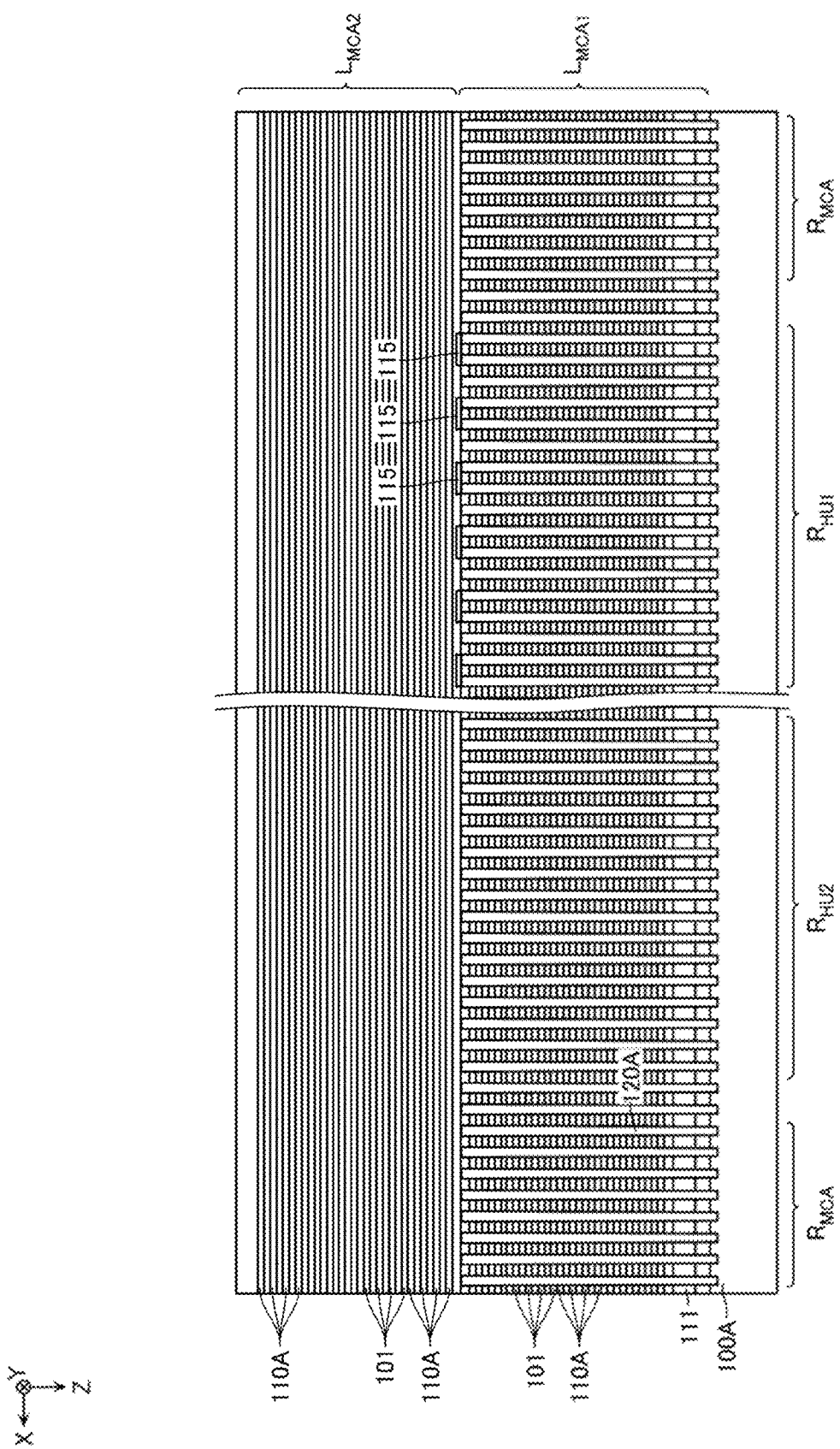

Subsequently, as shown in FIG. 19, a plurality of sacrificial layers 110A and insulating layers 101 are alternately formed on an upper surface of the insulating layer 101. This process is performed by, for example, a method such as CVD.

Figure 20:
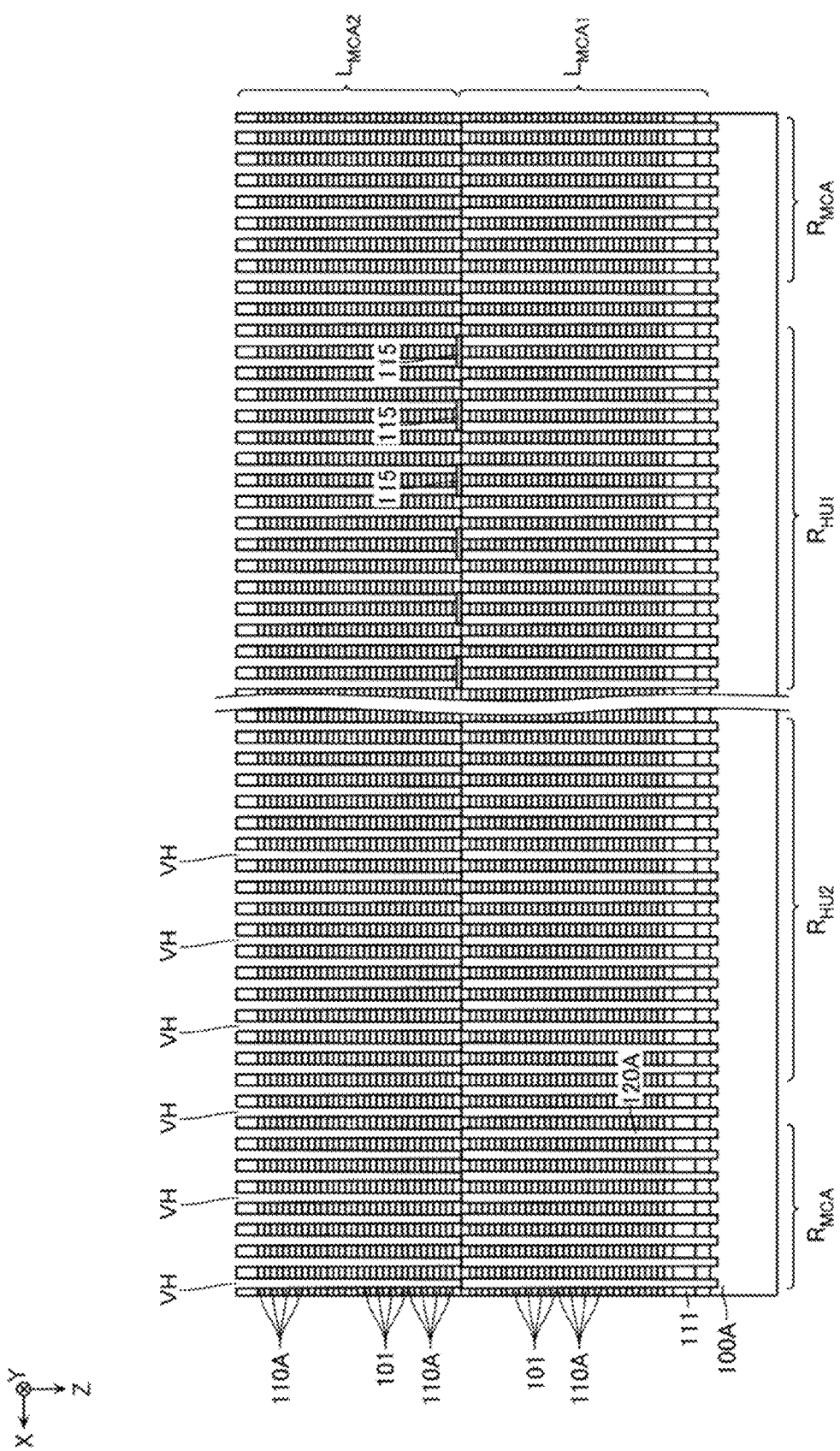

Subsequently, a plurality of via holes VH is formed as shown in FIG. 20. The via hole VH extends in the Z direction, penetrates the insulating layers 101 and the sacrificial layers 110A, and exposes upper ends of the sacrificial films 120A or upper surfaces of the insulating layers 115. This process is performed by, for example, a method such as RIE. The via holes VH are provided in locations corresponding to the semiconductor layers 120 (FIG. 4), locations corresponding to the support structures 153 (FIG. 4), locations corresponding to the contacts 161 (FIG. 4), and locations corresponding to the inter-block insulating layers 151 (FIG. 5).

Figure 21:
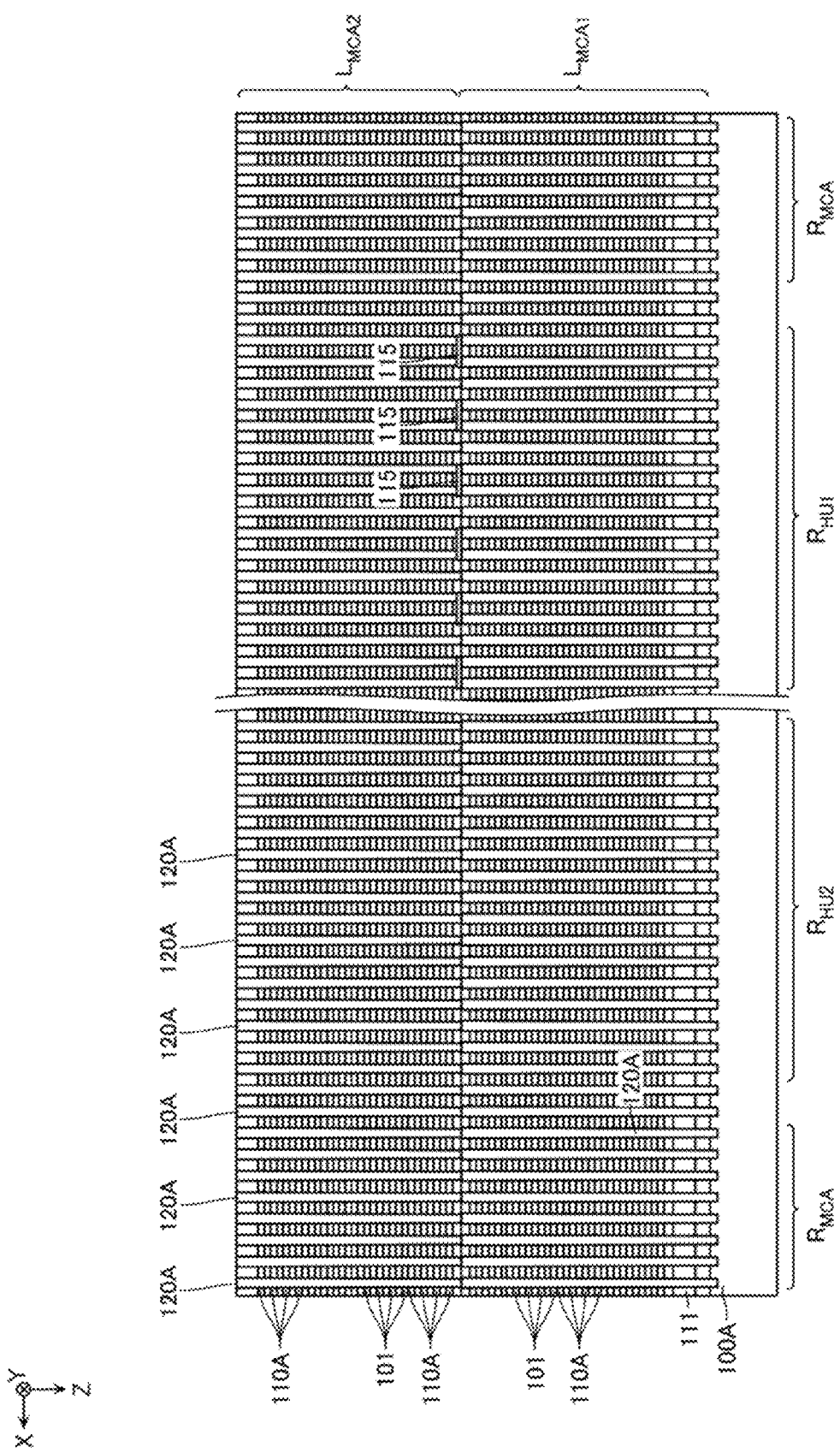

Subsequently, sacrificial films 120A are formed on inner peripheral surfaces of the via holes VH as shown in FIG. 21. This process is performed by, for example, a method such as CVD.

Figure 22:
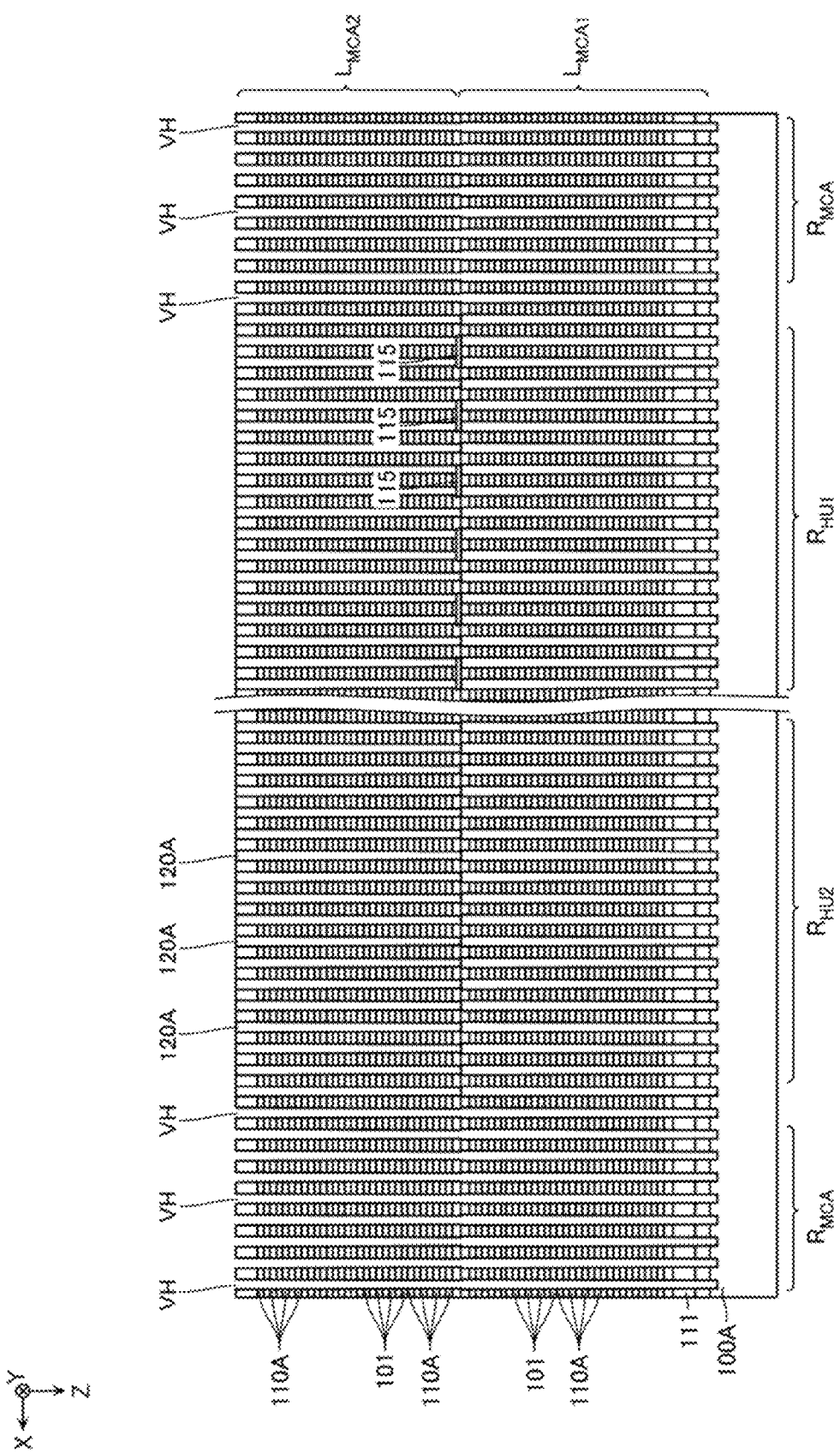

Subsequently, the sacrificial films 120A provided inside the via holes located in the memory cell array region $R_{MCA}$ among the plurality of via holes VH are removed as shown in FIG. 22. This process is performed, for example, by wet etching or the like.

Figure 23:
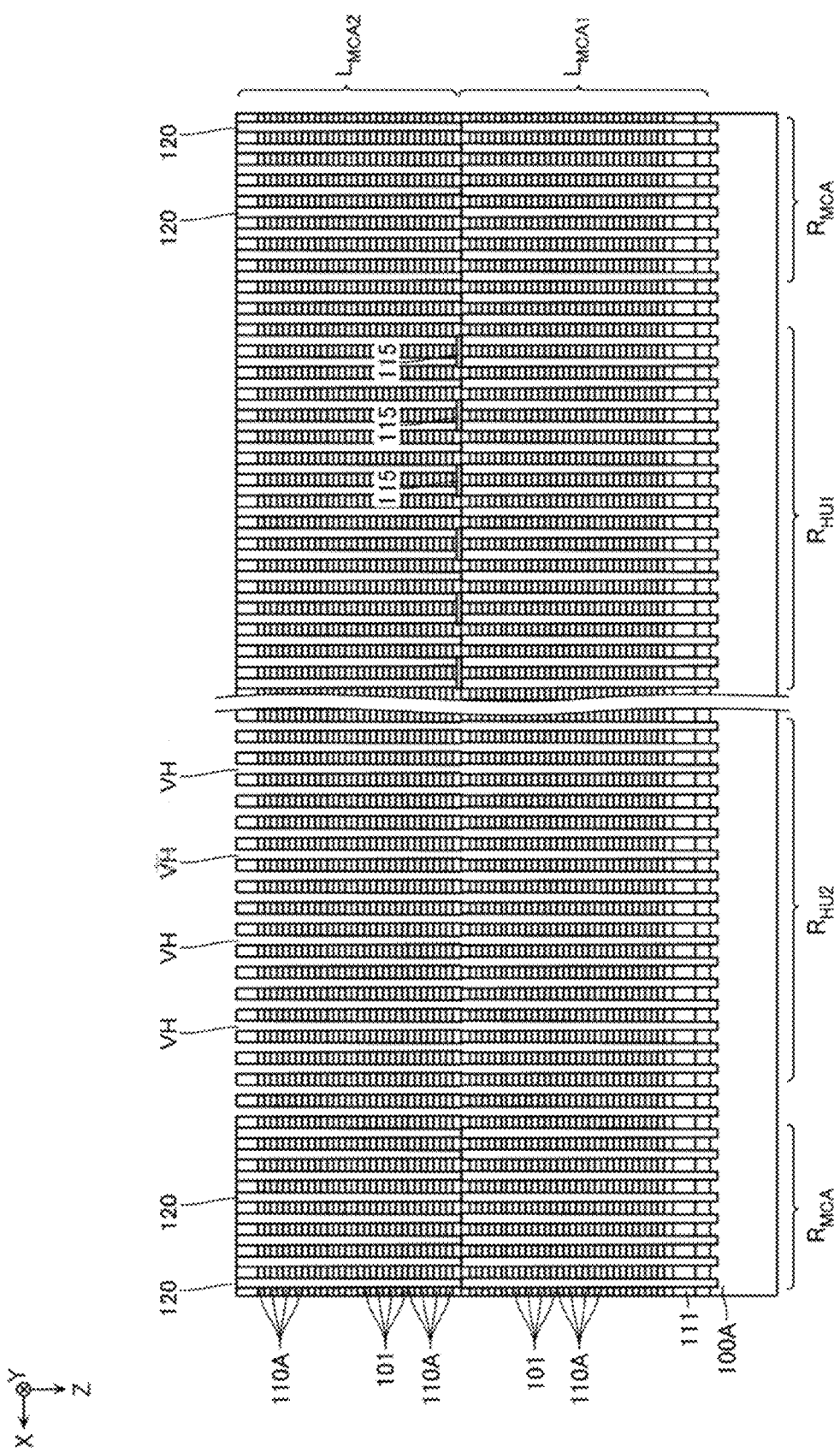

Subsequently, a semiconductor layer 120 or the like is formed inside the via hole VH as shown in FIG. 23. In this process, the semiconductor layers 120, the gate insulating films 130, the insulating layers 125, and the like described with reference to FIG. 8 are formed inside the via holes VH. In forming the semiconductor layers 120, film formation is performed by CVD or the like, and an amorphous silicon film is formed inside the via hole VH. A crystal structure of this amorphous silicon film can be modified by an annealing treatment or the like.

Subsequently, the sacrificial films 120A provided inside the via holes corresponding to the support structures 153 among the plurality of via holes VH are removed as shown in FIG. 23. This process is performed, for example, by wet etching or the like.

Figure 24:
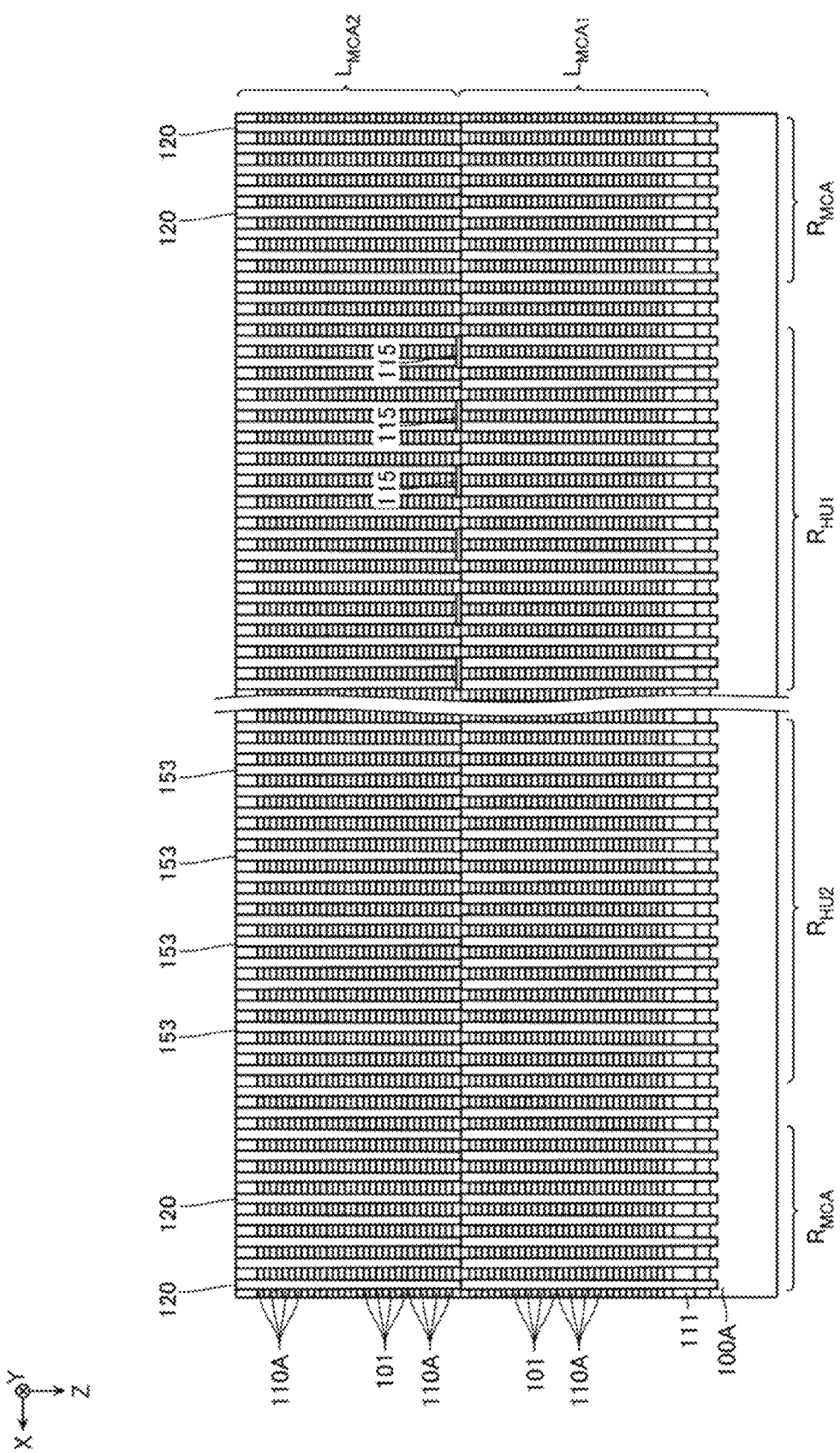

Subsequently, support structures 153 are formed inside the via holes VH as shown in FIG. 24. This process is performed by, for example, a method such as CVD.

Figure 25:
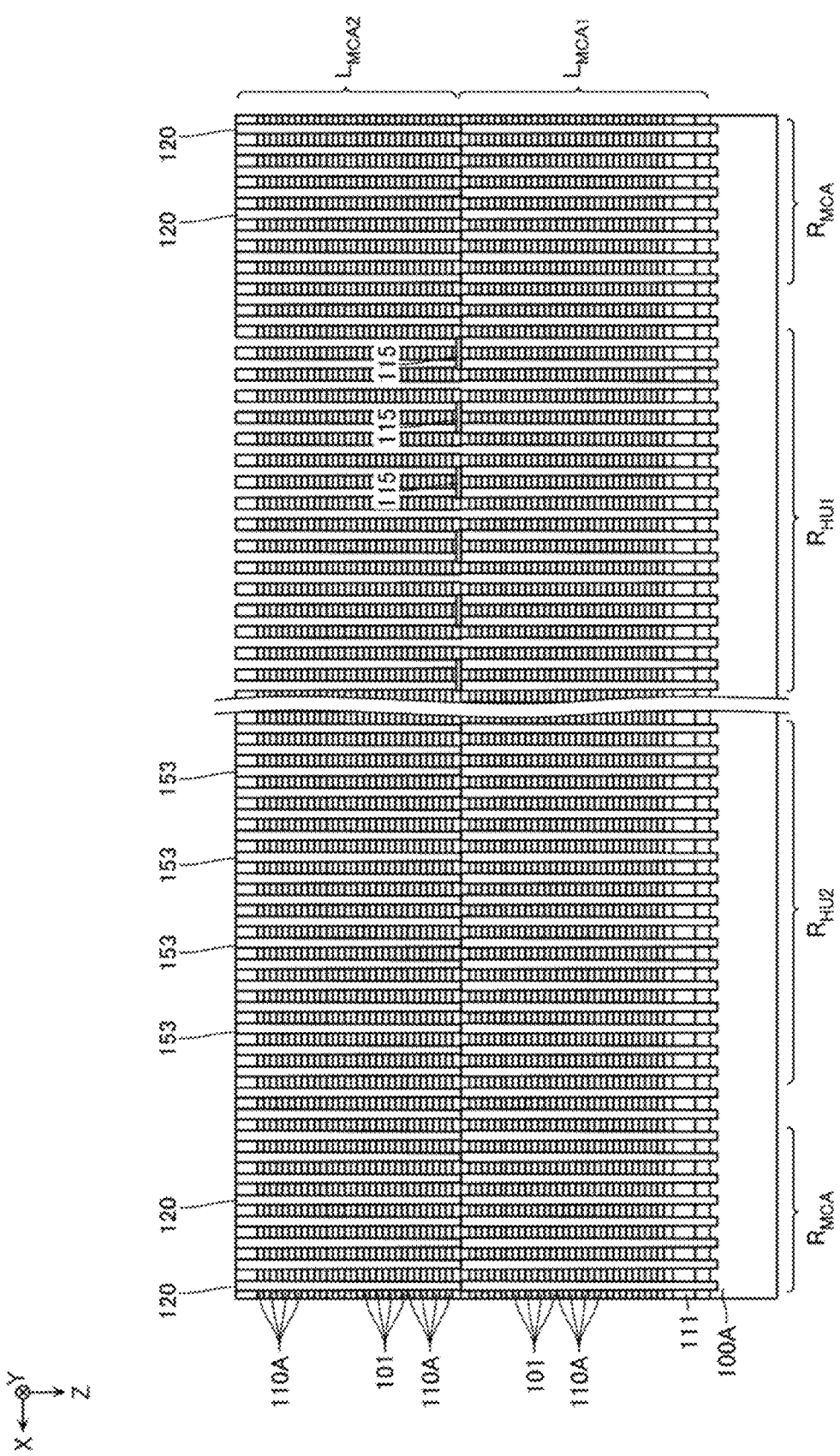
Figure 26:
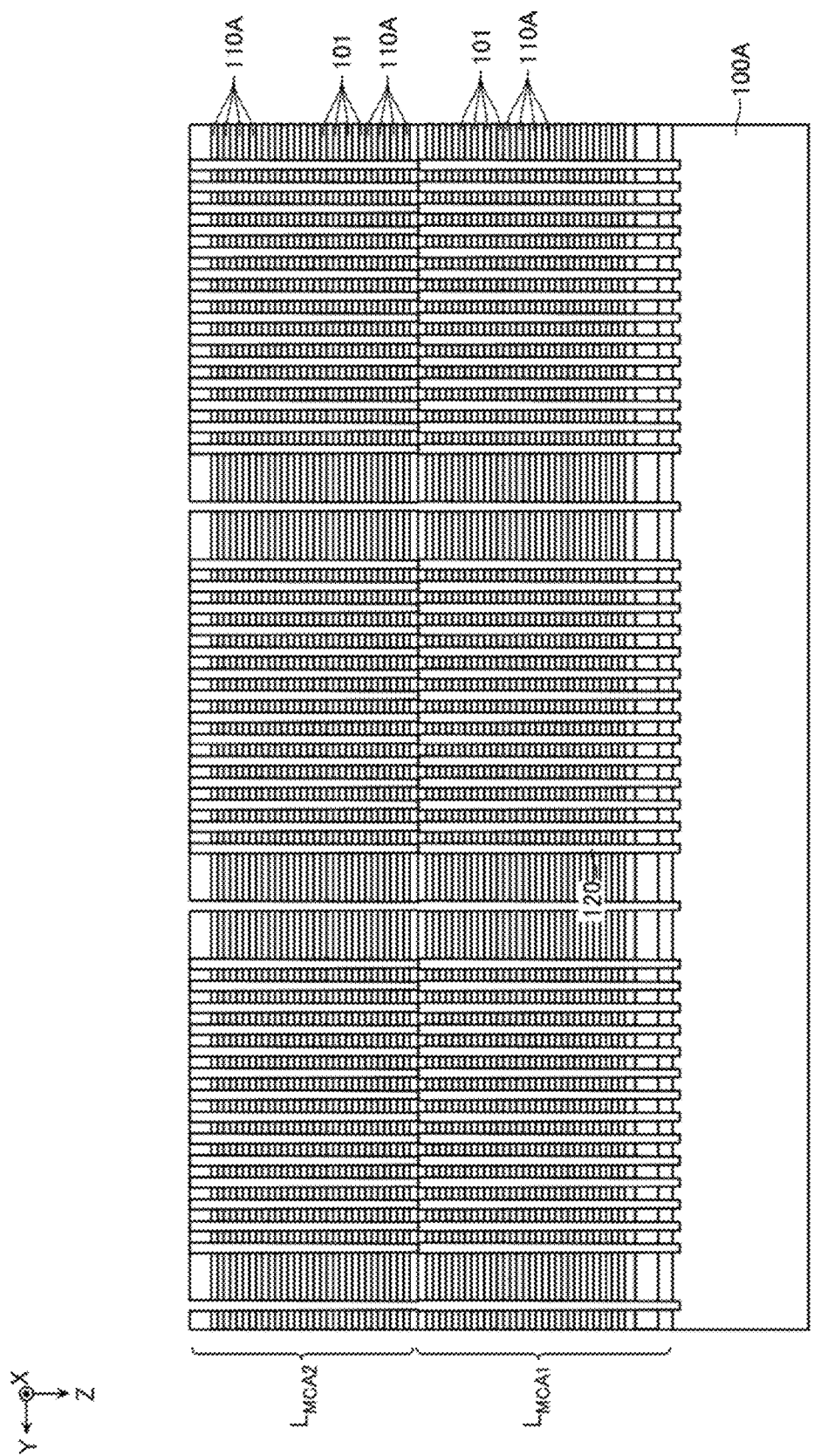

Subsequently, the sacrificial films 120A provided inside the via holes corresponding to the contacts 161 among the plurality of via holes VH are removed as shown in FIG. 25. For example, the sacrificial films 120A provided inside the via holes corresponding to the inter-block insulating layers 151 among the plurality of via holes VH are removed as shown in FIG. 26. This process is performed, for example, by wet etching or the like.

Figure 27:
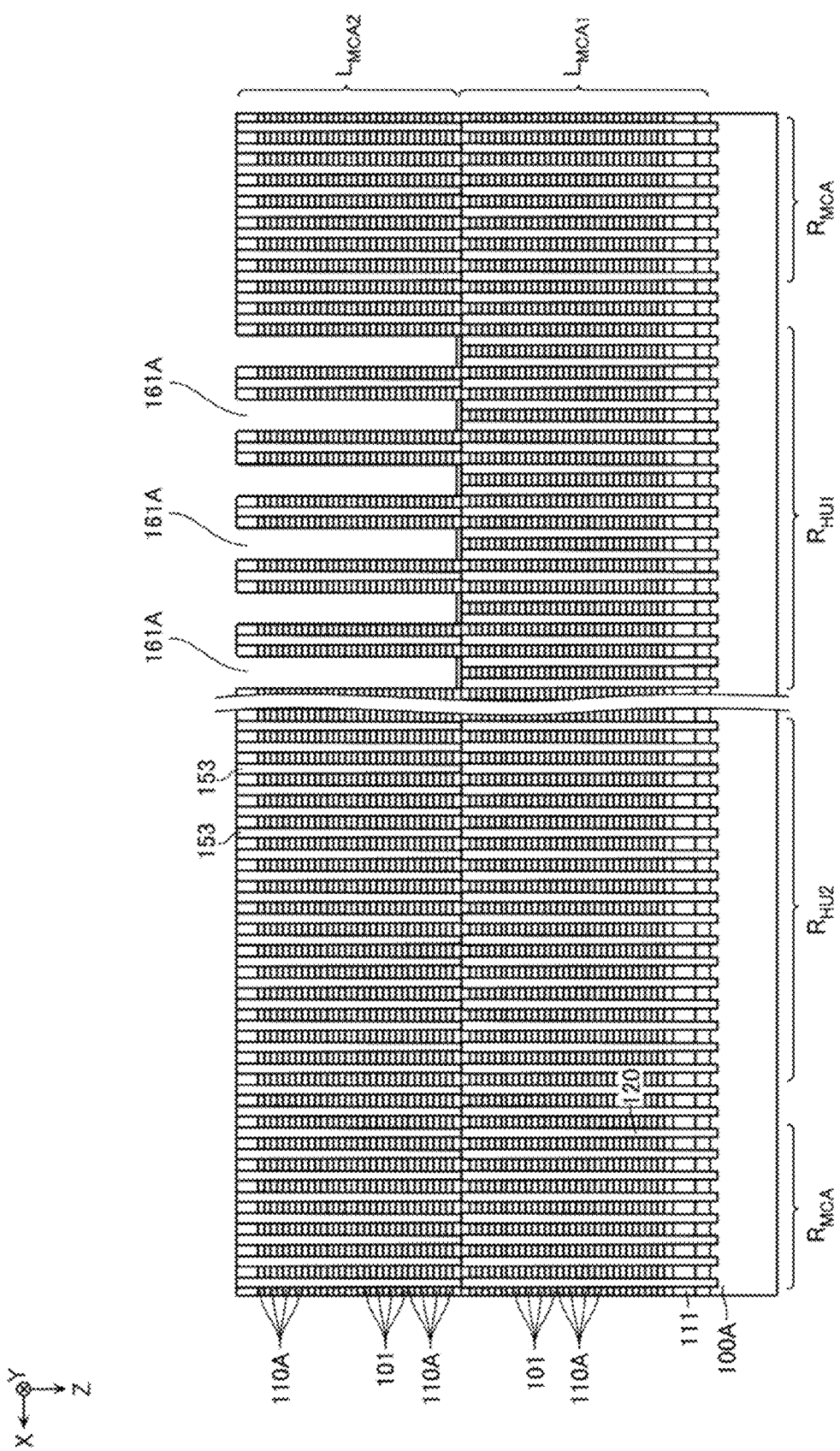
Figure 28:
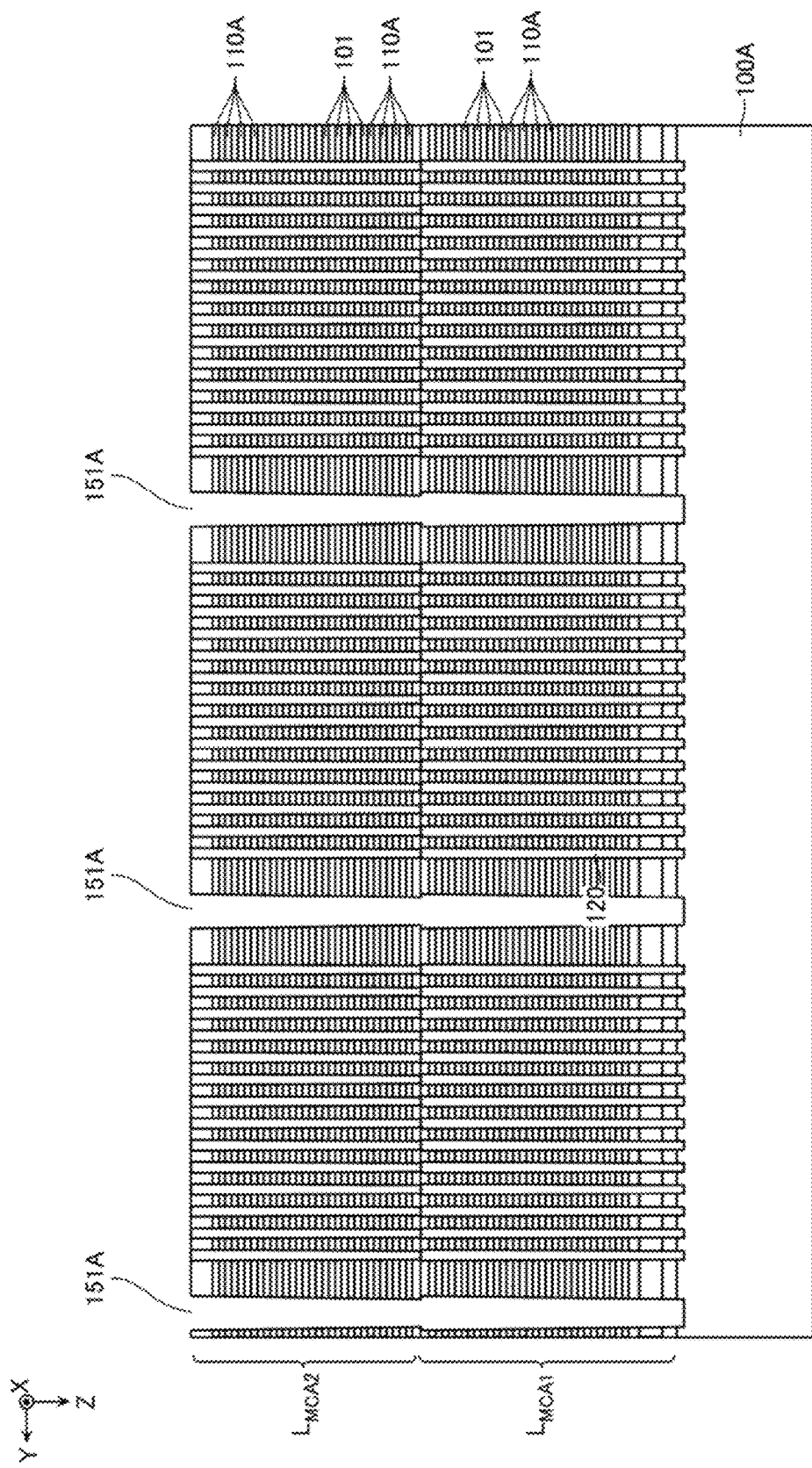

Subsequently, a part of the sacrificial layers 110A and the insulating layers 101 is removed as shown in FIGS. 27 and 28. This process is performed, for example, by wet etching or the like. As a result, a diameter of the via hole VH increases. For example, the via holes VH aligned in the X direction and the Y direction are connected to each other, and through via holes 161A are formed as shown in FIG. 29. For example, the plurality of via holes VH aligned in the X direction are joined to each other, and grooves 151A extending in the X direction are formed as shown in FIG. 30.

Figure 31:
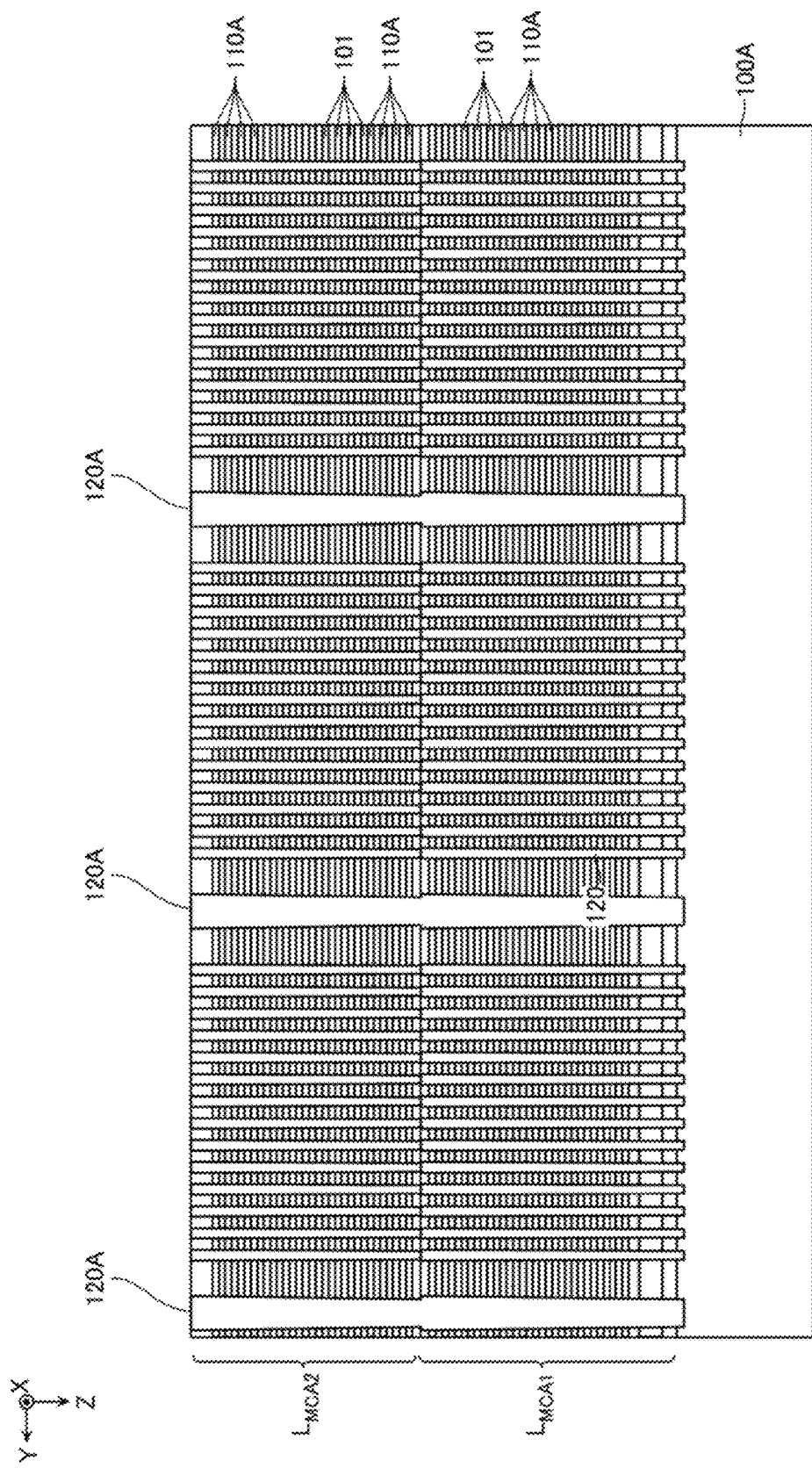

Subsequently, sacrificial films 120A are formed on inner peripheral surfaces of the grooves 151A as shown in FIG. 31. This process is performed by, for example, a method such as CVD.

Subsequently, a plurality of contact holes 163A (FIG. 38) is formed as shown in FIGS. 32 to 38. The contact holes 163A are through via holes provided so as to correspond to all the sacrificial layers 110A in the memory cell array layers $L_{MCA1}$ and $L_{MCA2}$ by penetrating the plurality of sacrificial layers 110A and the insulating layers 101.

Figure 32:
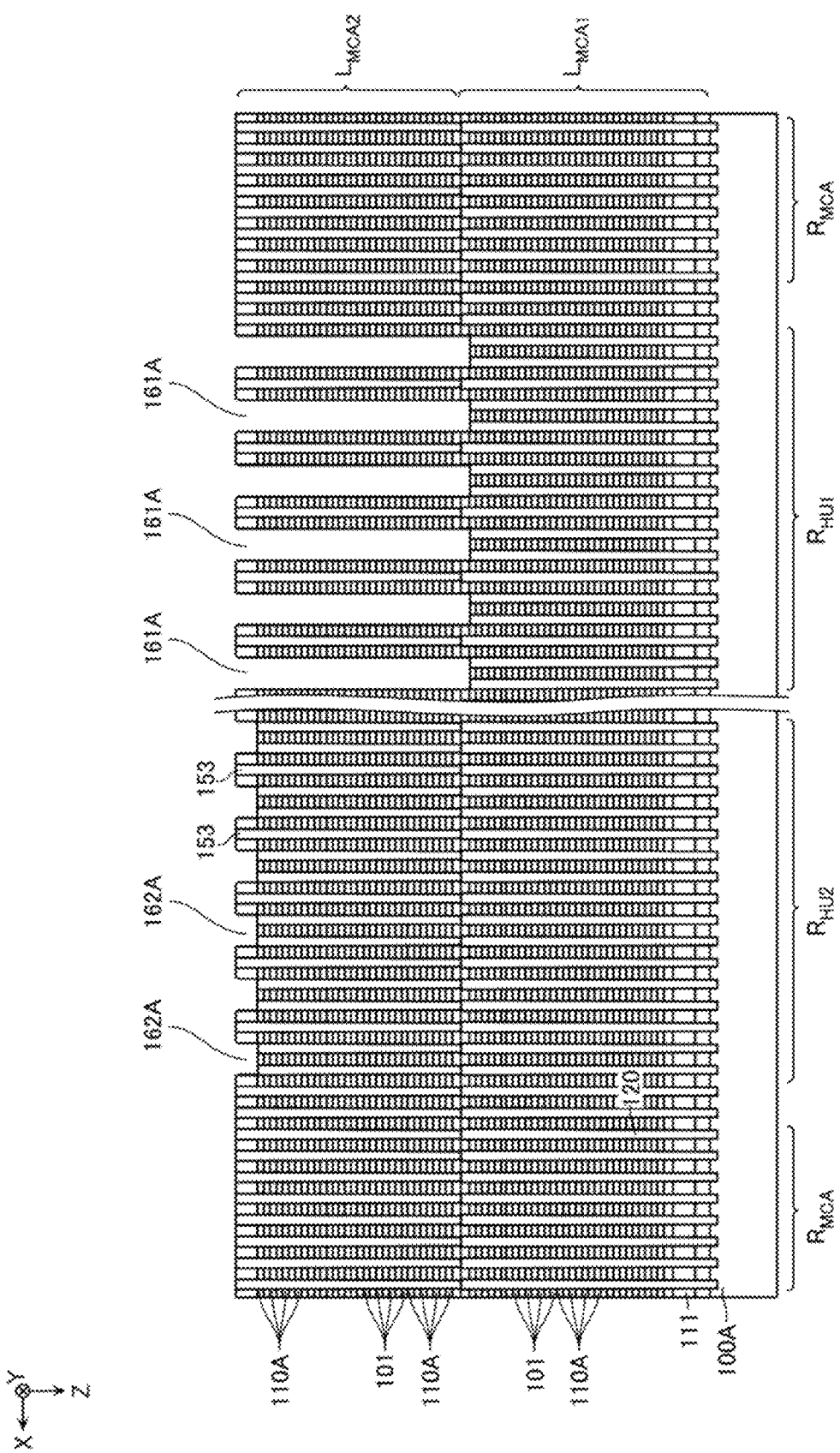

In this process, the insulating layer 115 (see FIG. 27) provided on bottom surfaces of the through via holes 161A and a part of the plurality of support structures 153 are removed as shown in FIG. 32. A plurality of through via holes 162A is formed in the second hook-up region $R_{HU2}$.

Subsequently, a hard mask and a resist are formed on an upper surface of the structure shown in FIG. 32. The hard mask and the resist are patterned to expose a part of the plurality of through via holes 161A and 162A and cover the other configuration. The material loss rate of hard mask due to an etching process is preferably smaller than a material loss rate of the resist such that at least a residual film of the hard mask remains even after a plurality of resist patterning and etching processes. Materials containing carbon (C), boron (B), nitrogen (N), metal, and the like are preferably used as a material of the hard mask. Subsequently, one insulating layer 101 exposed on the bottom surfaces of the plurality of through via holes 161A and 162A is selectively removed, and one sacrificial layer 110A is selectively removed. As a result, the upper surface of the insulating layer 101 directly below the sacrificial layer is exposed. This process is performed by, for example, RIE. In this process, the support structure 153 and the resist (not shown) in the through via holes 161A and 162A are also removed.

Figure 33:
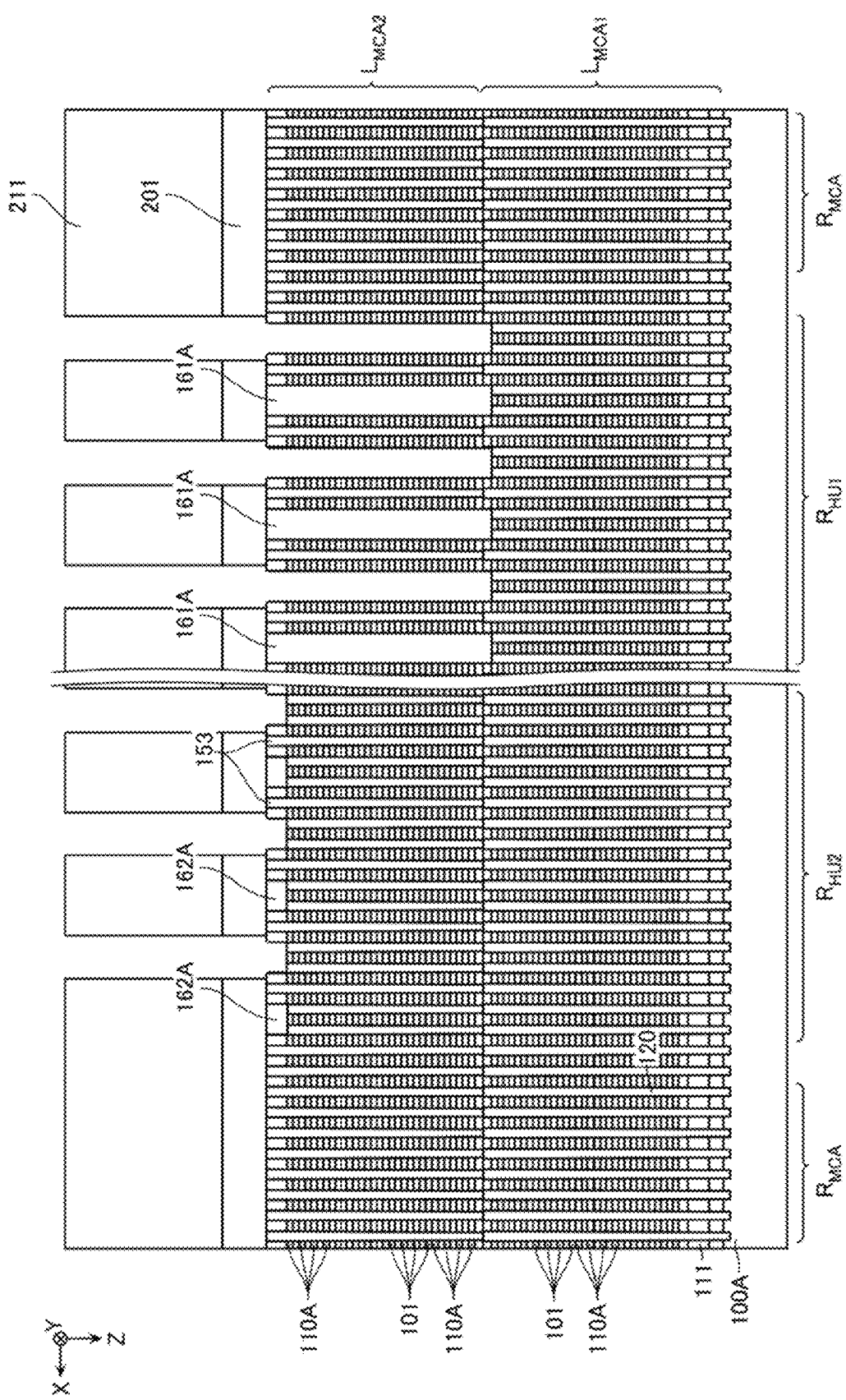

Subsequently, the hard mask formed on an upper surface of this structure is removed, and a hard mask 201 and a resist 211 are newly formed as shown in FIG. 33. The hard mask 201 and the resist 211 expose a part of the plurality of through via holes 161A and 162A and cover the other configuration. A part of the resist 211 may enter the insides of the through via holes 161A and 162A covered by the resist 211.

Figure 34:
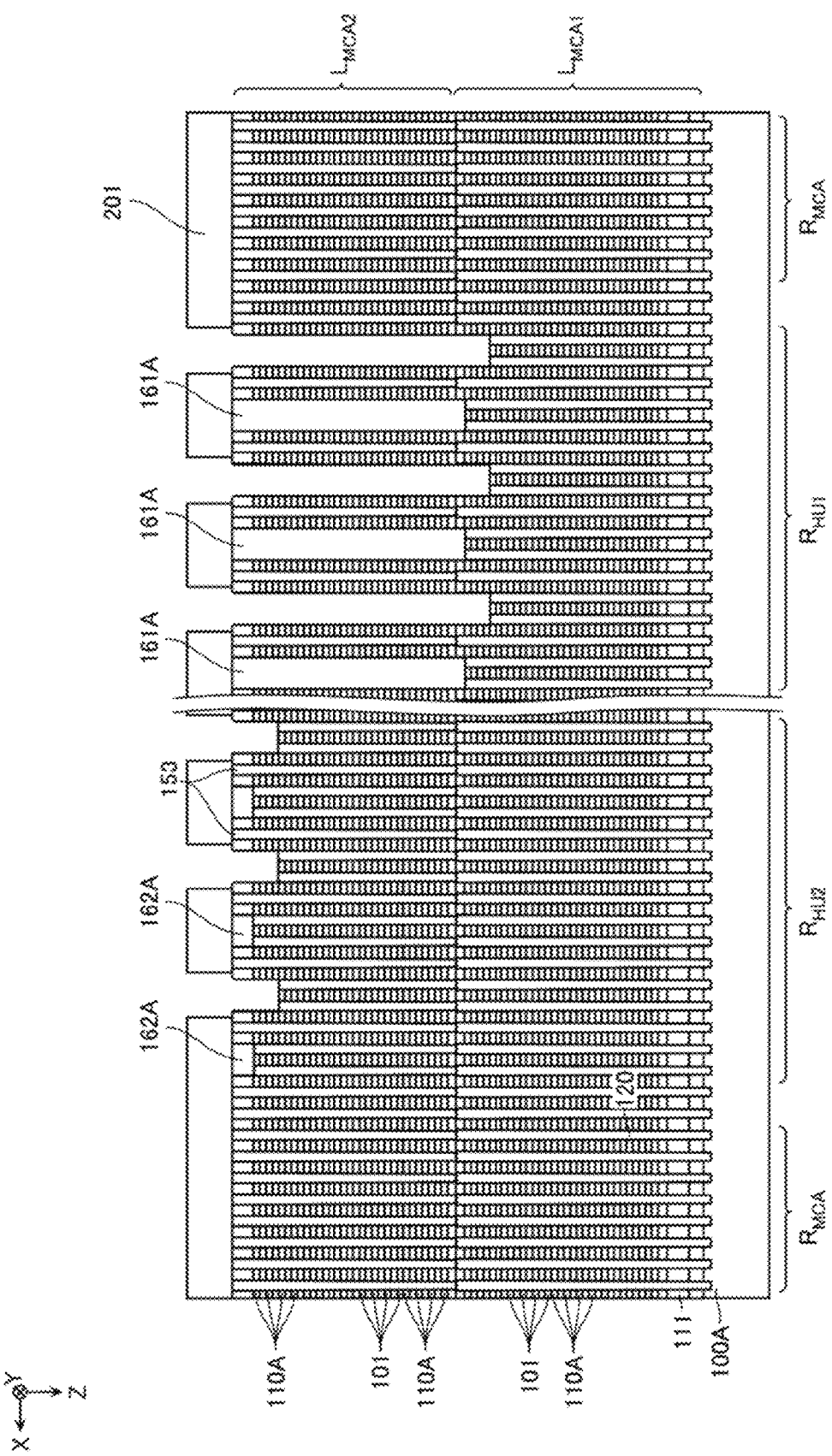

Subsequently, two insulating layers 101 and two sacrificial layers 110A counted from the insulating layer 101 closest to the bottom surfaces of the plurality of through via holes 161A and 162A are selectively removed, and an upper surface of the third insulating layer 101 is exposed as shown in FIG. 34. In this process, the support structures 153 and the resist 211 in the through via holes 161A and 162A are also removed.

Figure 35:
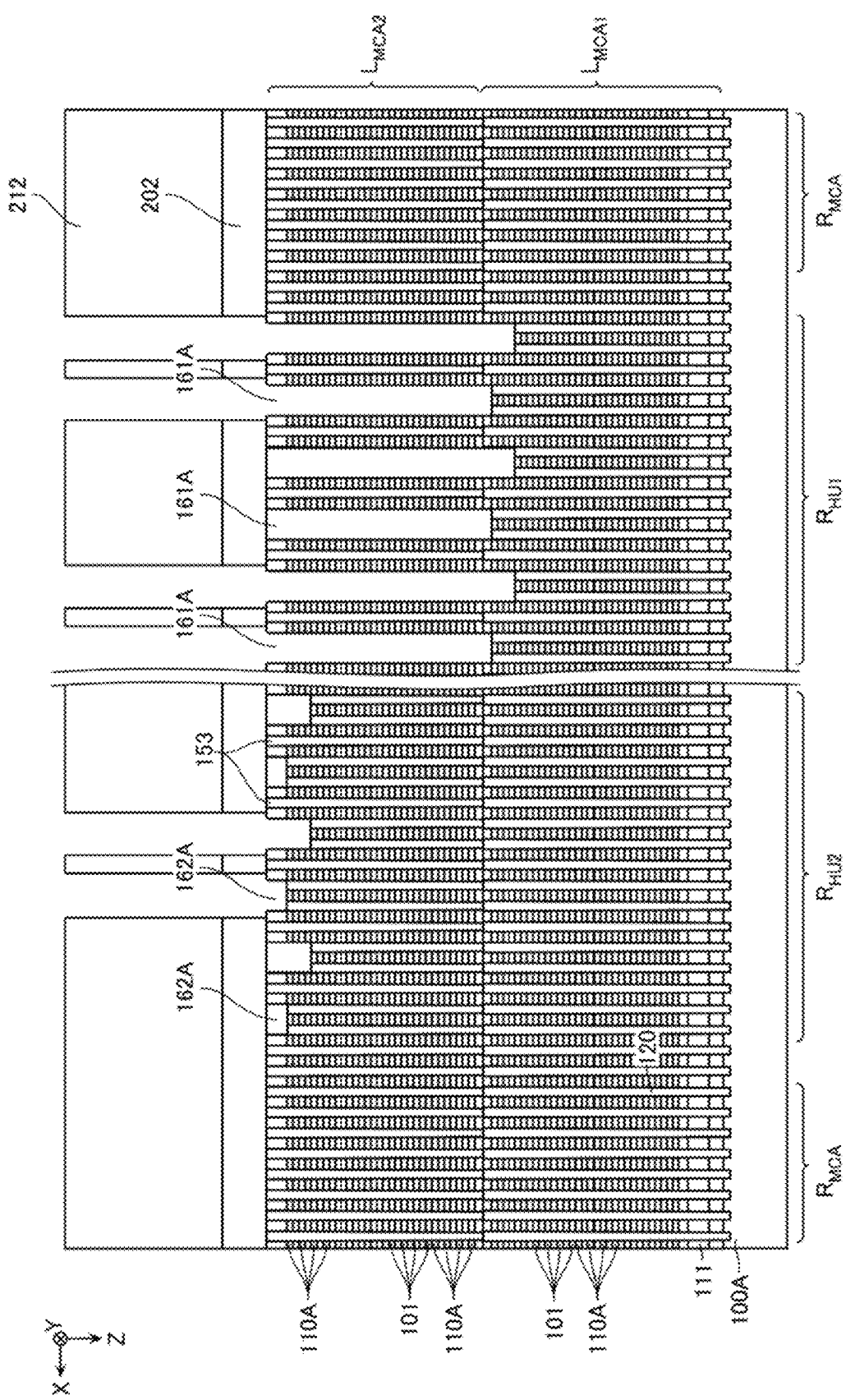

Subsequently, the hard mask 201 formed on an upper surface of this structure is removed, and a hard mask 202 and a resist 212 are newly formed as shown in FIG. 35. The hard mask 202 and the resist 212 expose a part of the plurality of through via holes 161A and 162A and cover the other configuration. A part of the resist 212 may enter the insides of the through via holes 161A and 162A covered by the resist 212.

Figure 36:
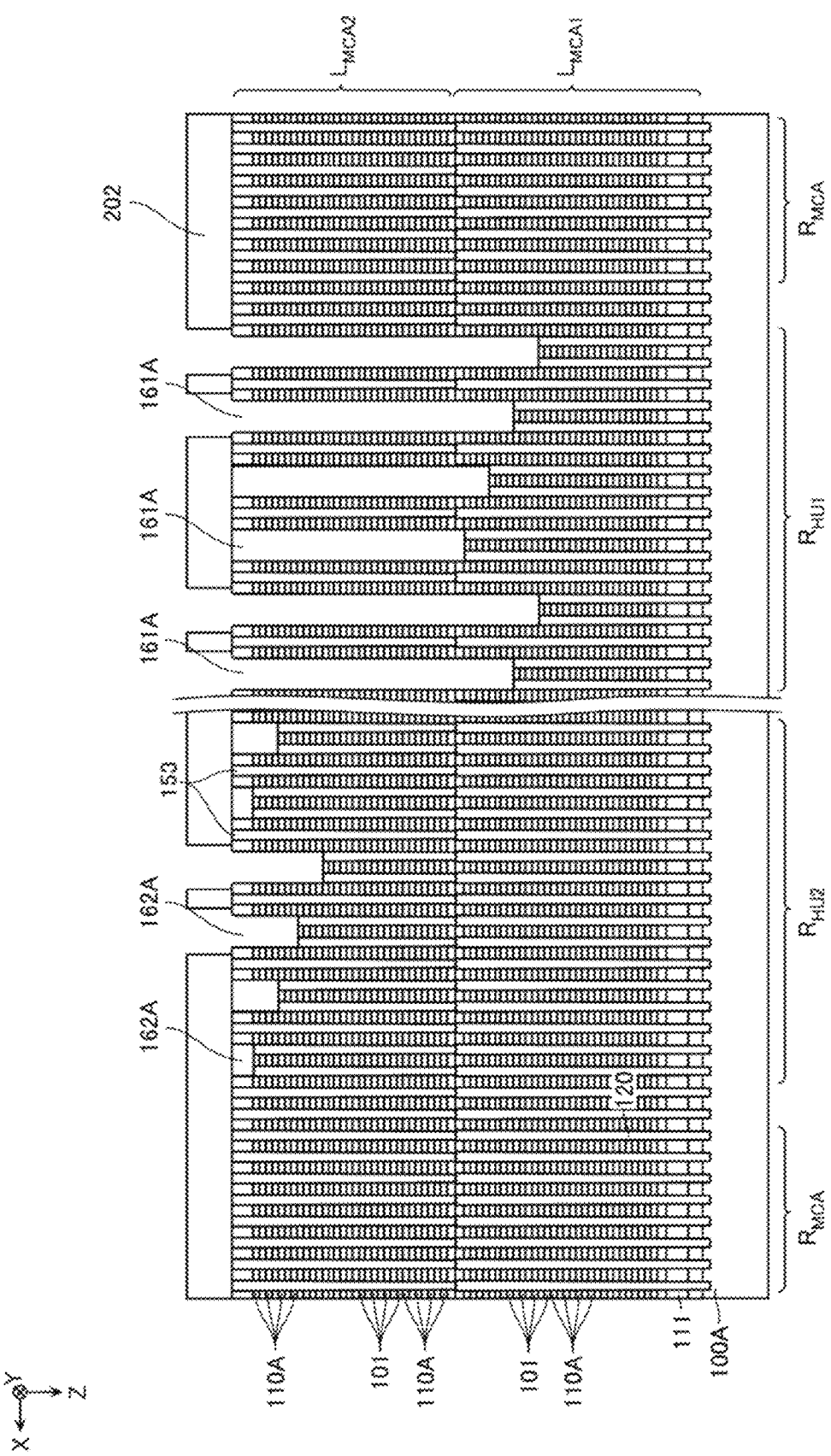

Subsequently, four insulating layers 101 and four sacrificial layers 110A, as counted from the insulating layer 101 closest to the bottom surfaces of the plurality of through via holes 161A and 162A, are selectively removed, and an upper surface of the fifth insulating layer 101 is exposed as shown in FIG. 36. In this process, the support structures 153 and the resist 212 in the through via holes 161A and 162A are also removed. The number of insulating layers 101 and sacrificial layers 110A removed in this process is not limited to four.

Figure 37:
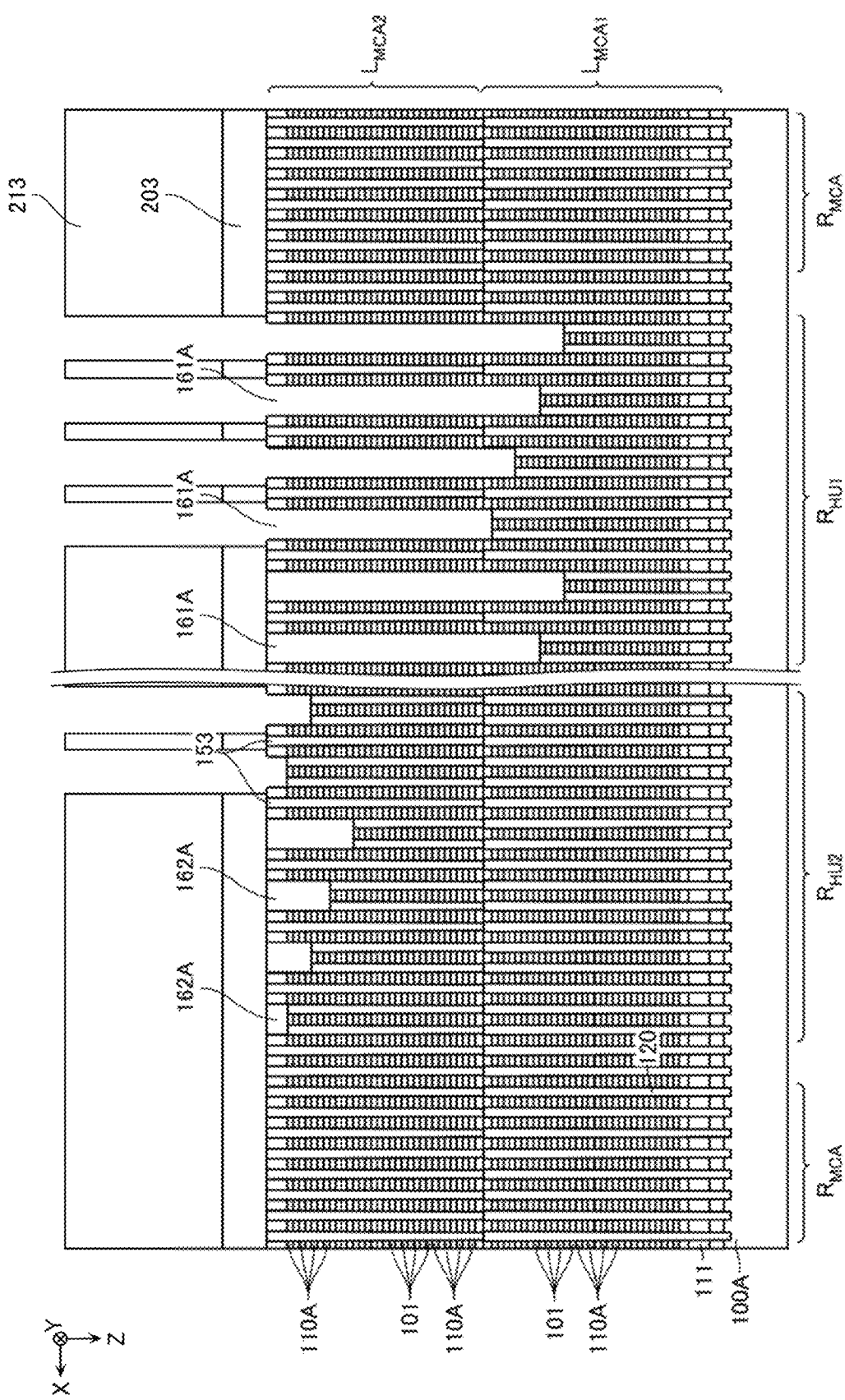
Figure 38:
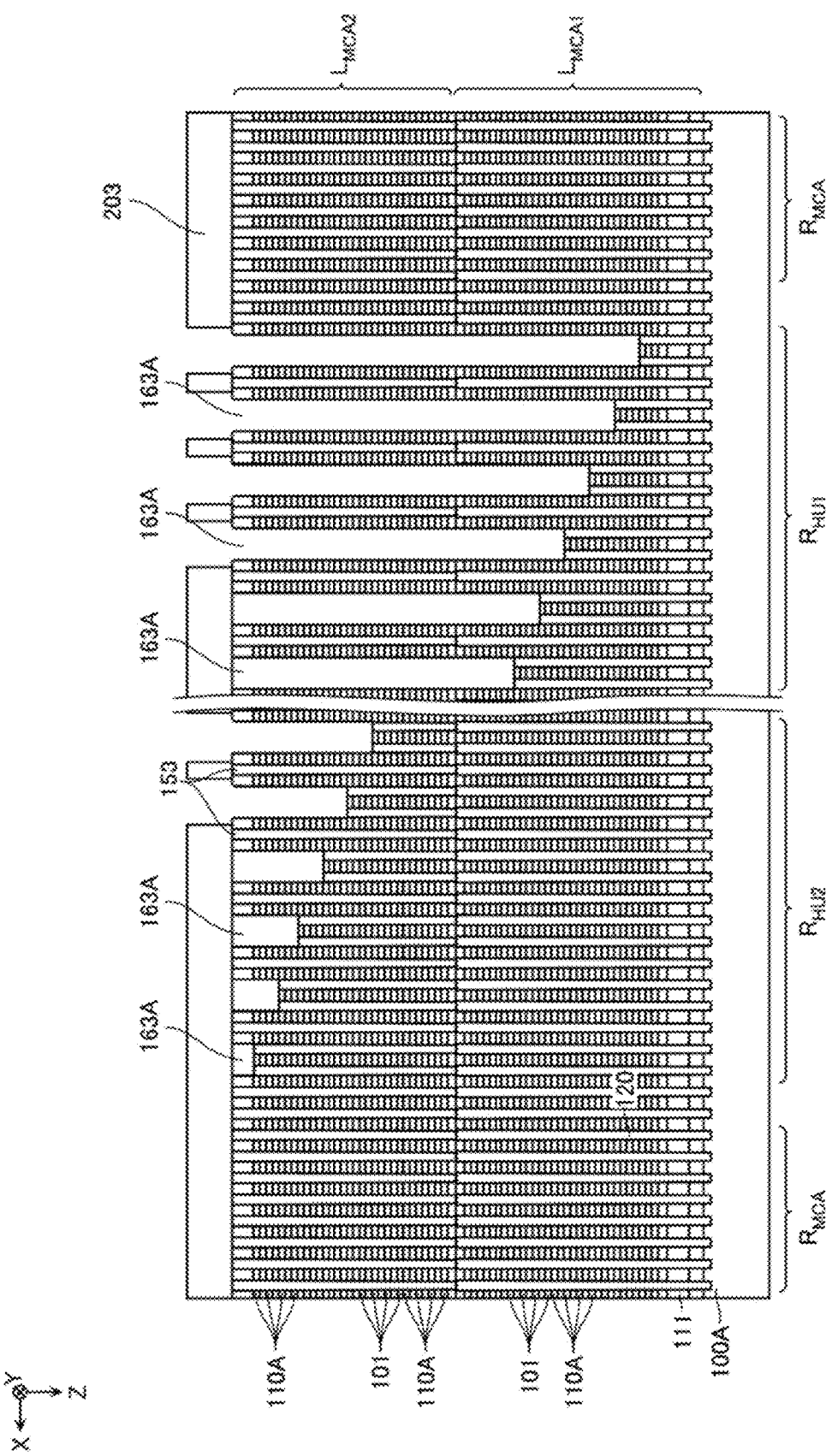

Similarly, a part of the plurality of through via holes 161A and 162A is exposed on the wafer, and a hard mask and a resist covering the other configuration are formed (see FIG. 37). Further, $2^n$ (n is a natural number) insulating layers 101 and $2^n$ sacrificial layers 110A counted from the insulating layer 101 closest to the bottom surfaces of the plurality of through via holes 161A and 162A are selectively removed, and an upper surface of the ($2^n$+1)-th insulating layer 101 is exposed (see FIG. 38). As a result, for example, a plurality of contact holes 163A is formed as shown in FIG. 38.

Figure 39:
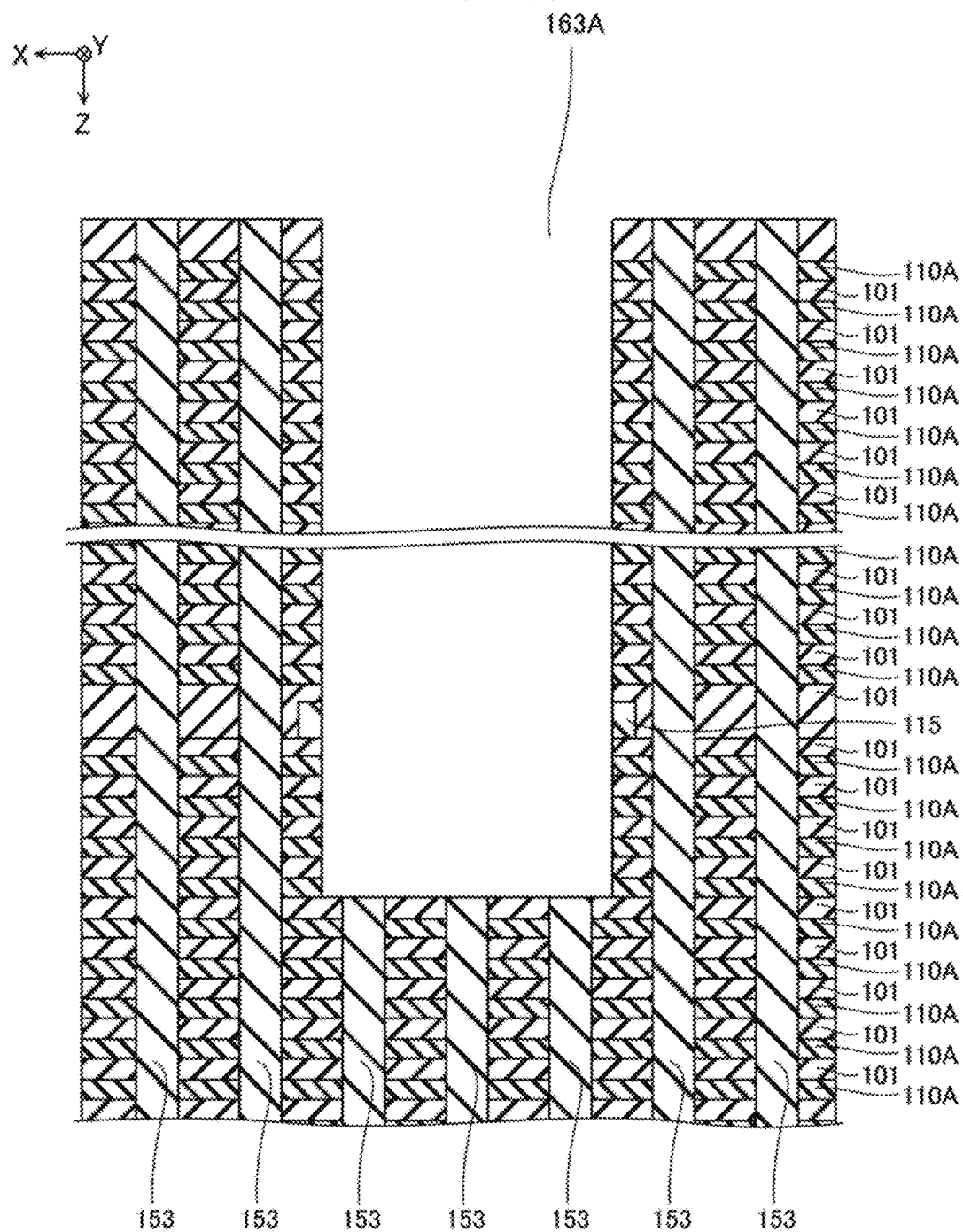
Figure 40:
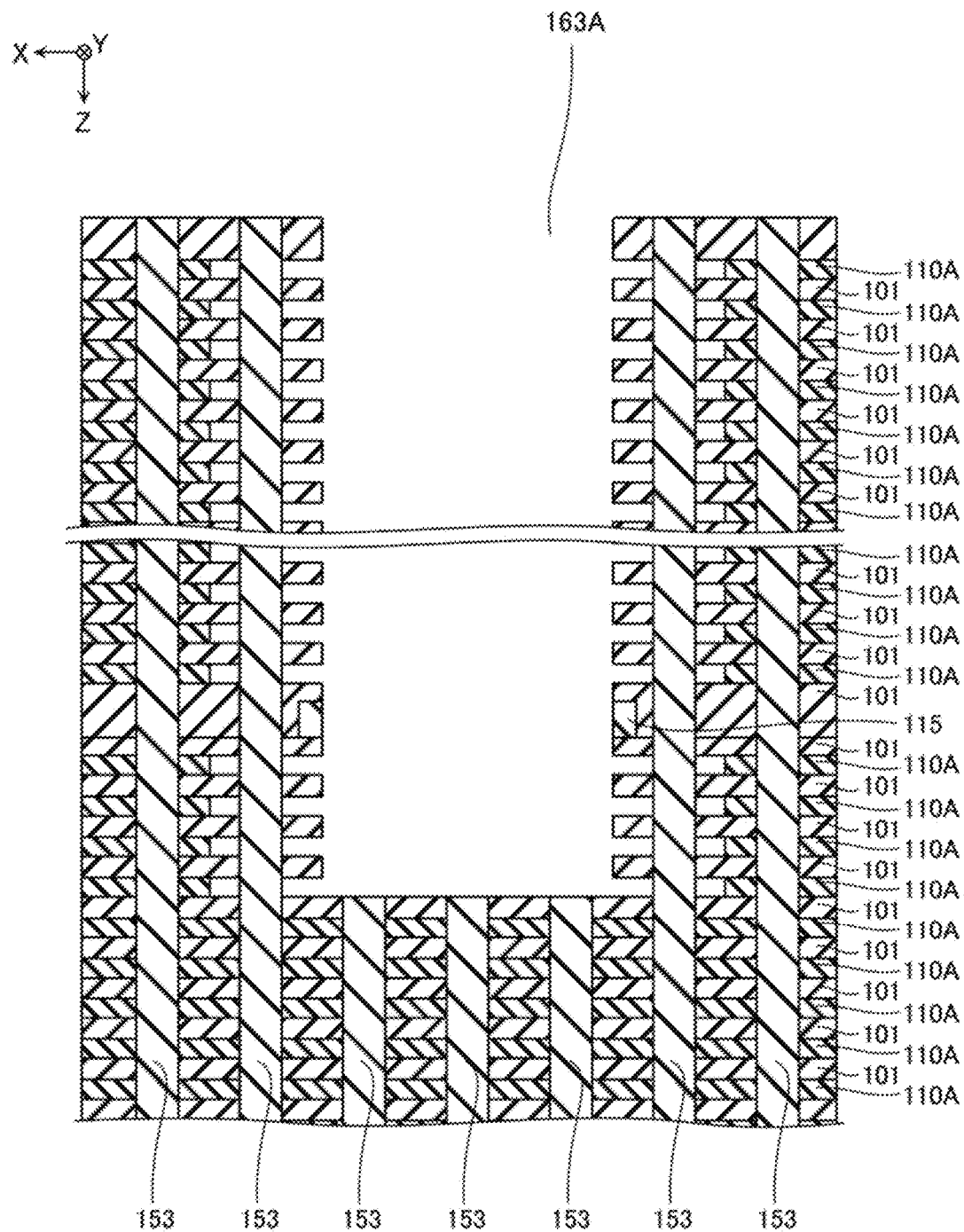

Subsequently, a part of the sacrificial layers 110A is removed as shown in FIGS. 39 and 40. This process is performed, for example, by wet etching or the like.

Figure 41:
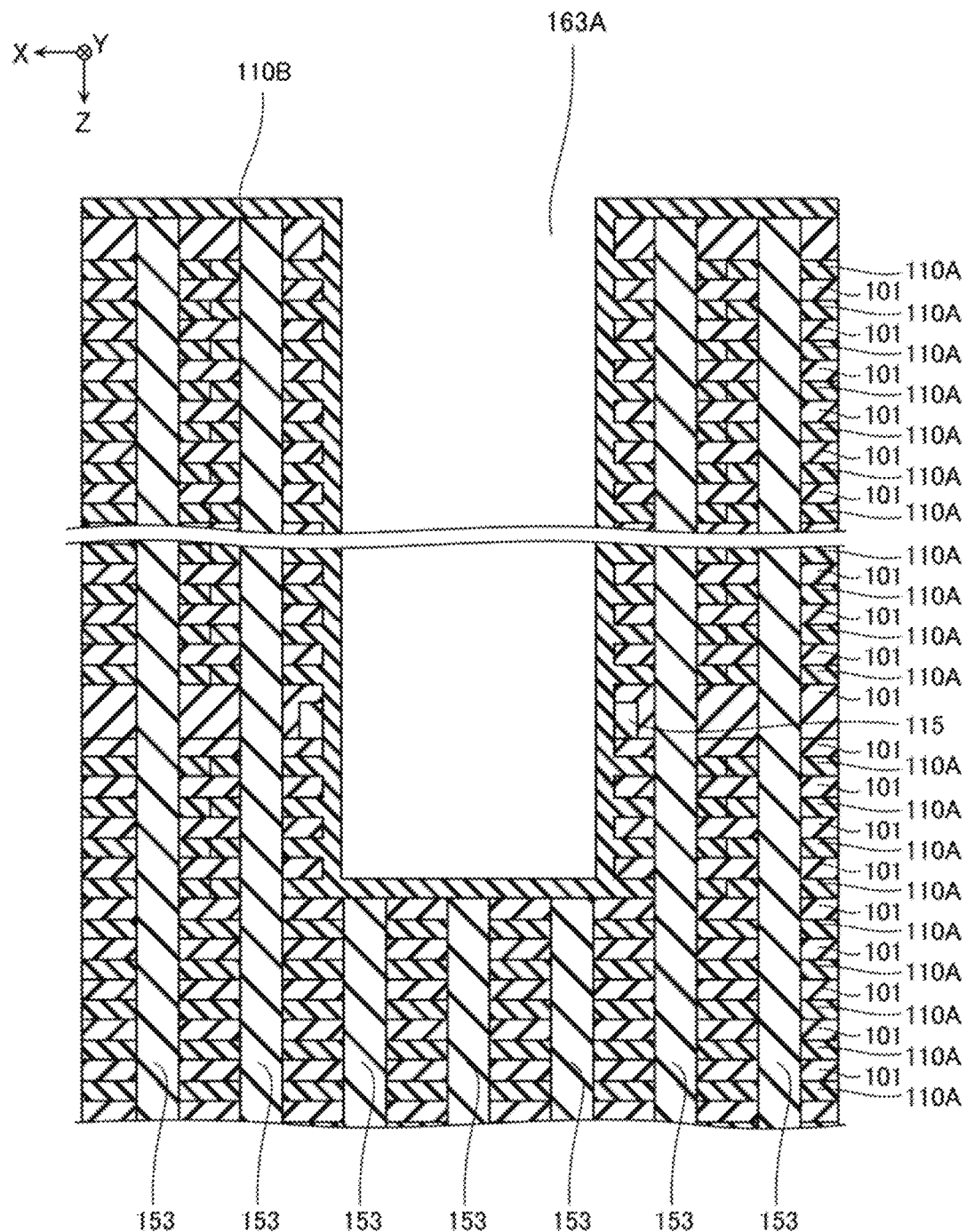

Subsequently, an insulating layer 110B is formed on an upper surface of the uppermost insulating layer 101 and the inner peripheral surfaces of the via holes VH as shown in FIG. 41. The insulating layer 110B is formed to be thin to some extent that the via hole VH is not buried. This process is performed by, for example, a method such as CVD.

Figure 42:
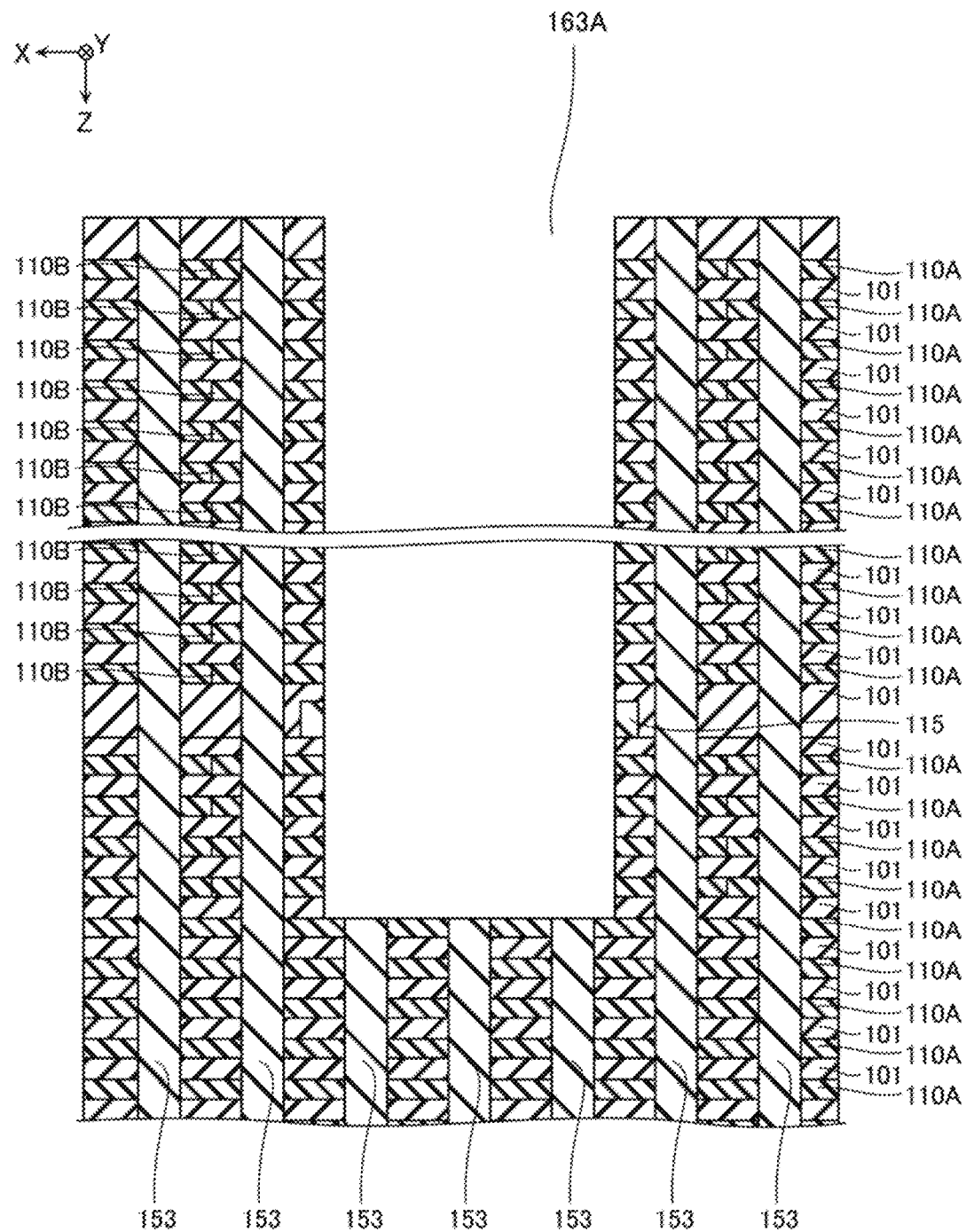

Subsequently, a portion provided on the upper surface of the uppermost insulating layer 101, a portion provided on a side surface of the insulating layer 101, and a portion provided on the bottom surface of the contact hole 163A are removed from the insulating layer 110B as shown in FIG. 42. This process is performed, for example, by wet etching or the like.

Figure 43:
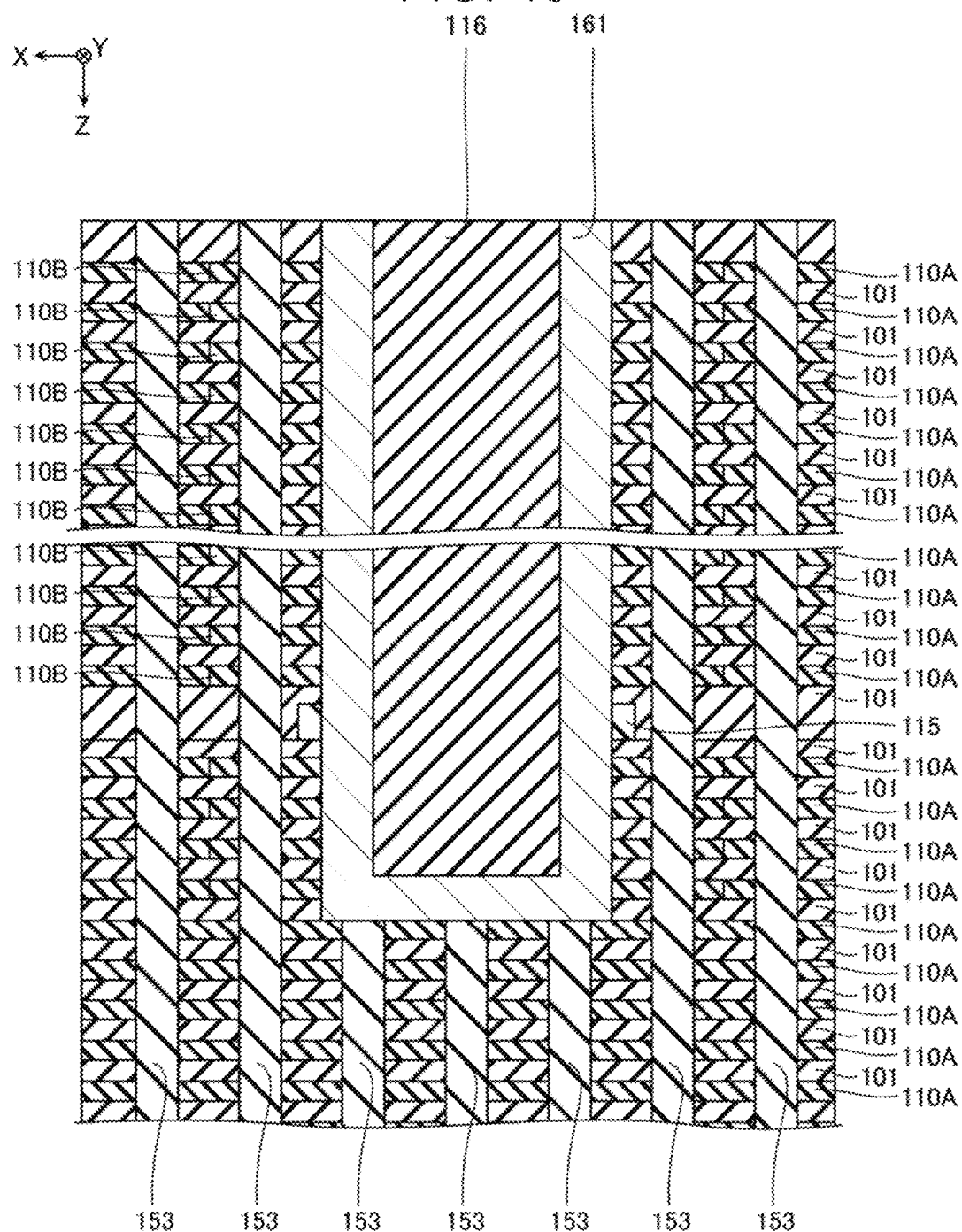

Subsequently, a contact 161 or a contact 162 is formed inside the contact hole 163A as shown in FIG. 43. An insulating layer 116 is formed inside the contacts 161 and 162. This process is performed by, for example, a method such as CVD.

Figure 44:
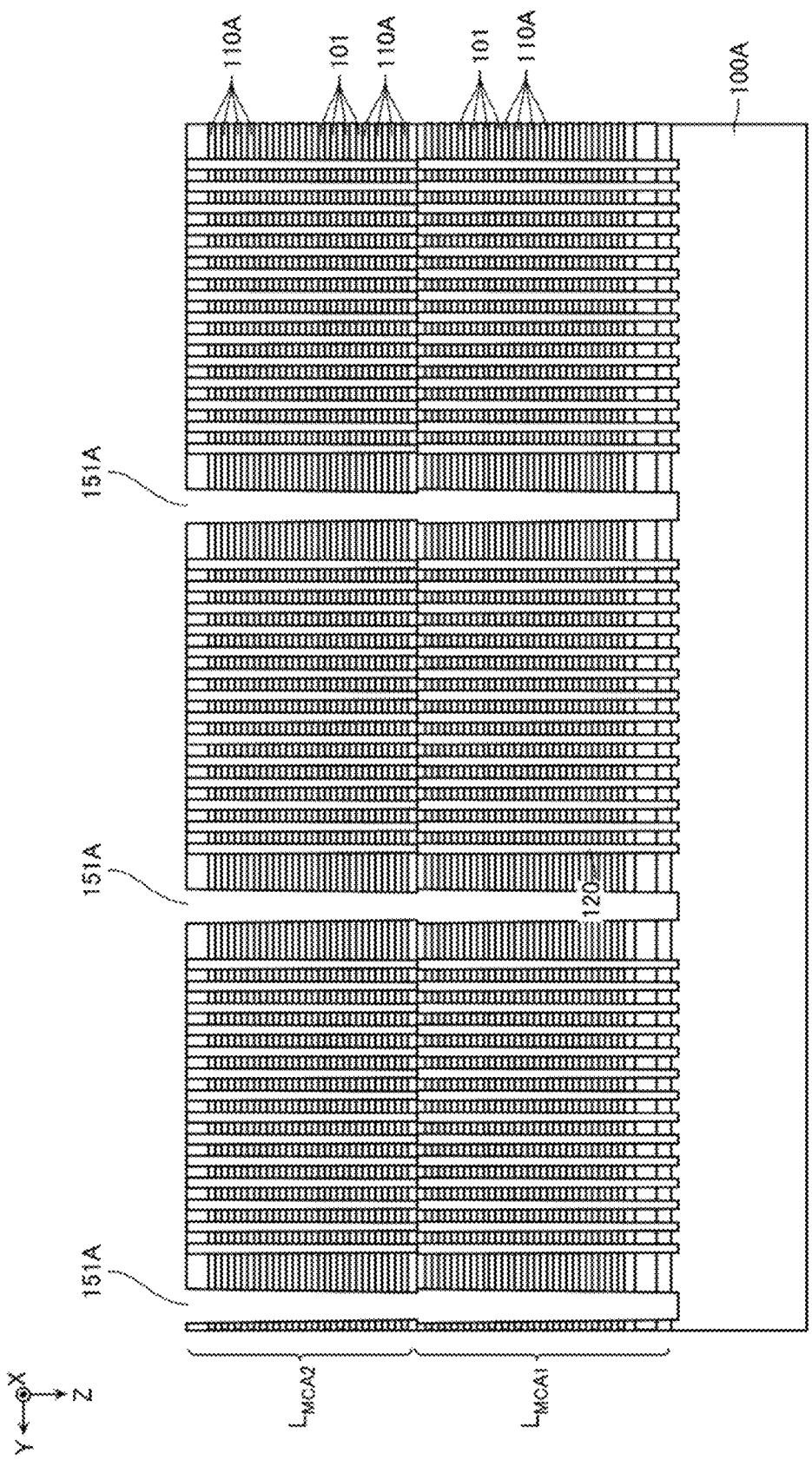

Subsequently, the sacrificial film 120A provided inside the grooves 151A is removed as shown in FIG. 44. This process is performed, for example, by wet etching or the like.

Figure 45:
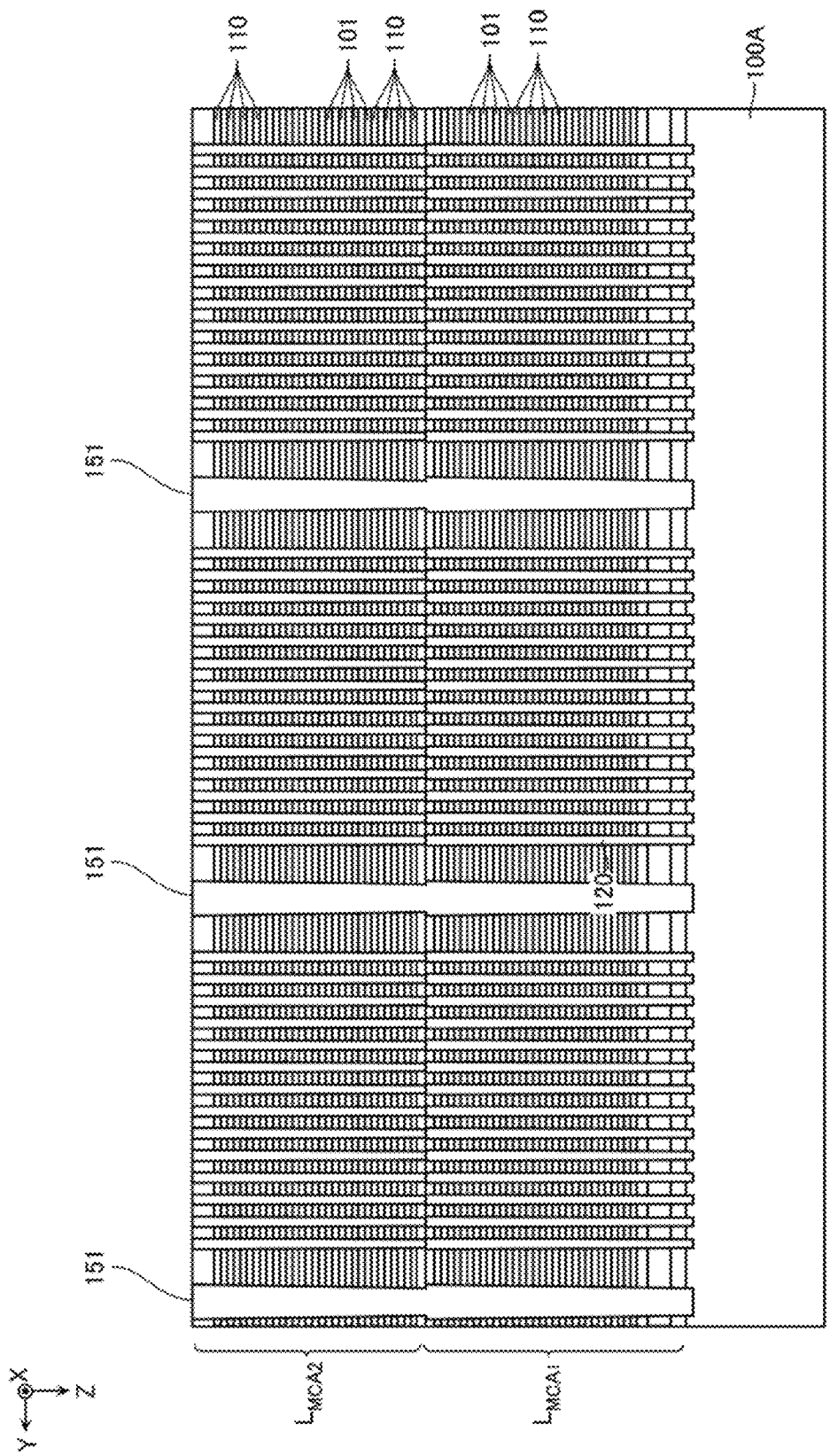

Subsequently, the semiconductor layer 113 described with reference to FIG. 8 is formed via the grooves 151A. This process is performed, for example, by wet etching, selective CVD, or the like. Subsequently, the sacrificial layer 110A is removed via the grooves 151A. This process is performed by, for example, a method such as wet etching. For example, a conductive layer 110 is formed via the grooves 151A as shown in FIG. 45. This process is performed by, for example, a method such as CVD. Inter-block insulating layers 151 are formed in the grooves 151A. This process is performed by, for example, methods such as CVD and RIE.

Figure 46:
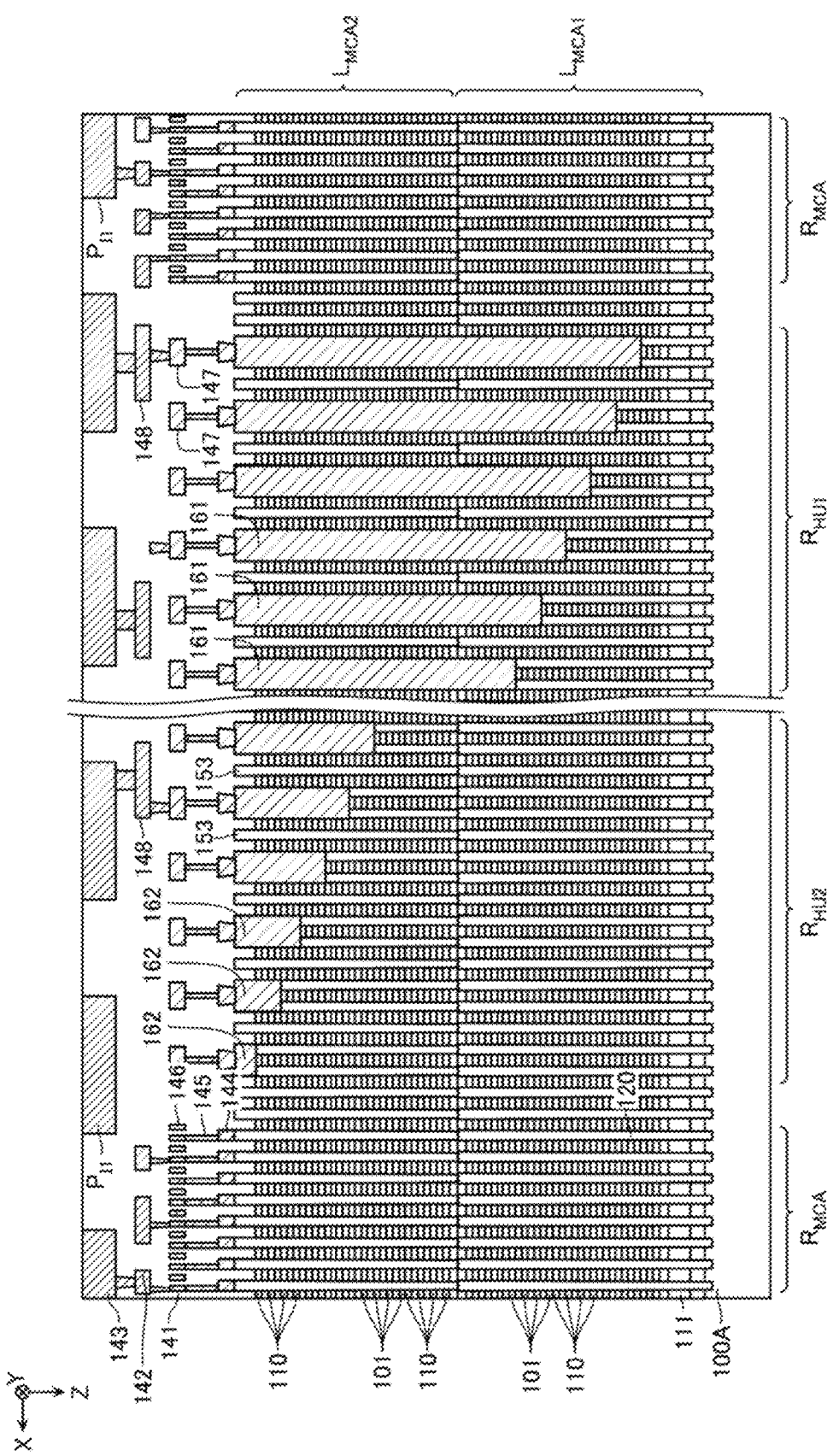

Subsequently, configurations such as the interconnection layers 141, 142, and 143 and contacts or the like connected to the interconnection layers are formed, and a configuration corresponding to the chip $C_M$ is formed as shown in FIG. 46.

Thereafter, the semiconductor wafer 100A on which the configuration corresponding to the chip $C_M$ has been formed and the semiconductor wafer on which the configuration corresponding to the chip $C_P$ has been formed are bonded to each other. A rear surface of the semiconductor wafer 100A is polished to remove a part of the semiconductor wafer 100A. The external pad electrodes $P_X$ (FIG. 1) or the like are formed on the rear surface of the semiconductor wafer 100A. Subsequently, the semiconductor wafer is separated into pieces by dicing. As a result, the configuration described with reference to FIGS. 1 to 13 is formed.

FIRST MODIFICATION EXAMPLE

Figure 47:
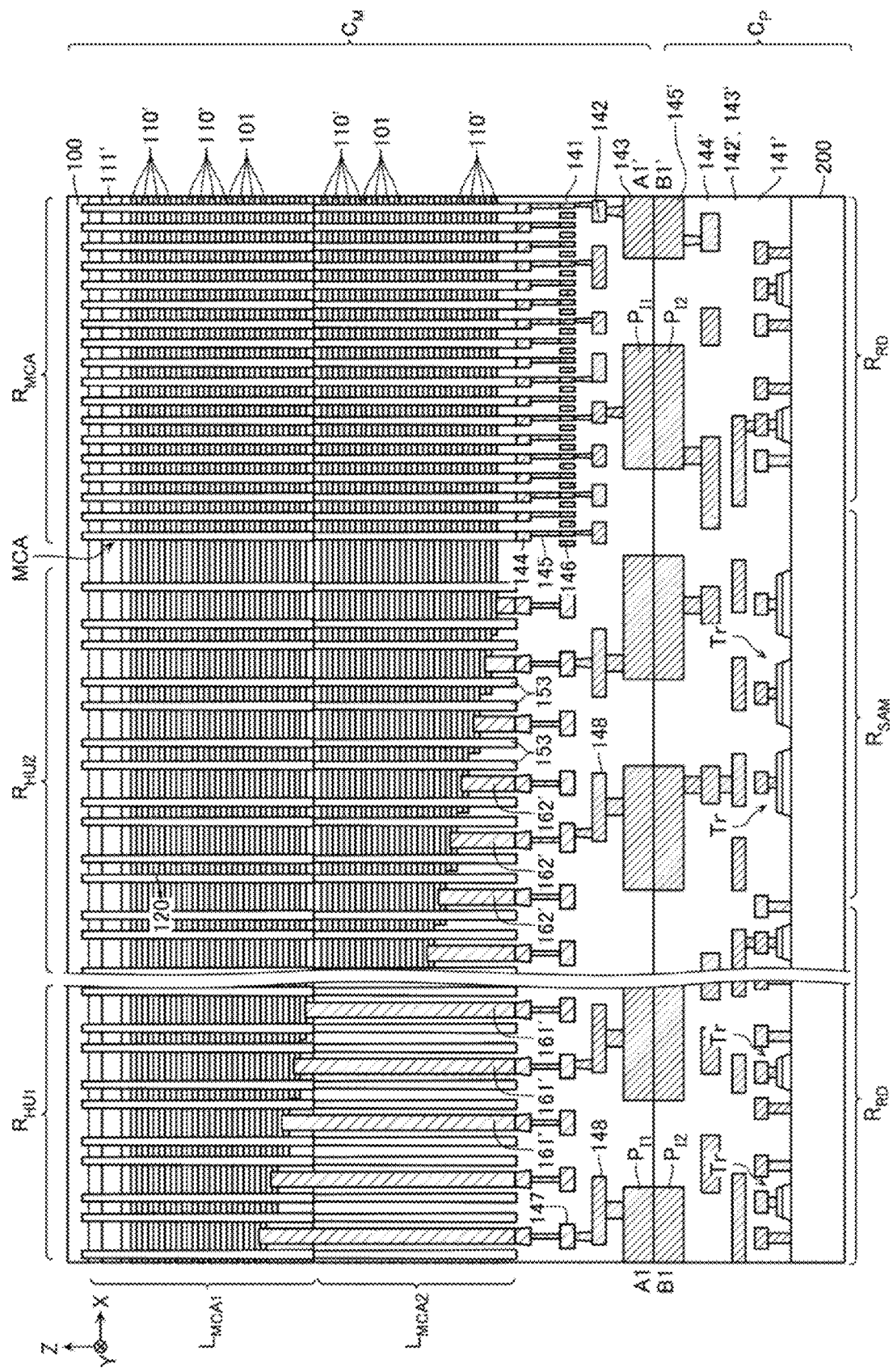
FIG. 47 illustrates a schematic cross-sectional view of a configuration of a semiconductor storage device according to a first modification example.

FIG. 47 illustrates a schematic cross-sectional view of a configuration of a semiconductor storage device according to a first modification example.

The semiconductor storage device according to the first modification example does not include the conductive layers 110, but instead includes conductive layers 110'. End portions of a plurality of conductive layers 110' in the X direction provided in the memory cell array layer $L_{MCA1}$ are provided in the first hook-up region $R_{HU1}$. End portions of a plurality of conductive layers 110' in the direction provided in the memory cell array layer $L_{MCA2}$ are provided in the second hook-up region $R_{HU2}$. Positions of the end portions of the plurality of conductive layers 110' in the X direction are different from each other. As a result, a stepped structure is formed in the first hook-up region $R_{HU1}$ and the second hook-up region $R_{HU2}$.

The semiconductor storage device according to the first modification example does not include the contacts 161 and 162, and instead includes contacts 161' and 162'. None of upper surfaces of the contacts 161' and 162' is in contact any of the support structures 153, unlike the contacts 161 and 162 according to the first embodiment.

FIGS. 48 to 51 illustrate schematic cross-sectional views of structures to explain a method of manufacturing a semiconductor storage device according to the first modification example.

Figure 48:
FIGS. 48-51 are schematic cross-sectional views of structures illustrating aspects of a method of manufacturing a semiconductor storage device according to the first modification example.

In the manufacturing method according to the first modification example, after the process described with reference to FIG. 20, for example, a stepped structure is formed by selectively removing a part of the plurality of sacrificial layers 110A and the insulating layers 101 in the first hook-up region $R_{HU1}$ and the second hook-up region $R_{HU2}$ as shown in FIG. 48.

Figure 49:
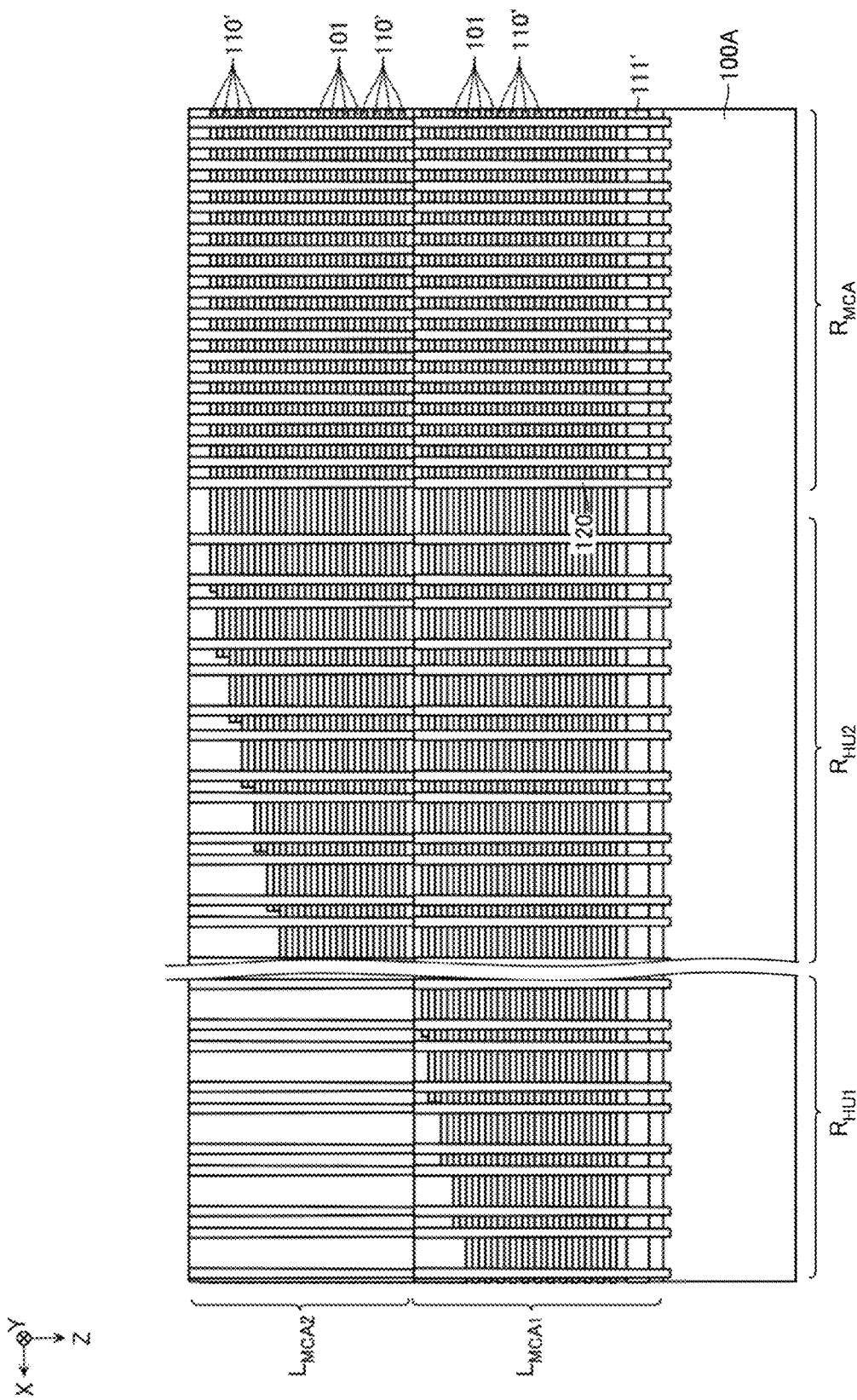
Figure 50:
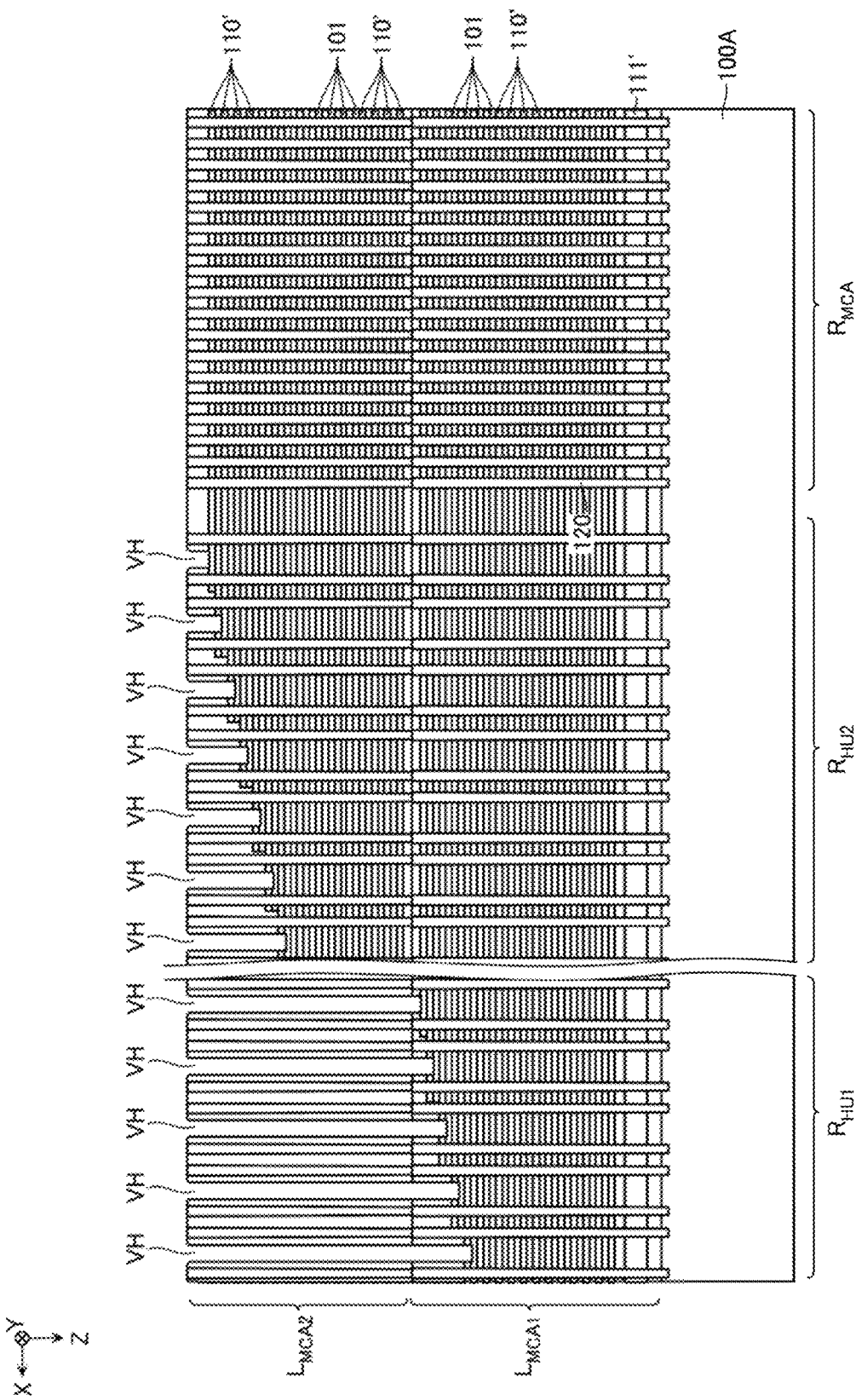

In the manufacturing method according to the first modification example, after the process described with reference to FIG. 45, for example, the plurality of via holes VH for exposing the upper surfaces of the plurality of sacrificial layers 110A is formed as shown in FIGS. 49 and 50. This process is performed by, for example, a method such as RIE. A depth of the via hole VH varies depending on a height position of the corresponding sacrificial layer 110A.

Figure 51:
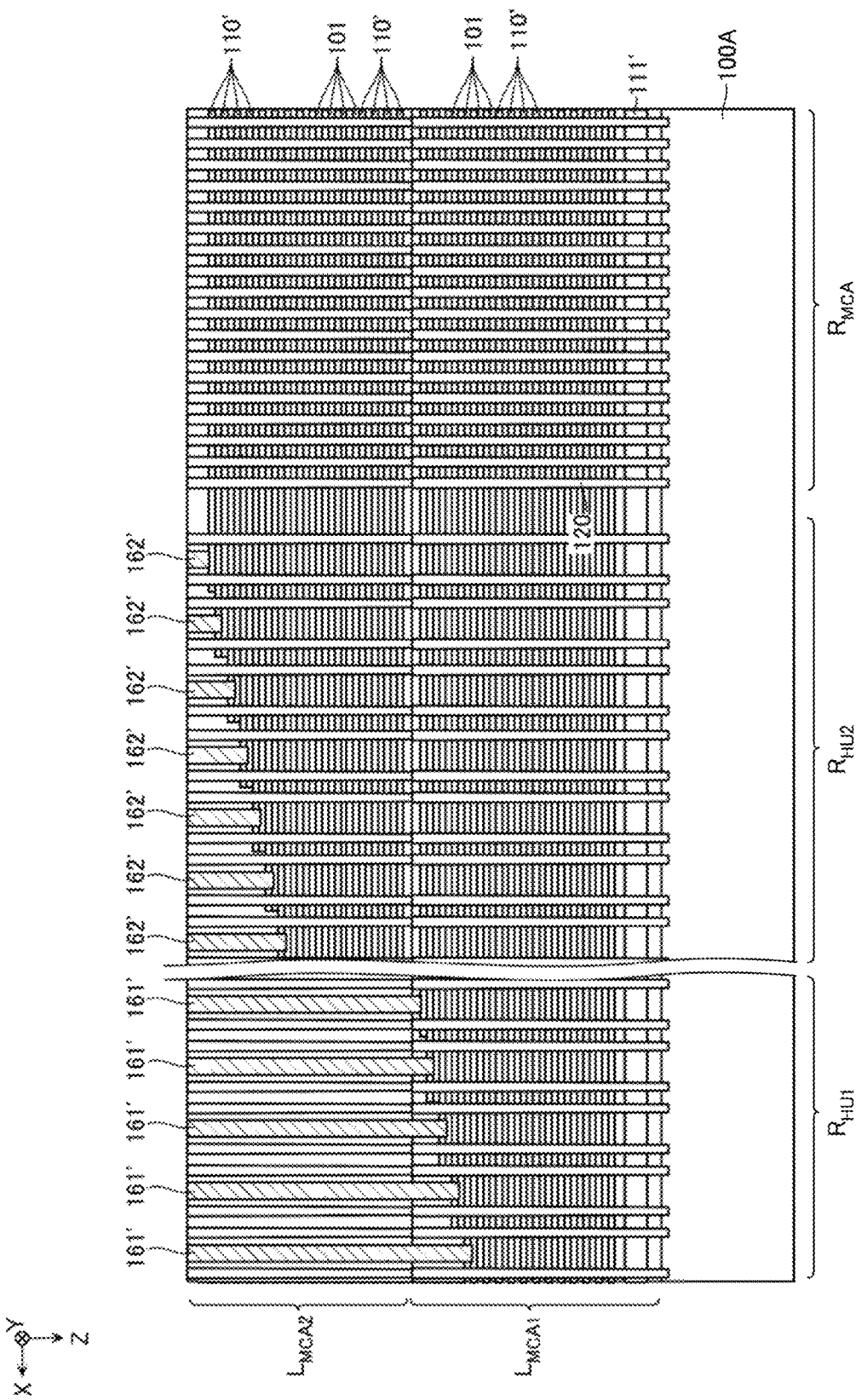

In the manufacturing method according to the first modification example, after the process described with reference to FIG. 50, for example, the contacts 161' and 162' are formed inside the via holes VH as shown in FIG. 51. This process is performed by, for example, a method such as CVD.

Effects

In the manufacturing method according to the first modification example, it is necessary to form the plurality of via holes VH having different depths in the process described with reference to FIG. 50. When there is an attempt to collectively form such a plurality of via holes VH, the via holes corresponding to the conductive layer 110' provided relatively above may penetrate the conductive layer 110', and such a conductive layer 110' may short-circuit with the lower conductive layer 110'. When there is an attempt to form such a plurality of via holes VH multiple times, the number of manufacturing processes may increase.

In contrast, in the manufacturing method according to the first embodiment, for example, the plurality of contact holes 163A (FIG. 38) is formed by repeating patterning and etching multiple times as described with reference to FIGS. 32 to 38.

According to such a method, the plurality of via holes VH having different depths can be suitably formed. Accordingly, it is possible to prevent a short-circuit of the conductive layer 110' described above and an increase in the number of manufacturing processes.

When such a method is adopted, it is necessary to check whether or not these layers are suitably removed in the removing of the sacrificial layers 110A and the insulating layers 101. To achieve the purpose, for example, the amount of the material (for example, silicon oxide or silicon nitride) removed by RIE or the like may be monitored. However, when the diameter of the contact hole 163A is small, the amount of the material removed is small, and thus, such monitoring may be difficult. In order to increase such an amount, for example, it is possible that the diameter of the contact hole 163A can be increased and the support structure 153 is provided so as not to interfere with the contact hole 163A. However, when the number of support structures 153 is reduced, the structure may become distorted in the processing for removing the plurality of sacrificial layers 110A after the process described with reference to FIG. 44, and the semiconductor storage device may not be suitably formed.

To address such issues, in the manufacturing method according to the first embodiment, the support structures 153 are provided at a predetermined density. In the processes described with reference to FIGS. 32 to 38, not only the plurality of sacrificial layers 110A and the insulating layers 101 but also the support structures 153 are removed. According to such a method, the plurality of via holes VH having different depths can be suitably formed. The distortion of the structure described above can also be prevented.

In the manufacturing method according to the first embodiment, in the process described with reference to FIG. 43, the contacts 161 made of metal or the like are formed on the inner peripheral surfaces and the bottom surfaces of the contact holes 163A (FIG. 42), and the insulating layer 116 is formed in the central portion of the contact 161. According to such a method, the amount of the metal required for forming the contacts 161 can be reduced, and the manufacturing cost of the semiconductor storage device can be reduced.

As described with reference to FIGS. 32 to 38, when the plurality of contact holes 163A is formed by repeated patterning and etching multiple times, the number of sacrificial layers 110A or the like to be removed increases as the process approaches the latter half. For example, when the semiconductor storage device includes 255 different conductive layers 110, it is necessary to remove the sacrificial layers 110A including one layer in a first process, two layers in a second process, four layers in a third process, eight layers in a fourth process, 16 layers in a fifth process, 32 layers in a sixth process, 64 layers in a seventh process, and 128 layers in an eighth process. As a result, the number of manufacturing processes and therefore the manufacturing cost may increase.

To address such issues, in the manufacturing method according to the first embodiment, in the process described with reference to FIG. 20, the via holes VH are provided in the locations corresponding to the semiconductor layers 120, the locations corresponding to the support structures 153, the locations corresponding to the contacts 161, and the locations corresponding to the inter-block insulating layers 151. In the processes described with reference to FIGS. 27 and 28, the through via holes 161A corresponding to the contacts 161 and the grooves 151A corresponding to the inter-block insulating layers 151 are formed by increasing the diameters of the via holes VH by a method such as wet etching and communicatively connecting the plurality of via holes VH to each other.

According to such a method, it is possible to form the through via holes for communicatively connecting the plurality of sacrificial layers 110A in the memory cell array layer $L_{MCA2}$ to each other in advance. Accordingly, the process of forming the deepest hole may be omitted. For example, when the semiconductor storage device includes 255 conductive layers 110 as described above, the process of removing 128 sacrificial layers 110A may be omitted. Accordingly, the number of manufacturing processes can be significantly reduced, and the manufacturing cost of the semiconductor storage device can be reduced.

According to such a method, in the process described with reference to FIG. 20, the via holes VH are collectively formed in the locations corresponding to the semiconductor layers 120, the locations corresponding to the support structures 153, the locations corresponding to the contacts 161, and the locations corresponding to the inter-block insulating layers 151. Accordingly, the number of processes of forming the via holes VH can be significantly reduced.

Other Embodiments

The semiconductor storage device according to the first embodiment has been described above. However, the semiconductor storage device according to the embodiment is merely an example, and the specific configuration and the like can be appropriately adjusted.

For example, in the first embodiment, the first hook-up region $R_{HU1}$ and the second hook-up region $R_{HU2}$ are provided inside the two memory cell array regions $R_{MCA}$ as described with reference to FIGS. 2 and 3. However, such a configuration is an example, and the specific configuration and the like can be appropriately adjusted. For example, the first hook-up region $R_{HU1}$ and the second hook-up region $R_{HU2}$ may be provided outside the memory cell array regions $R_{MCA}$.

In the first embodiment, the memory transistor in which the charge storage film is provided in the gate insulating film is used as the memory cell. The configuration in which the plurality of conductive layers 110 corresponding to the gate electrodes are stacked in the Z direction is illustrated. However, such a configuration is an example, and the specific configuration can be appropriately adjusted. For example, the configuration described above is also applicable to a configuration in which a plurality of semiconductor layers corresponding to a channel region are stacked in the Z direction. The configuration described above is also applicable to a configuration including a pair of electrodes and a memory film provided between these electrodes instead of the memory transistor.

In the first embodiment, the insulating layer 116 is provided inside the contacts 161 and 162 as described with reference to FIGS. 10 and 12. However, such a configuration is an example, and the specific configuration and the like can be appropriately adjusted. For example, a metal material, a semiconductor material, or the like may be provided inside the contacts 161 and 162 instead of the insulating layer 116. The insides of the contacts 161 and 162 may be or included unfilled gaps or voids.

Figure 52:
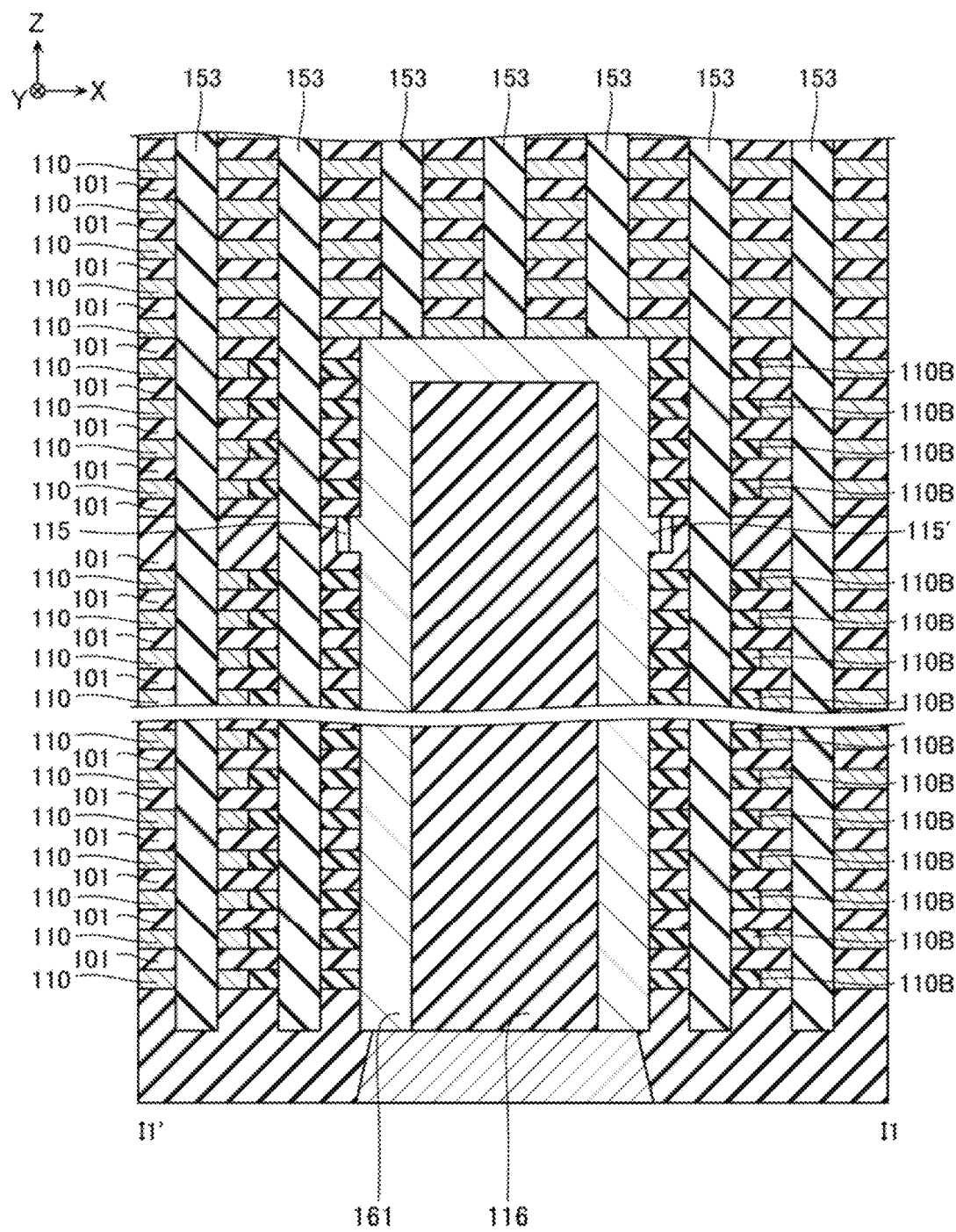
FIG. 52 illustrates a schematic cross-sectional view of a configuration of a semiconductor storage device according to another embodiment.

In the process described with reference to FIG. 32, the insulating layer 115 may be removed such that the diameter of the through via hole provided in the insulating layer 115 is larger than the other portion of the through via hole 161A. In this case, for example, an annular protrusion 115' protruding in an outer circumferential direction may be formed on the outer peripheral surface of the contact 161 at a boundary portion between the memory cell array layer $L_{MCA1}$ and the memory cell array layer $L_{MCA2}$ as shown in FIG. 52.

Figure 53:
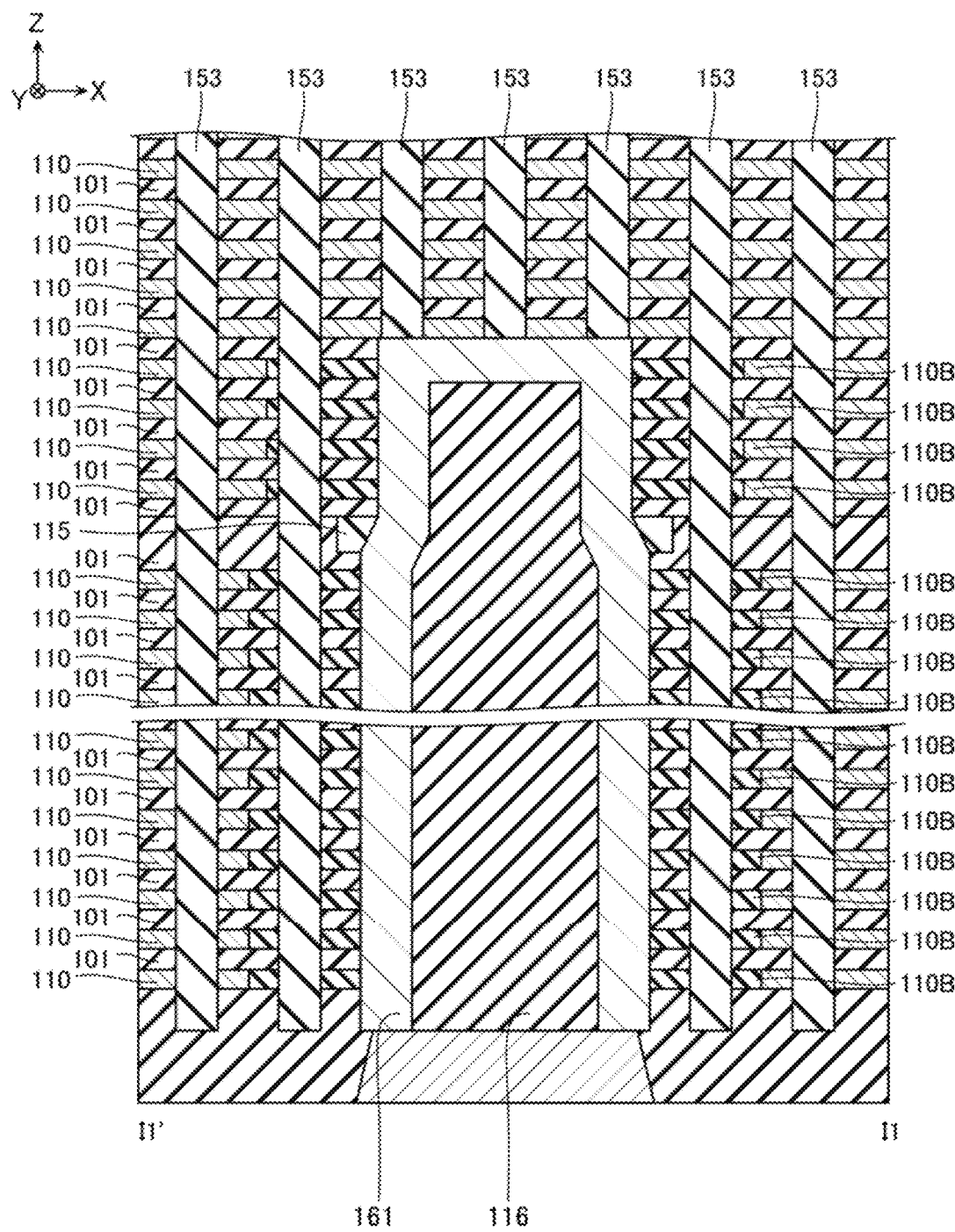
FIG. 53 illustrates a schematic cross-sectional view of a configuration of a semiconductor storage device according to still another embodiment.

In the process described with reference to FIG. 32, the insulating layer 115 may be removed such that the diameter of the lower end of the through via hole provided in the insulating layer 115 is smaller than the other portion of the through via hole 161A. In this case, for example, a diameter of a portion of the contact 161 provided in the memory cell array layer $L_{MCA1}$ may be smaller than a diameter of a portion of the contact 161 provided in the memory cell array layer $L_{MCA2}$ as shown in FIG. 53. In this case, an average diameter value of the portion of the contact 161 corresponding to the insulating layer 115 may be larger than an average diameter value of the portion of the contact 161 provided in the memory cell array layer $L_{MCA1}$, and may be smaller than an average diameter value of the portion of the contact 161 provided in the memory cell array layer $L_{MCA2}$.

In the first embodiment, the contacts 161 and 162 are provided in the first hook-up region $R_{HU1}$ and the second hook-up region $R_{HU2}$. Here, in order to more suitably monitor the amount of the material removed by RIE or the like as described above, for example, in the processes described with reference to FIGS. 32 to 38, it is possible for the contact holes 163A to also be formed regions outside the memory planes 10 (described with reference to FIG. 2) or the like. Such outside regions may be, for example, the peripheral region $R_P$. Such outside regions may be regions provided outside the memory planes 10 and the peripheral region $R_P$ along one or more of the four sides of the chip $C_M$. In such a case, configurations similar to those of the contacts 161 and 162 (hereinafter, referred to as "dummy contacts") can be formed in such regions. The dummy contacts may be in a floating state, that is such dummy contacts are not electrically connected to any other components, or, in some examples, such structures may be used as an interconnection, a capacitor, or the like.

In order to suitably monitor the amount of the material removed by RIE or the like as described above, for example, it is possible for the etching to also be performed in the outside regions in all the etching processes described with reference to FIGS. 32 to 38. In such a case, the contact holes 163A provided in these regions may have depths similar to that of the deepest contact hole 163A provided in the first hook-up region $R_{HU1}$ or the deepest contact holes 163A provided in the second hook-up region $R_{HU2}$. In such a case, a length of the dummy contact in the Z direction may be the same as the length of the contact having the largest length in the Z direction among the plurality of contacts 161 provided in the first hook-up region $R_{HU1}$ or the length of the contact having the largest length in the Z direction provided in the second hook-up region $R_{HU2}$ among the plurality of contacts 162.

In the first embodiment, one contact 161 is provided corresponding to one conductive layer 110, and likewise one contact 162 is provided corresponding to one conductive layer 110. However, such a configuration is an example, and the specific configuration and the like can be appropriately adjusted. For example, in order to more suitably monitor the amount of the material removed by RIE or the like as described above, for example, two or more contacts 161 may be provided so as to correspond to one conductive layer 110, and two or more contacts 162 may be provided so as to correspond to one conductive layer 110.

In the first embodiment, the semiconductor substrate is not provided on the rear surface side of the chips $C_M$, and the semiconductor substrate 200 is provided on the rear surface side of the chip $C_P$. However, such a configuration is an example, and the specific configuration and the like can be appropriately adjusted. For example, a semiconductor substrate may be provided on the rear surface side of the chip $C_M$. In such a case, the depicted vertical relationship between the configuration of the chip $C_M$ and the configuration of the chip $C_P$ may be defined oppositely to the first embodiment.

In the first embodiment, the configuration of the memory cell array MCA and the configuration of the peripheral circuit region $R_{PC}$ are formed with separate chips. However, such a configuration is an example, and the specific configuration and the like can be appropriately adjusted. For example, the plurality of configurations may be formed as parts of the same chip on the same wafer. In such a case, the memory cell array MCA may be formed in a predetermined region on the semiconductor substrate, and the peripheral circuits may be formed in other regions. In such a case, the peripheral circuit may be formed on the semiconductor substrate, and the memory cell array MCA may be formed above the peripheral circuit.

In the first embodiment, the plurality of sacrificial layers 110A and the insulating layers 101 corresponding to the memory cell array layer $L_{MCA1}$ are formed in the process described with reference to FIG. 14, and the via holes VH corresponding to the memory cell array layer $L_{MCA1}$ are formed in the process described with reference to FIG. 15. The plurality of sacrificial layers 110A and the insulating layers 101 corresponding to the memory cell array layer $L_{MCA2}$ are formed in the process described with reference to FIG. 19, and the via holes VH corresponding to the memory cell array layer $L_{MCA2}$ are formed in the process described with reference to FIG. 20. However, such a method is an example, and the specific manufacturing method can be appropriately adjusted. For example, the processes described with reference to FIGS. 18 to 21 may he omitted.

Others

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a semiconductor substrate having a first surface;
a conductive layer spaced from the semiconductor substrate in a first direction intersecting the first surface, the conductive layer extending in a second direction along the first surface of the semiconductor substrate;
a semiconductor layer extending in the first direction through the conductive layer;
a first contact extending in the first direction and connected to a surface of the conductive layer facing away from the semiconductor substrate;
a second contact extending in the first direction through the conductive layer, a length of the second contact in the first direction being greater than a length of the first contact in the first direction;
a first insulating layer extending in the first direction, a length of the first insulating layer in the first direction being greater than a length of the first insulating layer in the second direction; and
a second insulating layer extending along the first insulating layer in the first direction, a length of the second insulating layer in the first direction being greater than a length of the second insulating layer in the second direction,
wherein each of the first and second insulating layers entirely overlaps with the first contact when viewed in the first direction.

2. The semiconductor storage device according to claim 1, further comprising:

a third insulating layer extending along the first and second insulating layers in the first direction, wherein the third insulating layer entirely overlaps with the first contact when viewed in the first direction.

3. The semiconductor storage device according to claim 2, wherein
the first and second insulating layers are aligned in the second direction, and
the first and third insulating layers are aligned in a third direction intersecting the first surface, the third direction being different from the second direction.

4. The semiconductor storage device according to claim 2, wherein the first, second, and third insulating layers are aligned in the second direction.

5. The semiconductor storage device according to claim 2, wherein a distance between the first and second insulating layers in a direction along the first surface is equal to a distance between the first and third insulating layers in a direction along the first surface.

6. The semiconductor storage device according to claim 1, wherein a cross-sectional shape of the semiconductor layer in a plane perpendicular to the first direction is same as a cross-sectional shape of the first insulating layer in the plane.

7. The semiconductor storage device according to claim 6, wherein a cross-sectional shape of the second insulating layer in the plane is same as the cross-sectional shape of the first insulating layer in the plane.

8. The semiconductor storage device according to claim 1, wherein a cross-sectional shape of the first contact in a plane perpendicular to the first direction is same as a cross-sectional shape of the second contact in the plane.

9. The semiconductor storage device according to claim 1, wherein a cross-sectional shape of the first contact in a plane perpendicular to the first direction is different from a cross-sectional shape of the second contact in the plane.

10. The semiconductor storage device according to claim 9, wherein the cross-sectional shape of the first contact is a non-circular shape and the cross-sectional shape of the second contact is a circular shape.

11. The semiconductor storage device according to claim 1, further comprising:
a fourth insulating layer extending within the first contact in the first direction.

12. The semiconductor storage device according to claim 11, wherein
the first insulating layer entirely overlaps with the fourth insulating layer when viewed in the first direction, and
the second insulating layer only partially overlaps with the fourth insulating layer when viewed in the first direction.

13. The semiconductor storage device according to claim 1, further comprising:
a plurality of fifth insulating layers spaced from each other along the first direction, each of the fifth insulating layers being adjacent to a side surface of the first contact.

14. The semiconductor storage device according to claim 1, wherein
a plurality of memory cell transistors is formed along the semiconductor layer, and
the conductive layer is a gate electrode of one of the memory cell transistors.

* * * * *